(12) United States Patent
Wariishi et al.

(10) Patent No.: US 6,376,765 B1
(45) Date of Patent: Apr. 23, 2002

(54) ELECTROLYTE COMPOSITION, PHOTOELECTRIC CONVERSION DEVICE AND PHOTO-ELECTROCHEMICAL CELL

(75) Inventors: Koji Wariishi, Kanagawa-ken; Chang-yi Qian; Michio Ono, both of Saitama-ken, all of (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/631,385

(22) Filed: Aug. 3, 2000

(30) Foreign Application Priority Data

Aug. 4, 1999 (JP) ............................... 11-221767
Jan. 7, 2000 (JP) .......................... 2000-002017

(51) Int. Cl.$^7$ .................... C07D 213/02; C07D 233/54; H01M 14/00; H01M 6/22; H01L 31/04
(52) U.S. Cl. ..................... 136/263; 136/256; 429/111; 429/307; 429/304; 429/324; 429/326; 429/327; 429/328; 429/336; 429/339; 252/62.2; 546/297; 546/301; 546/339; 546/347; 546/1; 548/347.1; 548/349.1; 548/354.1
(58) Field of Search ................. 136/263, 256; 429/111, 307, 304, 324, 326, 327, 328, 336, 339; 252/62.2; 546/297, 301, 339, 347, 1; 548/347.1, 349.1, 354.1

(56) References Cited

U.S. PATENT DOCUMENTS 5,683,832 A  11/1997  Bonhote et al. ............. 429/111
5,728,487 A   3/1998  Gratzel et al. .............. 429/111

FOREIGN PATENT DOCUMENTS

| JP | 3-261787 A | * | 11/1991 |
| JP | 2000-322932 A | * | 11/2000 |
| JP | 2001-35253 A | * | 2/2001 |
| JP | 2001-67931 A | * | 3/2001 |

OTHER PUBLICATIONS

Mateeva et al, Dyes and Pigments, 20, pp. 271–278 (1992) is hereby made of record.*
Kim et al, "Novel fluorescent chemosensor for Li+ based on a squarylium dye carrying a monoazacrown moiety," Dyes and Pigments, 43, pp. 21–25, Jul. 1999.*
* cited by examiner Primary Examiner—Alan Diamond
(74) Attorney, Agent, or Firm—Sughrue Mion, PLLC

(57) ABSTRACT

An electrolyte composition comprising a compound represented by the following general formula (1):

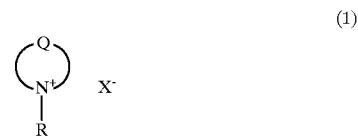

(1)

wherein R represents a substituent containing a —$(CR_1R_2$—$CR_3R_4$—$O)_n$— bond (in which $R_1$ to $R_4$ are independently a hydrogen atom or an alkyl group, n being an integer of 2 to 20); Q represents an atomic group forming an aromatic cation having a 5- or 6-membered ring structure with a nitrogen atom, which may have a substituent; and $X^-$ represents an anion. A photoelectric conversion device comprising the electrolyte composition and a photo-electrochemical cell composed thereof are also provided.

21 Claims, 5 Drawing Sheets

ELECTROLYTE COMPOSITION, PHOTOELECTRIC CONVERSION DEVICE AND PHOTO-ELECTROCHEMICAL CELL

BACKGROUND OF THE INVENTION

The present invention relates to an electrolyte composition excellent in durability and a charge-transporting capability, a photoelectric conversion device comprising the electrolyte composition, and a photo-electrochemical cell composed thereof. The present invention also relates to a novel imidazolium compound and a novel pyridinium compound, which can be used for the electrolyte composition.

Conventionally, an electrolysis solution prepared by dissolving an electrolyte salt in a solvent has been used as an electrolyte for electrochemical devices such as a cell, a capacitor, a sensor, a display device, a recording device, etc. However, the electrochemical device comprising the prior art electrolysis solution often causes leakage of the solution during long-term operation or storage to be unreliable.

Nature, vol. 353, pp. 737–740 (1991), U.S. Pat. No. 4,927,721, etc. disclosed a photoelectric conversion device comprising dye-sensitized semiconductor particles, and a photo-electrochemical cell composed thereof. However, since the device also comprises the electrolysis solution in a charge-transporting layer, there is still a fear that its photoelectric conversion efficiency is extremely lowered, or its function is lost by leakage or depletion of the electrolysis solution during the long-term operation or storage.

Under these circumstances, International Patent No. 93/20565 disclosed a photoelectric conversion device comprising a solid electrolyte. Further, Nippon Kagaku Kaishi, 7, 484 (1997), Japanese Patent Laid-Open No. 7-2881142, Solid State Ionics, 89, 263 (1986) and Japanese Patent Laid-Open No. 9-27352 proposed a photoelectric conversion device using a solid electrolyte comprising a poly (ethylene oxide)-based, cross-linked polymer. However, the devices using the solid electrolyte are insufficient in photoelectric conversion characteristics, especially short-circuit current density. Additionally, durability of the devices is also insufficient.

Further, disclosed in WO 95/18456, Japanese Patent Laid-Open No. 8-259543, Denki Kagaku, 65, 11, 923 (1997), etc. is a method where a pyridinium salt, an imidazolium salt, a triazolium salt, etc. is used as the electrolyte for the photoelectric conversion device to prevent the leakage and depletion of the electrolytic solution. The salts are molten salts which are liquid at room temperature. The durability of the device is improved because solvents for dissolving the electrolyte such as water and organic solvents are not necessary or needed in only a little amount. However, the device using the molten salt generally has such a defect as a low photoelectric conversion efficiency.

OBJECT AND SUMMARY OF THE INVENTION

An first object of the present invention is to provide an electrolyte composition excellent in durability and a charge-transporting capability, a photoelectric conversion device comprising the electrolyte composition that exhibits high durability and excellent photoelectric conversion properties, and a photo-electrochemical cell composed thereof.

Another object of the present invention is to provide a novel imidazolium compound and a novel pyridinium compound, which can be used for the electrolyte composition.

As a result of intense research in view of the above objects, the inventors have found that an electrolyte composition comprising a compound having a substituent containing repetition of a substituted or unsubstituted ethyleneoxy group at a particular position is excellent in the durability and the charge-transporting capability. The present invention has been accomplished by the finding.

Thus, an electrolyte composition of the present invention comprises a compound represented by the following general formula (1):

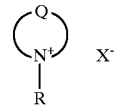

(1)

wherein R represents a substituent containing a —($CR_1R_2$—$CR_3R_4$—O)$_n$— bond (in which $R_1$ to $R_4$ are independently a hydrogen atom or an alkyl group, n being an integer of 2 to 20); Q represents an atomic group forming an aromatic cation having a 5- or 6-membered ring structure with a nitrogen atom, and may have a substituent; and $X^-$ represents an anion. The electrolyte composition can be preferably used for a photo-electrochemical cell.

A photoelectric conversion device of the present invention has an electrically conductive layer, a photosensitive layer, a charge-transporting layer and a counter electrode, and the charge-transporting layer comprises the electrolyte composition of the present invention. The photoelectric conversion device exhibits the high durability and the excellent photoelectric conversion properties.

Further, a photo-electrochemical cell of the present invention comprises the photoelectric conversion device.

With respect to the electrolyte composition, the photoelectric conversion device and the photo-electrochemical cell of the present invention, the durability, the charge-transporting capability and the photoelectric conversion properties are further improved by satisfying any of the following conditions.

(1) Q preferably has a substituent containing a —($CR_1R_2$—$CR_3R_4$—O)$_n$— bond (in which $R_1$ to $R_4$ are independently a hydrogen atom or an alkyl group, n being an integer of 2 to 20).

(2) Q is preferably composed of atoms selected from the group consisting of carbon, hydrogen, nitrogen, oxygen and sulfur atoms.

(3) The 5- or 6-membered ring formed by Q is particularly preferably an imidazole ring or a pyridine ring.

(4) It is preferable that the compound represented by the general formula (1) is further represented by the following general formula (2) or (3):

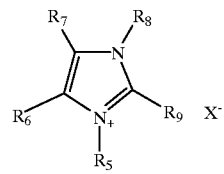

(2)

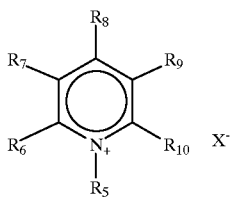

(3)

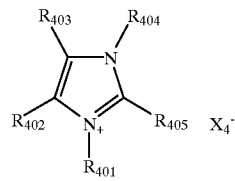

(4)

wherein $R_5$ represents a substituent containing a $-(CR_1R_2-CR_3R_4-O)_n-$ bond (in which $R_1$ to $R_4$ are independently a hydrogen atom or an alkyl group, n being an integer of 2 to 20); $R_6$ to $R_{10}$ independently represent a hydrogen atom or a substituent; $X^-$ represents an anion; and two or more of said $R_5$ to $R_{10}$ may be bonded together to form a ring.

(5) n in the general formula (1), (2) or (3) is preferably an integer of 2 to 6.

(6) The total number of $-CR_1R_2-CR_3R_4-O-$ bonds (in which $R_1$ to $R_4$ are independently a hydrogen atom or an alkyl group) in the compound represented by the general formula (1) is preferably 4 to 6.

(7) $X^-$ is preferably $I^-$, $N^-(CF_3SO_2)_2$, $BF_4^-$, $R_a-COO^-$ (in which $R_a$ is a hydrogen atom, an alkyl group, a perfluoroalkyl group or an aryl group), $R_b-SO_3^-$ (in which $R_b$ is an alkyl group, a perfluoroalkyl group or an aryl group) or $SCN^-$, more preferably $I^-$.

(8) It is preferable that the electrolyte composition further comprises an iodine salt in addition to the compound represented by the general formula (1). A cation of the iodine salt is preferably a nitrogen-containing aromatic cation having a 5- or 6-membered ring structure.

(9) In the case where $X^-$ is $I^-$, it is preferable that the electrolyte composition comprises a salt containing an anion selected from the group consisting of $N^-(CF_3SO_2)_2$, $BF_4^-$, $R_a-COO^-$ (in which $R_a$ is a hydrogen atom, an alkyl group, a perfluoroalkyl group or an aryl group), $R_b-SO_3^-$ (in which $R_b$ is an alkyl group, a perfluoroalkyl group or an aryl group) and $SCN^-$. A cation of the salt is preferably a nitrogen-containing aromatic cation having a 5- or 6-membered ring structure.

(10) It is preferable that the electrolyte composition further comprises iodine.

(11) A solvent-content of the electrolyte composition is particularly preferably 10 weight % or less based on the total thereof.

(12) The photosensitive layer of the photoelectric conversion device preferably comprises semiconductor fine particles sensitized by a dye. The semiconductor fine particles are preferably composed of a metal chalcogenide, and the metal chalcogenide is preferably $TiO_2$. The dye is preferably a metal complex dye and/or a methine dye.

A novel imidazolium compound represented by the following general formula (4):

wherein $R_{401}$ represents a substituent; $R_{402}$ to $R_{405}$ independently represent a hydrogen atom or a substituent; $R_{401}$ and at least one of $R_{402}$ to $R_{405}$ independently contain a $-(CR_1R_2-CR_3R_4-O)_n-$ bond (in which $R_1$ to $R_4$ are independently a hydrogen atom or an alkyl group, n being an integer of 2 to 20); $X_4^-$ represents $I^-$, $Cl^-$, $Br^-$, $N^-(CF_3SO_2)_2$, $N^-(CF_3CF_2SO_2)_2$, $C^-(CF_3SO_2)_3$, $BF_4^-$, $BPh_4^-$, $PF_6^-$, $ClO_4^-$, $R_a-COO^-$ (in which $R_a$ is a hydrogen atom, an alkyl group, a perfluoroalkyl group or an aryl group), $R_b-SO_3^-$ (in which $R_b$ is an alkyl group, a perfluoroalkyl group or an aryl group) or $SCN^-$; and two or more of $R_{401}$ to $R_{405}$ may be bonded together to form a ring, and a novel pyridinium compound represented by the following general formula (5):

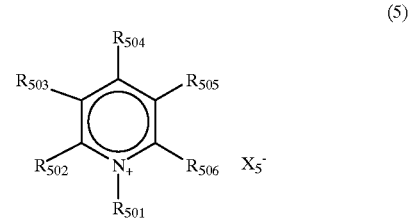

(5)

wherein $R_{501}$, represents a substituent; $R_{502}$ to $R_{506}$ independently represent a hydrogen atom or a substituent; $R_{50}$, and at least one of $R_{502}$ to $R_{506}$ independently contain a $-(CR_1R_2-CR_3R_4-O)_n-$ bond (in which $R_1$ to $R_4$ are independently a hydrogen atom or an alkyl group, n being an integer of 2 to 20); $X_5^-$ represents $I^-$, $Cl^-$, $Br^-$, $N^-(CF_3SO_2)_2$, $N^-(CF_3CF_2SO_2)_2$, $C^-(CF_3SO_2)_3$, $BF_4^-$, $BPh_4^-$, $PF_6^-$, $ClO_4^-$, $R_a-COO^-$ (in which $R_a$ is a hydrogen atom, an alkyl group, a perfluoroalkyl group or an aryl group), $R_b-SO_3^-$ (in which $R_b$ is an alkyl group, a perfluoroalkyl group or an aryl group) or $SCN^-$; and two or more of $R_{501}$, to $R_{506}$ may be bonded together to form a ring, can be preferably used for the electrolyte composition.

DETAILED DESCRIPTION OF THE PREFERRED EMBODIMENTS

[1] Electrolyte Composition

Figure 1:
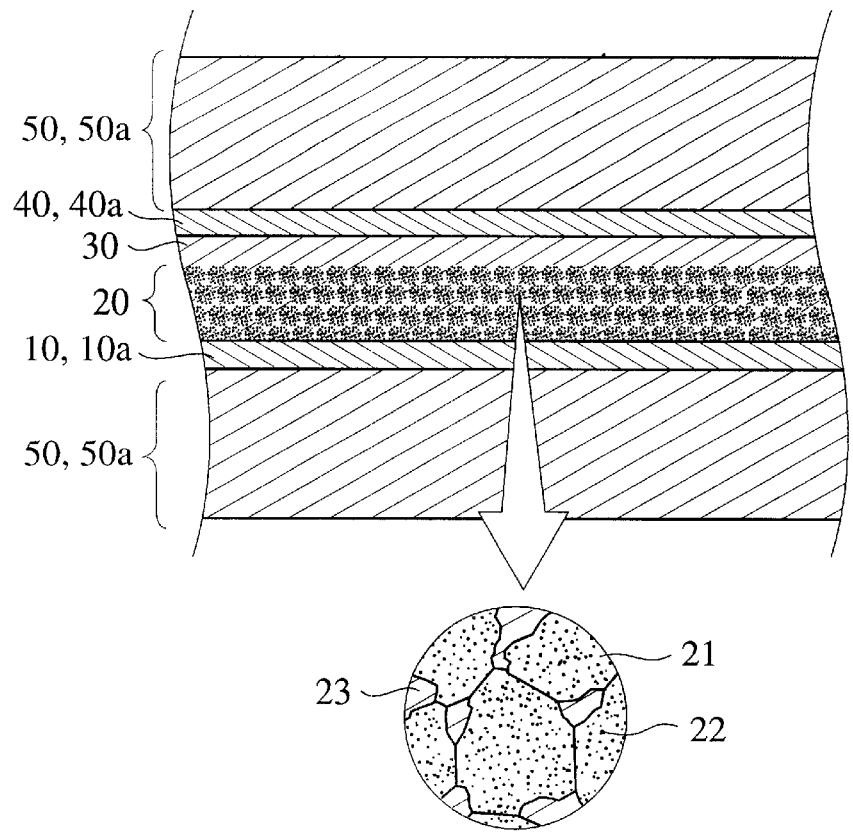
FIG. 1 is a partial cross sectional view showing a preferable structure of a photoelectric conversion device of the present invention.

The electrolyte composition according to the present invention may be used as a solvent for a chemical reaction, a metal plating, etc., or used for a CCD (charge coupling device) camera, various kinds of photoelectric conversion devices or cells, etc. The electrolyte composition is preferably used for a lithium ion secondary battery or a photo-electrochemical cell, more preferably for a photo-electrochemical cell using a semiconductor. The constitutive elements of the electrolyte composition will be described in detail below.

(A) Molten Salt

The electrolyte composition of the present invention comprises a compound represented by the following general formula (1):

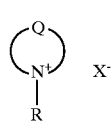

(1)

The compound represented by the general formula (1) is a salt having a low melting point, a so-called "molten salt". The melting point thereof is preferably 100° C. or less, more preferably 80° C. or less, particularly preferably 60° C. or less. The compounds represented by the general formula (1) include those that are liquid at room temperature (around 25° C.), a so-called "room temperature-molten salt".

The compound represented by the general formula (1) can be generally used as an electrolyte with little solvent. Most of the compounds can be singly used as an electrolyte. Even if the compound is solid at ambient temperature, it can be used as the electrolyte by adding a little amount of solvent or additive thereto to liquefy. Alternatively, the compound can be incorporated in the photoelectric conversion device without any additives by: a method where the compound is penetrated on an electrode of the device by heat-dissolution; a method comprising the steps of dissolving the compound in a solvent having a low boiling temperature such as methanol, ethanol and methylene chloride, penetrating the resultant solution on an electrode, and evaporating the solvent by heating; etc.

In the general formula (1), R represents a substituent containing a —$(CR_1R_2—CR_3R_4—O)_n$— bond. Herein, $R_1$ to $R_4$ are independently a hydrogen atom or an alkyl group, where the alkyl group preferably has 1 to 4 carbon atom. $R_1$ to $R_4$ are preferably a hydrogen atom or a methyl group, more preferably a hydrogen atom, respectively. n is an integer of 2 to 20, preferably an integer of 2 to 6, more preferably an integer of 2 to 4. When n is 1, the open circuit voltage of the photoelectric conversion device comprising the compound is lowered. On the other hand, it is not preferable that n is 21 or more, because ion-transporting capability of the electrolyte composition or a current density of the device is extremely reduced in this case.

As described above, the compound comprising in the electrolyte composition of the present invention has a substituent containing repetition of a substituted or unsubstituted ethyleneoxy group at a particular position. It is difficult to synthesize the compound containing repetition of a methyleneoxy group. On the other hand, if a substituent containing repetition of a trimethyleneoxy group or an alkyleneoxy group having more methylene groups is introduced into the compound represented by the general formula (1), the ion-transporting capability of the electrolyte composition comprising the compound is remarkably lowered, thereby deteriorating the photoelectric conversion efficiency of the device when the composition is used therefor.

In the general formula (1), Q represents an atomic group forming an aromatic cation having a 5- or 6-membered ring structure with a nitrogen atom. Q may have a substituent, where the substituent preferably contains the —$(CR_1R_2—CR_3R_4—O)_n$— bond. $R_1$ to $R_4$ are independently a hydrogen atom or an alkyl group, and n is an integer of 2 to 20. Preferable embodiments of $R_1$ to $R_4$ and n herein are the same as those in above-mentioned R. Incidentally, when the compound represented by the general formula (1) contains a plurality of —$(CR_1R_2—CR_3R_4—O)_n$— bonds, $R_1$ to $R_4$ and n may be the same or different.

It is preferable that Q is composed of atoms selected from the group consisting of carbon, hydrogen, nitrogen, oxygen and sulfur atoms.

As for the 5-membered ring formed by Q, preferred are such rings as an oxazole ring, a thiazole ring, an imidazole ring, a pyrazole ring, an iso-oxazole ring, a thiadiazole ring, an oxadiazole ring and a triazole ring. The 5-membered ring is more preferably an oxazole ring, a thiazole ring or an imidazole ring, particularly preferably an imidazole ring. As for the 6-membered ring formed by Q, preferred are such rings as a pyridine ring, a pyrimidine ring, a pyridazine ring, a pyrazine ring and a triazine ring. The 6-membered ring is particularly preferably a pyridine ring.

As described above, the substituent on Q preferably has the —$(CR_1R_2—CR_3R_4—O)_n$— bond. Additionally, preferable examples of the substituent on Q include: an alkoxy group such as a methoxy group and an ethoxy group; a cyano group; an alkoxycarbonyl group such as an ethoxycarbonyl group and a methoxyethoxycarbonyl group; a carbonate group such as an ethoxycarbonyloxy group; an amido group such as an acetylamino group and a benzoylamino group; a carbamoyl group such as an N,N-dimethylcarbamoyl group and an N-phenylcarbamoyl group; a phosphonyl group such as a diethylphosphonyl group; a heterocyclic group such as a pyridyl group, an imidazolyl group, a furanyl group and a oxazolydinonyl group; an aryloxy group such as a phenoxy group; an alkylthio group such as a methylthio group and an ethylthio group; an acyl group such as an acetyl group, a propyonyl group and a benzoyl group; a sulfonyl group such as a methane sulfonyl group and a benzene sulfonyl group; an acyloxy group such as an acetoxy group and a benzoyloxy group; a sulfonyloxy group such as a methane sulfonyloxy group and a toluene sulfonyloxy group; an aryl group such as a phenyl group and a tolyl group; an alkenyl group such as a vinyl group and a 1-propenyl group; an alkyl group such as a methyl group, an ethyl group, an isopropyl group, a cyclopropyl group, a butyl group, a 2-carboxyethyl group and a benzyl group; etc. Among them, more preferred are an alkoxy group, a cyano group, a carbonate group, an amido group, a carbamoyl group, a phosphonyl group, a heterocyclic group, an acyl group, a sulfonyl group, an acyloxy group, a sulfonyloxy group and an alkyl group, and particularly preferred are an alkoxy group, a cyano group, a carbonate group, a phosphonyl group, a heterocyclic group and an alkyl group.

In the general formula (1), $X^-$ represents an anion. Examples of $X^-$ include halide ions such as $I^-$, $Cl^-$ and $Br^-$, $N^-(CF_3SO_2)_2$, $N^-(CF_3CF_2SO_2)_2$, $C^-(CF_3SO_2)_3$, $BF_4^-$, $BPh_4^-$, $PF_6^-$, $ClO_4^-$, $R_a$—$COO^-$, $R_b$—$SO_3^-$, $SCN^-$, etc. $X^-$ is preferably $I^-$, $N^-(CF_3SO_2)_2$, $BF_4^-$, $R_a$—$COO^-$, $R_b$—$SO_3^-$ or $SCN^-$, more preferably $I^-$. Namely, it is more preferable that the compound represented by the general formula (1) is an iodine salt.

The above $R_a$ is: a hydrogen atom; a substituted or unsubstituted alkyl group preferably having 1 to 10 carbon atoms, which may be straight or branched chain, or cyclic, such as a methyl group, an ethylpropyl group, a butyl group, an isopropyl group, a pentyl group, a hexyl group, an octyl group, a 2-ethylhexyl group, a t-octyl group, a decyl group, a cyclohexyl group and a cyclopentyl group; a perfluoroalkyl group preferably having 1 to 10 carbon atoms such as a trifluoroethyl group, a trifluoromethyl group, a pentafluoroethyl group and a pentafluoropropyl group; or a substituted or unsubstituted aryl group preferably having 6 to 12 carbon atoms, such as a phenyl group, a tolyl group and a naphthyl group. $R_a$ is more preferably an alkyl group or a perfluoroalkyl group with 1 to 10 carbon atoms, particularly preferably a perfluoroalkyl group with 1 to 10 carbon atoms.

In the case where $R_a$ is an alkyl group or an aryl group having a substituent, preferred examples thereof are the same as those of the substituent on Q above-mentioned. In addition thereto, halogen atoms such as a fluorine atom, a chlorine atom, a bromine atom and an iodine atom are also preferred. The substituent is more preferably an alkoxy group or a halogen atom§.

The above $R_b$ is a substituted or unsubstituted alkyl group, perfluoroalkyl group or a substituted or unsubstituted aryl group with preferred examples being the same as those of $R_a$. $R_b$ is more preferably an alkyl group with 1 to 7 carbon atoms, particularly preferably an alkyl group with 1 to 5 carbon atoms.

In the case where $R_b$ is an alkyl group or an aryl group having a substituent, preferred examples thereof is the same as those of the substituent on Q above-mentioned. Among them, an alkoxy group is more preferred.

$R_aCOO^-$ and $R_b$—$SO_3^-$ may form an oligomer (polymer) through $R_a$ or $R_b$, respectively. The oligomer is preferably a dimer, a trimer or a tetramer, more preferably a dimmer.

It is preferable that the compound represented by the general formula (1) is further represented by the following general formula (2) or (3):

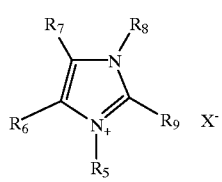

(2)

-continued

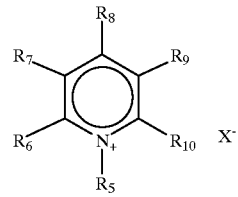

(3)

In the general formula (2) or (3), $R_5$ has the same meanings as R in the general formula (1). Preferred embodiments thereof are also the same as those of R. $R_6$ to $R_{10}$ independently represent a hydrogen atom or a substituent. Preferred examples of the substituent include the examples of the substituent on Q.

At least one of $R_6$ to $R_9$ in the general formula (2) and at least one of $R_6$ to $R_{10}$ in the general formula (3) preferably contain the —$(CR_1)R_2$—$CR_3R_4$—$O)_n$— bond, respectively. Two or more of $R_5$ to $R_{10}$ may be bonded together to form a ring. This ring is preferably 5- to 7-membered ring, more preferably 5- or 6-membered ring. $X^-$ represents an anion with preferable examples which are the same as those of $X^-$ in the general formula (1).

The total number of —$CR_1R_2$—$CR_3R_4$—$O$— bonds (in which $R_1$ to $R_4$ are independently a hydrogen atom or an alkyl group) in the compound represented by the general formula (1) is preferably 4 to 6.

The compound represented by the general formula (1) may form an oligomer through Q or R. The oligomer is preferably a dimer, a trimer or a tetramer, more preferably a dimer.

According to the electrolyte composition of the present invention, a novel imidazolium compound represented by the following general formula (4):

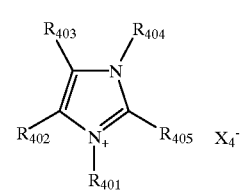

(4)

and a novel pyridinium compound represented by the following general formula (5):

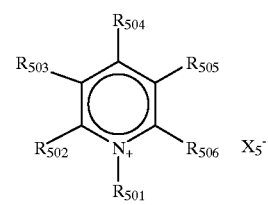

(5)

can be preferably used.

In the general formula (4), $R_{401}$ represents a substituent, $R_{402}$ to $R_{405}$ independently represent a hydrogen atom or a substituent, and $R_{401}$ and at least one of $R_{402}$ to $R_{405}$ independently contain a —$(CR_1R_2$—$CR_3R_4$—$O)_n$— bond (in which $R_1$ to $R_4$ are independently a hydrogen atom or an alkyl group, n being an integer of 2 to 20). $X_4^-$ represents $I^-$, $Cl^-$, $Br^-$, $N^-(CF_3SO_2)_2$, $N^-(CF_3CF_2SO_2)_2$, $C^-(CF_3SO_2)_3$, $BF_4^-$, $BPh_4^-$, $PF_6^-$, $ClO_4^-$, $R_a$—COO⁻ (in which $R_a$ is a hydrogen atom, an alkyl group, a perfluoroalkyl group or an aryl group), $R_b$—$SO_3^-$ (in which $R_b$ is an alkyl group, a perfluoroalkyl group or an aryl group) or SCN⁻. Two or more of $R_{401}$ to $R_{405}$ may be bonded together to form a ring.

In the general formula (5), $R_{501}$, represents a substituent, $R_{502}$ to $R_{506}$ independently represent a hydrogen atom or a substituent, and $R_{501}$ and at least one of $R_{502}$ to $R_{506}$ independently contain a —$(CR_1R_2$—$CR_3R_4$—$O)_n$— bond (in which $R_1$ to $R_4$ are independently a hydrogen atom or an alkyl group, n being an integer of 2 to 20). $X_5^-$ represents I⁻, Cl⁻, Br⁻, N⁻$(CF_3SO_2)_2$, N⁻$(CF_3CF_2SO_2)_2$, C⁻$(CF_3SO_2)_3$, $BF_4^-$, $BPh_4^-$, $PF_6^-$, $ClO_4^-$, $R_a$—COO⁻ (in which $R_a$ is a hydrogen atom, an alkyl group, a perfluoroalkyl group or an aryl group), $R_b$—$SO_3^-$ (in which $R_b$ is an alkyl group, a perfluoroalkyl group or an aryl group) or SCN⁻. Two or more of $R_{501}$ to $R_{506}$ may be bonded together to form a ring.

When the compound represented by the general formula (4) or (5) is used for the electrolyte composition of the present invention, preferable embodiments of $R_{401}$ and $R_{501}$ are the same as those of R in general formula (1). When $R_{402}$ to $R_{405}$ and $R_{502}$ to $R_{506}$ are a substituent, preferable examples thereof are the same as the examples of the substituent on Q in this case. The ring formed by two or more of $R_{401}$ to $R_{405}$ or two or more of $R_{501}$ to $R_{506}$ is preferably 5- to 7-membered, more preferably 5- or 6-membered.

Specific examples of the compound represented by the general formula (1) used for the electrolyte composition of the present invention will be illustrated below without intention of restricting the scope of the present invention defined by the claims attached hereto.

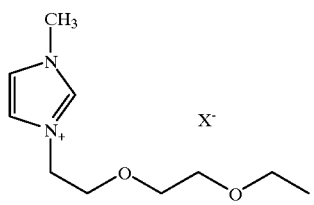

1

1-a: X⁻ = I⁻
1-b: X⁻ = N⁻$(SO_2CF_3)_2$
1-c: X⁻ = $BF_4^-$
1-d: X⁻ = $CF_3COO^-$
1-e: X⁻ = $CH_3SO_3^-$
1-f: X⁻ = SCN⁻

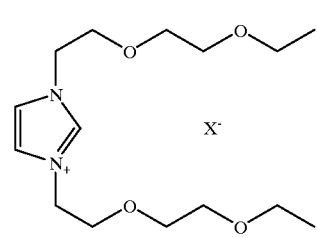

2

2-a: X⁻ = I⁻
2-b: X⁻ = N⁻$(SO_2CF_3)_2$
2-c: X⁻ = $BF_4^-$
2-d: X⁻ = $CF_3COO^-$
2-e: X⁻ = $CH_3SO_3^-$
2-f: X⁻ = SCN⁻

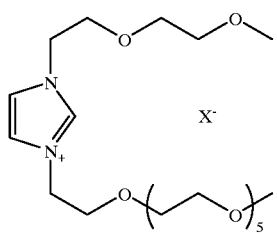

3

3-a: X⁻ = I⁻
3-b: X⁻ = N⁻$(SO_2CF_3)_2$
3-c: X⁻ = $BF_4^-$
3-d: X⁻ = $CF_3COO^-$
3-e: X⁻ = $CH_3SO_3^-$
3-f: X⁻ = SCN⁻

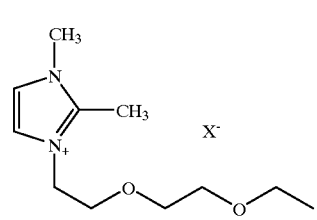

4

4-a: X⁻ = I⁻
4-b: X⁻ = N⁻$(SO_2CF_3)_2$
4-c: X⁻ = $BF_4^-$
4-d: X⁻ = $CF_3COO^-$
4-e: X⁻ = $CH_3SO_3^-$
4-f: X⁻ = SCN⁻

-continued

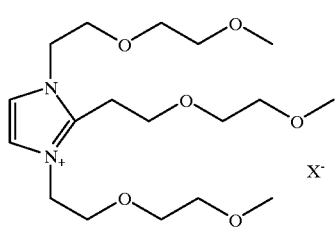

5-a: X⁻ = I⁻
5-b: X⁻ = N⁻(SO₂CF₃)₂
5-c: X⁻ = BF₄⁻
5-d: X⁻ = CF₃COO⁻
5-e: X⁻ = CH₃SO₃⁻
5-f: X⁻ = SCN⁻

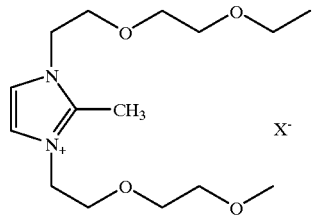

6-a: X⁻ = I⁻
6-b: X⁻ = N⁻(SO₂CF₃)₂
6-c: X⁻ = BF₄⁻
6-d: X⁻ = CF₃COO⁻
6-e: X⁻ = CH₃SO₃⁻
6-f: X⁻ = SCN⁻

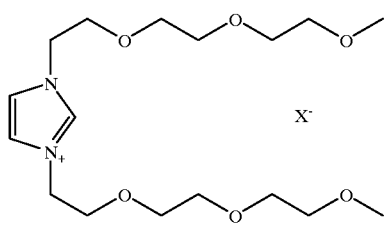

7-a: X⁻ = I⁻
7-b: X⁻ = N⁻(SO₂CF₃)₂
7-c: X⁻ = BF₄⁻
7-d: X⁻ = CF₃COO⁻
7-e: X⁻ = CH₃SO₃⁻
7-f: X⁻ = SCN⁻

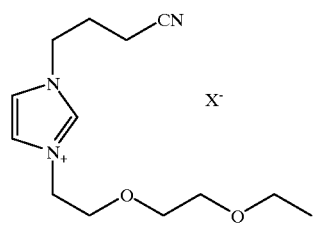

8-a: X⁻ = I⁻
8-b: X⁻ = N⁻(SO₂CF₃)₂
8-c: X⁻ = BF₄⁻
8-d: X⁻ = CF₃COO⁻
8-e: X⁻ = CH₃SO₃⁻
8-f: X⁻ = SCN⁻

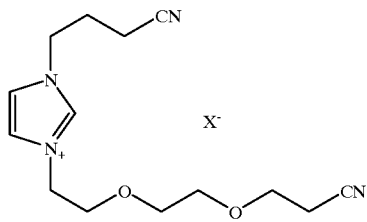

9-a: X⁻ = I⁻
9-b: X⁻ = N⁻(SO₂CF₃)₂
9-c: X⁻ = BF₄⁻
9-d: X⁻ = CF₃COO⁻
9-e: X⁻ = CH₃SO₃⁻
9-f: X⁻ = SCN⁻

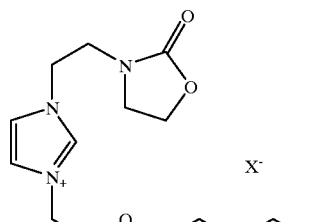

10-a: X⁻ = I⁻
10-b: X⁻ = N⁻(SO₂CF₃)₂
10-c: X⁻ = BF₄⁻
10-d: X⁻ = CF₃COO⁻
10-e: X⁻ = CH₃SO₃⁻
10-f: X⁻ = SCN⁻

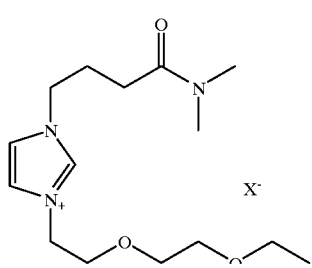

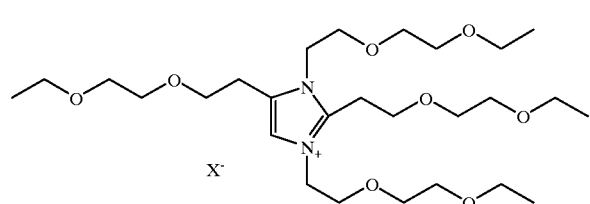

When the electrolyte composition of the present invention is used for a photoelectric conversion device, it is preferable that the electrolyte composition further comprises an iodine salt in addition to the compound represented by the general formula (1). A cation of the iodine salt is preferably a nitrogen-containing aromatic cation having a 5- or 6-membered ring structure. Particularly, if the compound represented by the general formula (1) is not an iodine salt, it is preferable that the known iodine salt such as a pyridinium salt, an imidazolium salt and a triazolium salt disclosed in WO 95/18456, Japanese Patent Laid-Open No. 8-259543, Denki Kagaku, 65, 11, 923 (1997), etc. is added to the composition.

The preferred iodine salts preferably used together with the compound represented by the general formula (1) include those represented by any one of the general formulae (Y-a), (Y-b) and (Y-c):

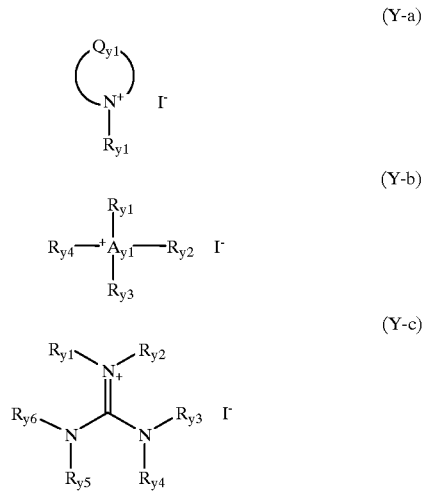

In the general formula (Y-a), $Q_{y1}$ represents an atomic group forming an aromatic cation having a 5- or 6-membered ring structure with a nitrogen atom. $Q_{y1}$ is preferably composed of atoms selected from the group consisting of carbon, hydrogen, nitrogen, oxygen and sulfur atoms.

As for the 5-membered ring formed by $Q_{y1}$, preferred are such rings as an oxazole ring, a thiazole ring, an imidazole ring, a pyrazole ring, an iso-oxazole ring, a thiadiazole ring, an oxadiazole ring and a triazole ring. The 5-membered ring is more preferably an oxazole ring, a thiazole ring or an imidazole ring, particularly preferably an oxazole ring or an imidazole ring. As for the 6-membered ring formed by $Q_{y1}$, preferred are such rings as a pyridine ring, a pyrimidine ring, a pyridazine ring, a pyrazine ring and a triazine ring. The 6-membered ring is more preferably a pyridine ring.

In general formula (Y-b), $A_{y1}$ represents a nitrogen atom or a phosphorus atom.

$R_{y1}$ to $R_{y6}$ in the general formulae (Y-a), (Y-b) and (Y-c) independently represent: a substituted or unsubstituted alkyl group preferably having 1 to 24 carbon atoms, which may be straight or branched chain, or cyclic, such as a methyl group, an ethyl group, a propyl group, an isopropyl group, a pentyl group, a hexyl group, an octyl group, a 2-ethylhexyl group, a t-octyl group, a decyl group, a dodecyl group, a tetradecyl group, a 2-hexyldecyl group, an octadecyl group, a cyclohexyl group, a cyclopentyl group, etc.; or a substituted or unsubstituted alkenyl group preferably having 1 to 24 carbon atoms, which may be straight or branched chain, such as a vinyl group, an allyl group, etc. $R_{y1}$ to $R_{y6}$ are more preferably an alkyl group having 2 to 18 carbon atoms or an alkenyl group having 2 to 18 carbon atoms, particularly preferably an alkyl group having 2 to 6 carbon atoms. Herein, three or more of $R_{y1}$ to $R_{y4}$ in the general formulae (Y-b) are not independently an alkenyl group at the same time.

Two or more of $R_{y1}$ to $R_{y4}$ in the general formula (Y-b) may be bonded together to form a non-aromatic ring containing $A_{y1}$. Further, two or more of $R_{y1}$ to $R_{y6}$ in the general formula (Y-c) may be bonded together to form a ring.

$Q_{y1}$ and $R_{y1}$ to $R_{y6}$ in the general formulae (Y-a), (Y-b) and (Y-c) may have a substituent. Preferable examples thereof include: halogen atoms such as F, Cl, Br and I; a cyano group; an alkoxy group such as a methoxy group and an ethoxy group; an aryloxy group such as a phenoxy group; an alkylthio group such as a methylthio group and an ethylthio group; an alkoxycarbonyl group such as an ethoxycarbonyl group; a carbonate group such as an ethoxycarbonyloxy group; an acyl group such as an acetyl group, a propionyl group and a benzoyl group; a sulfonyl group such as a methane sulfonyl group and a benzene sulfonyl group; an acyloxy group such as an acetoxy group and a benzoyloxy group; a sulfonyloxy group such as a methane sulfonyloxy group and a toluene sulfonyloxy group; a phosphonyl group such as a diethylphosphonyl group; an amido group such as an acetylamino group and a benzoylamino group; a carbamoyl group such as an N,N-dimethylcarbamoyl group; an alkyl group such as a methyl group, an ethyl group, an isopropyl group, a cyclopropyl group, a butyl group, a 2-carboxyethyl group and a benzyl group; an aryl group such as a phenyl group and a tolyl group; a heterocyclic group such as a pyridyl group, an imidazolyl group and a furanyl group; an alkenyl group such as a vinyl group and a 1-propenyl group; etc.

The iodine salt represented by the general formula (Y-a), (Y-b) or (Y-c) may form an oligomer (polymer) through $Q_{y1}$ or $R_{y1}$ to $R_{y6}$.

In the case where the compound represented by the general formula (1) is an iodine salt, the electrolyte composition may comprise another salt not containing an iodide ion. This salt preferably contains an anion selected from the group consisting of $N^-(CF_3SO_2)_2$, $BF_4^-$, $R_a$—$COO^-$ (in which $R_a$ is a hydrogen atom, an alkyl group, a perfluoroalkyl group or an aryl group), $R_b$—$SO_3^-$ (in which $R_b$ is an alkyl group, a perfluoroalkyl group or an aryl group) and $SCN^-$. Among the anions, $R_a$—$COO^-$, $R_b$—$SO_3^-$ and $SCN^-$ are more preferable. A cation of the salt is preferably a nitrogen-containing aromatic cation having a 5- or 6-membered ring structure. Preferred embodiments of the cation are the same as those of the salt represented by the general formula (Y-a). The aromatic cation especially preferably contains an ethyleneoxy group. This salt may be one represented by the general formula (1). Thus, it is also preferable that the compound represented by the general formula (1) containing an iodide ion and the compound containing the other anion are used together for the electrolyte composition.

A content of the compound represented by the general formula (1) is preferably 10 weight % or more, more preferably 20 to 95 weight % based on the electrolyte composition, in the case of using it together with the other salt. Further, a content of the iodine salt is preferably 10 weight % or more, more preferably 50 to 95 weight % based on the electrolyte composition.

Specific examples of the preferred salt not having an iodide ion used together with the iodine salt represented by the general formula (1) will be illustrated below.

|  | $R_5$ | $R_6$ | X |
|---|---|---|---|
| Z1-a | $CH_3$ | $C_2H_5$ | $CF_3COO$ |
| Z1-b | $CH_3$ | $C_2H_5$ | $CF_3CF_2CF_2COO$ |
| Z1-c | $CH_3$ | $C_2H_5$ | $CH_3SO_3$ |
| Z1-d | $CH_3$ | $C_2H_5$ | 4-methylphenyl-$SO_3$ |
| Z1-e | $CH_3$ | $C_2H_5$ | $CH_3CH_2OCH_2CH_2SO_3$ |
| Z1-f | $CH_3$ | $C_2H_5$ | SCN |
| Z1-g | $CH_3$ | $C_3H_7(n)$ | $CF_3COO$ |
| Z1-h | $CH_3$ | $C_3H_7(n)$ | $CH_3SO_3$ |
| Z1-i | $CH_3$ | $C_3H_7(n)$ | SCN |
| Z1-j | $CH_3$ | $C_4H_9(i)$ | $CF_3COO$ |
| Z1-k | $CH_3$ | $C_4H_9(i)$ | $CH_3SO_3$ |
| Z1-l | $CH_3$ | $C_4H_9(i)$ | SCN |
| Z1-m | $CH_3$ | $CH_2CF_3$ | $CF_3COO$ |
| Z1-n | $CH_3$ | $CH_2CF_3$ | $CH_3SO_3$ |
| Z1-o | $CH_3$ | $CH_2CF_3$ | SCN |
| Z1-p | $CH_3$ | $CH_2CH_2OCH_3$ | $CF_3COO$ |
| Z1-q | $CH_3$ | $CH_2CH_2OCH_3$ | $CH_3SO_3$ |
| Z1-r | $CH_3$ | $CH_2CH_2OCH_3$ | SCN |

|  | $R_5$ | $R_6$ | X |
|---|---|---|---|
| Z2-a | $-(CH_2CH_2O)_2CH_3$ | $-(CH_2CH_2O)_2CH_3$ | $CF_3COO$ |
| Z2-b | $-(CH_2CH_2O)_2CH_3$ | $-(CH_2CH_2O)_2CH_3$ | $CF_3CF_2CF_2COO$ |
| Z2-c | $-(CH_2CH_2O)_2CH_3$ | $-(CH_2CH_2O)_2CH_3$ | $CH_3SO_3$ |
| Z2-d | $-(CH_2CH_2O)_2CH_3$ | $-(CH_2CH_2O)_2CH_3$ | $CH_3CH_2OCH_2CH_2SO_3$ |
| Z2-e | $-(CH_2CH_2O)_2CH_3$ | $-(CH_2CH_2O)_2CH_3$ | 4-methylphenyl-$SO_3$ |
| Z2-f | $-(CH_2CH_2O)_2CH_3$ | $-(CH_2CH_2O)_2CH_3$ | SCN |
| Z2-g | $-(CH_2CH_2O)_3CH_3$ | $-(CH_2CH_2O)_3CH_3$ | $CF_3COO$ |
| Z2-h | $-(CH_2CH_2O)_3CH_3$ | $-(CH_2CH_2O)_3CH_3$ | $CH_3SO_3$ |
| Z2-i | $-(CH_2CH_2O)_3CH_3$ | $-(CH_2CH_2O)_3CH_3$ | SCN |
| Z2-j | $CH_3$ | $-(CH_2CH_2O)_3CH_3$ | $CF_3COO$ |
| Z2-k | $CH_3$ | $-(CH_2CH_2O)_3CH_3$ | $CH_3SO_3$ |
| Z2-l | $CH_3$ | $-(CH_2CH_2O)_3CH_3$ | SCN |
| Z2-m | $-(CH_2CH_2O)_2CH_3$ | $-(CH_2)_3CN$ | $CF_3COO$ |
| Z2-n | $-(CH_2CH_2O)_2CH_3$ | $-(CH_2)_3CN$ | $CH_3SO_3$ |
| Z2-o | $-(CH_2CH_2O)_2CH_3$ | $-(CH_2)_3CN$ | SCN |
| Z2-p | $-(CH_2CH_2O)_2CH_2CH_2CN$ | $-(CH_2)_3CN$ | $CF_3COO$ |
| Z2-q | $-(CH_2CH_2O)_2CH_2CH_2CN$ | $-(CH_2)_3CN$ | $CH_3SO_3$ |
| Z2-r | $-(CH_2CH_2O)_2CH_2CH_2CN$ | $-(CH_2)_3CN$ | SCN |

-continued

| | | | |
|---|---|---|---|
| Z2-s | —(CH₂CH₂O)₂CH₃ | —(CH₂CH₂O)₂CH₃ | CF₃CH₂SO₃ |
| Z2-t | —CH₂CH₂OCH₃ | —CH₂CH₂OCH₃ | CF₃COO |

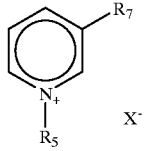

| | R₅ | R₇ | X |
|---|---|---|---|
| Z3-a | C₄H₉(n) | H | CF₃COO |
| Z3-b | C₄H₉(n) | H | CF₃CF₂CF₂COO |
| Z3-c | C₄H₉(n) | H | CH₃SO₃ |
| Z3-d | C₄H₉(n) | H | (ethoxyethyl sulfonate) |
| Z3-e | C₄H₉(n) | H | (p-toluenesulfonate) |
| Z3-f | C₄H₉(n) | H | SCN |
| Z3-g | —(CH₂CH₂O)₂C₂H₅ | H | CF₃COO |
| Z3-h | —(CH₂CH₂O)₂C₂H₅ | H | CH₃SO₃ |
| Z3-i | —(CH₂CH₂O)₂C₂H₅ | H | SCN |
| Z3-j | —(CH₂CH₂O)₂CH₃ | CH₃ | CF₃COO |
| Z3-k | —(CH₂CH₂O)₂CH₃ | CH₃ | CH₃SO₃ |
| Z3-l | —(CH₂CH₂O)₂CH₃ | CH₃ | SCN |

Z4 

Z4-a: X⁻ = CF₃COO⁻
Z4-b: X⁻ = CH₃SO₃⁻
Z4-c: X⁻ = SCN⁻

Z5 

Z5-a: X⁻ = CF₃COO⁻
Z5-b: X⁻ = CH₃SO₃⁻
Z5-c: X⁻ = SCN⁻

Z6 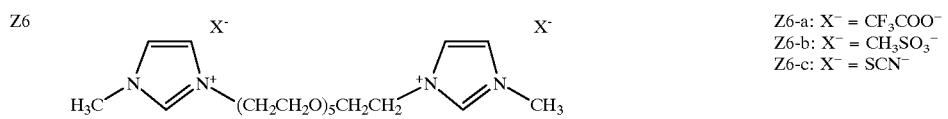

Z6-a: X⁻ = CF₃COO⁻
Z6-b: X⁻ = CH₃SO₃⁻
Z6-c: X⁻ = SCN⁻

Z7 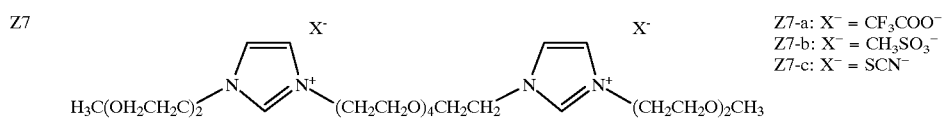

Z7-a: X⁻ = CF₃COO⁻
Z7-b: X⁻ = CH₃SO₃⁻
Z7-c: X⁻ = SCN⁻

Z8 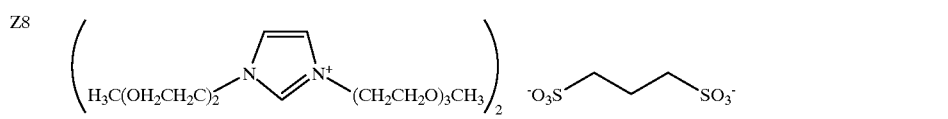

Z9 

Z9-a: X⁻ = CF₃COO⁻
Z9-b: X⁻ = CH₃SO₃⁻
Z9-c: X⁻ = SCN⁻

-continued

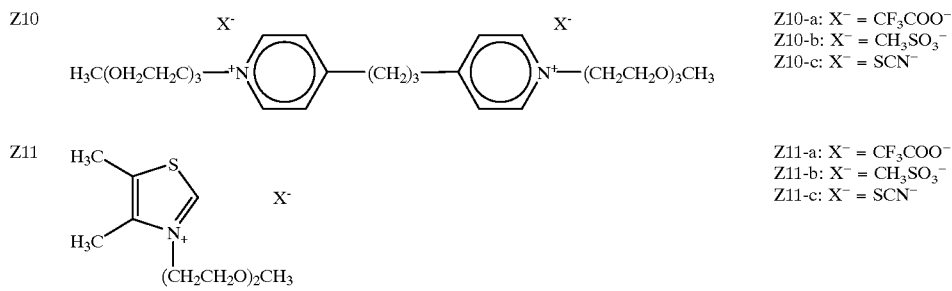

(B) Iodine

When the electrolyte composition of the present invention is used for the photoelectric conversion device, it is preferable that the electrolyte composition further comprises iodine. In this case, an iodine-content is preferably 0.1 to 20 weight %, more preferably 0.5 to 5 weight % based on the total of the electrolyte composition.

(C) Solvent

The electrolyte composition may comprise a solvent. A solvent-content of the electrolyte composition is preferably 50 weight % or less, more preferably 30 weight % or less, particularly preferably 10 weight % or less based on the total thereof.

The solvent is preferably has an excellent ionic conductibility. Such a solvent exhibits a low viscosity and a high ionic mobility, and/or a high permittivity and a high actual carrier concentration. The solvent used for the electrolyte composition of the present invention include: carbonates such as ethylene carbonate and propylene carbonate; heterocyclic compounds such as 3-methyl-2-oxazolidinone; ethers such as dioxan and diethyl ether; chain ethers such as ethylene glycol dialkyl ethers, propylene glycol dialkyl ethers, polyethylene glycol dialkyl ethers and polypropylene glycol dialkyl ethers; alcohols such as methanol, ethanol, ethylene glycol monoalkyl ethers, propylene glycol monoalkyl ethers, polyethylene glycol monoalkyl ethers and polypropylene glycol monoalkyl ethers; glycols such as ethylene glycol, propylene glycol, polyethylene glycol, polypropylene glycol and glycerin; nitriles such as acetonitrile, glutarodinitrile, methoxyacetonitrile, propionitrile, benzonitrile and biscyanoether; esters such as carboxylates, phosphates and phosphonates; aprotic polar solvents such as dimethylsulfoxide (DMSO) and sulfolane; water; etc. These solvents may be used as a mixed solvent composed of two or more kinds thereof.

(D) Others

The electrolyte composition of the present invention may be gelled (solidified) at practical use. The gelation may be achieved by: adding a polymer; adding an oil-gelling agent; polymerization of multifunctional monomers added to the electrolyte composition; a cross-linking reaction of a polymer; etc.

When the electrolyte composition is gelled by adding a polymer, compounds described in Polymer Electrolyte Reviews-1,2, edited by J. R. MacCaLLum and C. A. Vincent, ELSEIVER APPLIED SCIENCE may be used as the polymer, and polyacrylonitrile or poly(vinylidene fluoride) is preferably used.

When the electrolyte composition is gelled by adding an oil-gelling agent, compounds described in J. Chem. Soc. Japan, Ind. Chem. Soc., 46, 779 (1943), J. Am. Chem. Soc., 111, 5542 (1989), J. Chem. Soc., Chem. Commun., 390 (1993), Angew. Chem. Int. Ed. Engl., 35, 1949 (1996), Chem. Lett., 885, (1996), J. Chem. Soc., Chem. Commun., 545 (1997), etc. may be used as the oil-gelling agent. Of these compounds, preferred are those having an amide structure.

In the case where a gel electrolyte composition is formed by polymerization of multifunctional monomers, the gelation is preferably achieved by the method comprising the steps of: preparing a solution composed of the multifunctional monomers, a polymerization initiator, the electrolyte and a solvent; forming a sol electrolyte layer on an electrode having a dye by a casting method, a coating method, a soaking method, an impregnation method, etc.; and radical polymerizing the multifunctional monomers. It is preferable that the multifunctional monomer has two or more ethylenically unsaturated groups. Preferable examples thereof include divinyl benzene, ethylene glycol diacrylate, ethylene glycol dimethacrylate, diethylene glycol diacrylate, diethylene glycol dimethacrylate, triethylene glycol diacrylate, triethylene glycol dimethacrylate, pentaerythritol triacrylate and trimethylolpropane triacrylate.

The solution for polymerization above-mentioned may contain unifunctional monomers together with the multifunctional monomers. Preferable examples of the unifunctional monomers include: acrylic acid and α-alkyl acrylic acids (e.g. acrylic acid, methacrylic acid, itaconic acid, etc.), and esters or amides derived therefrom (e.g. methyl acrylate, ethyl acrylate, n-propyl acrylate, i-propyl acrylate, n-butyl acrylate, i-butyl acrylate, t-butyl acrylate, n-pentyl acrylate, 3-pentyl acrylate, t-pentyl acrylate, n-hexyl acrylate, 2,2-dimethylbutyl acrylate, n-octyl acrylate, 2-ethylhexyl acrylate, 4-methyl-2-propyl pentyl acrylate, cetyl acrylate, n-octadecyl acrylate, cyclohexyl acrylate, cyclopentyl acrylate, benzyl acrylate, hydroxyethyl acrylate, 2-hydroxypropyl acrylate, 2-methoxyethyl acrylate, 2-ethoxyethyl acrylate, 2-methoxyethoxyethyl acrylate, phenoxyethyl acrylate, 3-methoxybutyl acrylate, ethylcarbitol acrylate, 2-methyl-2-nitropropyl acrylate, 2,2,2-trifluoroethyl acrylate, octafluoropentyl acrylate, heptadecafluorodecyl acrylate, methyl methacrylate, n-butyl methacrylate, i-butyl methacrylate, t-butyl methacrylate, t-pentyl methacrylate, n-octadecyl methacrylate, benzyl methacrylate, hydroxyethyl methacrylate, 2-hydroxypropyl methacrylate, 2-methoxyethyl methacrylate, 2-ethoxyethyl methacrylate, 2-methoxyethoxyethyl methacrylate, dimethylaminoethyl methacrylate, 2,2,2-trifluoroethyl methacrylate, tetrafluoropropyl methacrylate, hexafluoropropyl methacrylate, heptadecafluorodecyl methacrylate, ethylene glycol ethyl carbonate methacrylate, 2-isobornyl methacrylate, 2-norbornylmethyl methacrylate, 5-norbomen-2-ylmethyl methacrylate, 3-methyl-2-norbornylmethyl methacrylate, acrylamide, N-i-propyl acrylamide, N-n-butyl acrylamide, N-t-butyl acrylamide, N,N-dimethyl acrylamide, N-methylol acrylamide, diacetone acrylamide, 2-acrylamido-2-methylpropane sulfonic acid, acrylamidepropyltrimethyl ammonium chloride, methacrylamide, N-methylmethacrylamide, N-methylolmethacrylamide, etc.); vinyl esters (e.g. vinyl acetate, etc.); maleic acid and fumaric acid, and esters derived therefrom (e.g. dimethyl maleate, dibutyl maleate, diethyl fumarate, etc.); acrylonitrile and methacrylonitrile; dienes (e.g., butadiene, cyclopentadiene, isoprene, etc.); aromatic vinyl compounds (e.g., styrene, p-chlorostyrene, t-butylstyrene, a-methylstyrene, sodium p-styrenesulfonate, etc.); N-vinylformamide, N-vinyl-N-methylformamide, N-vinylacetamide, and N-vinyl-N-methylacetamide; vinyl sulfonic acid; sodium vinylsulfonate, sodium allylsulfonate and sodium methacrylsulfonate; vinylidene fluoride and vinylidene chloride; vinyl alkyl ethers (e.g. methyl vinyl ether, etc.); ethylene, propylene, butene and isobutene; and N-phenyl maleimide.

The weight ratio of the multifunctional monomers to all the monomers in the polymerization solution is preferably 0.5 to 70 weight %, more preferably 1.0 to 50 weight %.

The above-described monomers can be polymerized by general radical polymerization methods described in Takayuki Otsu and Masaetsu Kinoshita, Kobunshi Gosei no Jikkenho (Kagaku Dojin), Takayuki Otsu, Koza Jugo Hannoron 1 Rajikaru Jugo (I) (Kagaku Dojin), etc. The radical polymerization of the monomers may be carried out by heating, light or electron beams, or electro-chemically. Among them, heat-polymerization is particularly preferable.

Preferable examples of the polymerization initiator used in the present invention include: azo initiators such as 2,2'-azobis(isobutyronitrile), 2,2'-azobis(2,4-dimethylvaleronitrile), dimethyl 2,2'-azobis(2-methylpropionate) and dimethyl 2,2'-azobis(isobutyrate); peroxide initiators such as lauryl peroxide, benzoyl peroxide and t-butyl peroctoate; etc. The weight ratio of the initiator to all the monomers is preferably 0.01 to 20 weight %, more preferably 0.1 to 10 weight %.

The weight ratio of the monomers accounting for the gel electrolyte is preferably in the range of 0.5 to 70 weight %, more preferably 1.0 to 50 weight %.

In the case where the gelation of the electrolyte composition is accomplished by the cross-linking reaction of polymers, a polymer having a group with a cross-linking reactivity is preferably added to the composition in combination with a cross-linking agent. The group with a cross-linking reactivity is preferably a nitrogen-containing heterocyclic group such as a pyridine group, an imidazole group, a thiazole group, an oxazole group, a triazole group, a morpholine group, a piperidine group, a piperazine group, etc. Preferable examples of the cross-linking agent include bi- or multi-functional electrophilic agents to be attacked by the nitrogen atom, such as bi- or multi-functional alkyl halides, aralkyl halides, sulfonates, acid anhydrides, acyl chlorides and isocyanates.

To the electrolyte composition of the present invention may be added: a metal iodide such as LiI, NaI, CsI and $CaI_2$; a metal bromide such as LiBr, NaBr, KBr, CsBr and $CaBr_2$; a quaternary ammonium bromide such as a tetraalkyl ammonium bromide and pyridinium bromide; a metal complex such as a ferrocyanide-ferricyanide and a ferrocene-ferricinium ion; a sulfur compound such as sodium polysulfide and an alkylthiol-alkyldisulfide; a viologen dye; hydroquinone-quinone; etc. These compounds may be used as a mixture thereof.

Further, to the electrolyte composition of the present invention may be added a basic compound such as t-butylpyridine, 2-picoline, 2,6-lutidine, etc. described in J. Am. Ceram. Soc., 80 (12), 3157 to 3171 (1997). The concentration of the basic compound is preferably 0.05 to 2 M based on the electrolyte composition.

[2] Photoelectric Conversion Device

The photoelectric conversion device according to the present invention has an electrically conductive layer, a photosensitive layer, a charge-transporting layer and a counter electrode, where the charge-transporting layer comprises the electrolyte composition of the present invention mentioned above. As shown in FIG. 1, the photoelectric conversion device preferably comprises an electrically conductive layer 10, a photosensitive layer 20, a charge-transporting layer 30 and a counter electrically conductive layer 40 laminated in this order, where the photosensitive layer 20 comprises semiconductor fine particles 21 sensitized by a dye 22 and an electrolyte 23 penetrated into voids among the semiconductor fine particles. The electrolyte 23 is preferably composed of the same materials as the components used in the charge-transporting layer 30. A substrate 50 may be disposed on the electrically conductive layer 10 and/or the counter electrically conductive layer 40 to improve the strength of the photoelectric conversion device. Hereinafter in the present invention, a layer composed of the electrically conductive layer 10 and the substrate 50 disposed thereon if necessary is referred to as "a conductive support", and a layer composed of the counter electrically conductive layer 40 and the substrate 50 disposed thereon if necessary is referred to as a "counter electrode". A photoelectrochemical cell of the present invention is constituted by connecting the device to an outer circuit. Incidentally, the electrically conductive layer 10, the counter electrically conductive layer 40 and the substrate 50 shown in FIG. 1 may be a transparent electrically conductive layer 10a, a transparent counter electrically conductive layer 40a and a transparent substrate 50a, respectively.

In the photoelectric conversion device of the present invention shown in FIG. 1, light injected to the photosensitive layer 20 excites the dye 22, etc., resultant high energy electrons therein are transferred to a conduction band of the semiconductor fine particles 21, and they are diffused to reach to the electrically conductive layer 10. At this time, the dye 22 is in oxidized form. In the photo-electrochemical cell, electrons in the electrically conductive layer 10 are returned to the oxidation product of the dye 22 through the counter electrically conductive layer 40 and the charge-transporting layer 30 while working in the outer circuit, so that the dye 22 is regenerated. The photosensitive layer 20 acts as an anode. In a boundary of each layer such as a boundary between the electrically conductive layer 10 and the photosensitive layer 20, a boundary between the photosensitive layer 20 and the charge-transporting layer 30, a boundary between the charge-transporting layer 30 and the counter electrically conductive layer 40, etc., components of each layer may be diffused and mixed with each other. Each of the layers will be explained in detail below.

(A) Conductive Support

The conductive support is composed of: (1) a single layer of the electrically conductive layer; or (2) two layers of the electrically conductive layer and the substrate. The substrate is not necessary in the case where the electrically conductive layer has a high strength and can sufficiently seal the photoelectric conversion device.

In the case (1), the electrically conductive layer is preferably made of a material having the sufficient strength and electrical conductivity such as a metal, etc.

In the case (2), as the conductive support may be used the substrate having thereon the electrically conductive layer comprising an electrically conductive agent at the photosensitive layer side. Preferable examples of the electrically conductive agent include: metals such as platinum, gold, silver, copper, aluminum, rhodium and indium; carbon; and electrically conductive metal oxides such as indium-tin composite oxides and tin oxides doped with fluorine; etc. The thickness of the electrically conductive layer is preferably 0.02 to 10 μm.

The surface resistance of the conductive support is preferably as low as possible. The surface resistance is preferably 100 Ω/square or less, more preferably 40 Ω/square or less. The lowest limit thereof is not limited in particular, and is generally approximately 0.1 Ω/square.

When light is irradiated from the conductive support side, it is preferred that the conductive support is substantially transparent. Herein, the term "substantially transparent" means the support has a light-transmittance of 10% or more. The light-transmittance is preferably 50% or more, particularly preferably 70% or more.

The transparent conductive support is preferably constituted by forming the transparent electrically conductive layer comprising an electrically conductive metal oxide on the transparent substrate of a material such as a glass and a plastic by a coating method or a vapor depositing method. Of such supports, particularly preferred is a transparent electrically conductive substrate made of a low-cost soda-lime float glass, in which the electrically conductive layer comprising a tin oxide doped with fluorine is deposited thereon. As for a low-cost and flexible photoelectrical conductive device or solar cell, a transparent polymer film having disposed the electrically conductive layer thereon is preferably used as the transparent conductive support. Examples of materials for the transparent polymer film include tetraacetylcellulose (TAC), polyethylene terephthalate (PET), polyethylene naphthalate (PEN), syndiotactic polystyrene (SPS), polyphenylenesulfide (PPS), polycarbonate (PC), polyarylate (PAr), polysulfone (PSF), polyestersulfone (PES), polyetherimide (PEI), cyclic polyolefin, brominated phenoxy, etc. To secure a sufficient transparency, the coating amount of the electrically conductive metal oxide is preferably 0.01 to 100 g per 1 m$^2$ of the glass or plastic substrate.

It is preferable that a metal lead is used to reduce a resistance of the transparent conductive support. Material for the metal lead is preferably aluminum, copper, silver, gold, platinum, nickel, etc., particularly preferably aluminum or silver. The metal lead disposed on the transparent electrically conductive layer of a tin oxide doped with fluorine, an ITO film, etc., thereon is preferably applied on the transparent substrate by a vapor deposition method, a sputtering method, or the like. It is also preferable that after forming the transparent electrically conductive layer on the transparent substrate, the metal lead is applied thereon. The reduction in quantity of incident light owing to the metal lead is preferably 10% or less, more preferably 1 to 5%.

(B) Photosensitive Layer

The photosensitive layer preferably comprises the semiconductor fine particles sensitized by the dye. The semiconductor fine particles act as a so-called photosensitive substance to absorb a light, thereby conducting a charge separation and generating electrons and positive holes. With respect to the dye-sensitized semiconductor fine particles, the light-absorption and the generation of electrons and positive holes are primarily caused in the dye, and the semiconductor fine particles receive and then convey the electrons.

(1) Semiconductor Fine Particles

As the semiconductor fine particles, simple semiconductors such as silicon and germanium, III–V series compound semiconductors, metal chalcogenides such as oxides, sulfides and selenides, compounds with a perovskite structure such as strontium titanate, calcium titanate, sodium titanate, barium titanate and potassium niobate, etc. may be used. The semiconductor fine particles used in the present invention are preferably composed of a metal chalcogenide.

Preferable examples of the metal chalcogenide include: oxides of titanium, tin, zinc, iron, tungsten, zirconium, hafnium, strontium, indium, cerium, yttrium, lanthanum, vanadium, niobium or tantalum; sulfides of cadmium, zinc, lead, silver, antimony or bismuth; selenides of cadmium or lead; and cadmium telluride; etc. Examples of other compound semiconductors include: phosphides of zinc, gallium, indium and cadmium; selenides of gallium-arsenic or copper-indium; and copper-indium sulfide; etc.

Preferable specific examples of the semiconductor used in the present invention include Si, $TiO_2$, $SnO_2$, $Fe_2O_3$, $WO_3$, ZnO, $Nb_2O_5$, CdS, ZnS, PdS, $Bi_2S_3$, CdSe, CdTe, GaP, InP, GaAs, $CuInS_2$ and $CuInSe_2$. Of these semiconductors, more preferred are $TiO_2$, ZnO, $SnO_2$, $Fe_2O_3$, $WO_3$, $Nb_2O_5$, CdS, PdS, CdSe, MiP, GaAs, $CuInS_2$ and $CuInSe_2$, particularly preferred are $TiO_2$ and $Nb_2O_5$, and the most preferred is $TiO_2$.

The semiconductor may have a single crystal or a poly crystal structure. The single crystal semiconductor is preferred from a viewpoint of a conversion efficiency, while the poly crystal semiconductor is preferred from viewpoints of a production cost, security of raw materials and an energy-payback time.

The particle size of the semiconductor fine particles is generally in the nm to μm level. The mean size of primary particles, which is obtained from a diameter of a circle equivalent to a projected area, is preferably 5 to 200 nm, more preferably 8 to 100 nm. Further, the mean size of the secondary semiconductor fine particles in a dispersion is preferably 0.01 to 100 μm.

Two or more kinds of particles having a different particle size distribution may be mixed to use in the photosensitive layer. In this case, the average particle size of the smaller particles is preferably 5 nm or less. To improve a light-capturing rate by scattering a ray of light, the semiconductor fine particles having a large particle size, e.g. approximately 300 nm, may be added to the mixture composing the semiconductor layer.

Preferred as a method for producing the semiconductor fine particles are: sol-gel methods described in Sumio Sakka, Science of a sol-gel method, Agune Shofusha (1998), Technical information Association, Thin film-coating technology by a sol-gel method (1995), etc.; and gel-sol methods described in Tadao Sugimoto, Synthesis of mono-dispersion particles and control of their size and form by a novel gel-sol method, and MATERIA, Vol. 35, No. 9, pp. 1012 to 1018 (1996). The method developed by Degussa Company, which comprises preparing oxides by subjecting chlorides to a high temperature hydrolysis in an oxyhydrogen salt is also preferred.

In the case where titanium oxide is used as the semiconductor fine particles, any of the above-described sol-gel method, gel-sol method and high temperature hydrolysis method may be preferably used, and further a sulfuric acid method and a chlorine method described in Manabu Seino, Titanium oxide—properties and applied technique, Gihodo Shuppan, (1997) may be used. Also preferred as a sol-gel method are a method described in Christophe J. Barb'e, et al, Journal of American Ceramic Society, Vol. 80, No. 12, pp. 3157 to 3171 (1997) and a method described in Burnside, et al, Chemistry of Materials, Vol. 10, No. 9, pp. 2419 to 2425.

(2) Semiconductor Fine Particle Layer

The semiconductor fine particles may be coated on the conductive support by such a method as: a method where a dispersion liquid or a colloid solution containing the particles is coated on the electrically conductive layer; the above-mentioned sol-gel method, etc. A wet-type film production method is relatively advantageous for the mass production of the photoelectric conversion device, improvement of properties of semiconductor fine particles and adaptability of the conductive support, etc. As such a wet-type film production method, a coating method and a printing method are typical examples.

As a method for preparing a dispersion solution containing the semiconductor fine particles, the sol-gel method mentioned above may be used. Further, the dispersion solution may be prepared by crushing the semiconductor in a mortar, dispersing the semiconductor while grinding in a mill, or precipitating the semiconductor fine particles in a solvent when the semiconductor is synthesized.

As a dispersion solvent, water or various kinds of organic solvents such as methanol, ethanol, isopropyl alcohol, dichloromethane, acetone, acetonitrile, ethyl acetate, etc. may be used. At the dispersion, a polymer, a surfactant, an acid or a chelating agent may be used as a dispersing agent, if necessary.

Preferred coating methods are a roller method and a dip method as an application series, an air-knife method and a blade method as a metering series, etc. Further, preferable as a method where an application and metering can be performed at the same time are a wire-bar method disclosed in JP-B-58-4589, a slide-hopper method described in U.S. Pat. Nos. 2,681,294, 2,761,419, 2,761,791, etc., an extrusion method, a curtain method, etc. Furthermore, as for a wide use, a spin method and a spray method are preferred. As a wet-type printing method, three major printing methods comprising a relief printing, an offset printing and a gravure printing, and an intaglio printing, a gum-printing, a screen printing, etc. are preferred. A preferable film-production method is selected from the above-mentioned methods in accordance with the viscosity of the solution and a wet thickness.

The viscosity of the dispersion solution materially depends on the kind and dispersion property of the semiconductor fine particles, the kind of a solvent and additives such as a surfactant and a binder. For a high viscosity solution (e.g. 0.01 to 500 Poise), an extrusion method, a cast method, a screen-printing method, etc. are preferably used. On the other hand, for a low viscosity solution (e.g., 0.1 Poise or less), a slide-hopper method, a wire-bar method and a spin method are preferably used to form a uniform film. In the case of the low viscosity solution, an extrusion method may be used if the solution is coated to some extent. A wet-type film-production method may be properly selected in accordance with the viscosity of a coating solution, a coating amount, a support, a coating speed and so on.

The layer of the semiconductor fine particles is not limited to a single layer. The dispersion solutions of semiconductor fine particles, each of which dispersion has a different particle size, may be subjected to a multi-layer coating. Further, alternatively coating solutions each containing different kinds of semiconductor fine particles (or different kinds of binders, or additives) may be subjected to a multi-layer coating. When a film-thickness is insufficient by coating once, a multi-layer coating is also effective. An extrusion method and a slide-hopper method are suitable for the multi-layer coating. When a multi-layer coating is carried out, multi-layers may be coated at the same time, or alternatively they may be coated one over the other from several times to ten-several times. In the latter case, a screen method is also preferably used.

Generally, in the case where the thickness of the semiconductor fine particle layer, same as the thickness of a photosensitive layer, becomes thicker, the amount of a dye incorporated therein per unit of the projected area increases, thereby making the light capturing rate higher. However, because a diffusion distance of the generated electrons increases in such a case, a loss owing to recombination of electric charges also increases. Consequently, a preferable thickness of the semiconductor fine particle layer is 0.1 to 100 $\mu$m. When the photoelectric conversion device comprising the semiconductor fine particle layer is utilized for the photo-electrochemical cell, the thickness thereof is preferably 1 to 30 $\mu$m, more preferably 2 to 25 $\mu$m. A coating amount of the semiconductor fine particles per 1 $m^2$ of the support is preferably 0.5 to 400 g, more preferably 5 to 100 g.

After coating the semiconductor fine particles on the conductive support, the particles are preferably subjected to a heat treatment to electronically contact them with each other, and to increase a coating strength and an adherence thereof with the support. A heating temperature at the heat treatment is preferably 40° C. or more but less than 700° C., more preferably 100 to 600° C. A heating time is approximately 10 minutes to 10 hours. It is not preferred that a support having a low melting point or softening point such as a polymer film is subjected to a high temperature treatment because such a support tends to be deteriorated thereby. The heat treatment is preferably carried out at a temperature as low as possible from a viewpoint of the cost. The practice at such a low temperature can be realized by a combination use with the above-described small semiconductor fine particles having a size of 5 nm or less, a heat treatment in the presence of a mineral acid, etc.

After a heat treatment, a chemical metal-plating using a titanium tetrachloride aqueous solution, etc. or an electrochemical metal-plating using a titanium trichloride aqueous solution may be carried out to increase a surface area of the semiconductor fine particles, or to enhance a purity in the vicinity of the semiconductor fine particles, thereby improving an efficiency of electron injection into the semiconductor fine particles from a dye.

It is preferable that the semiconductor fine particles have a large surface area, so that they can adsorb lots of dyes. Therefore, the surface area in the state that the semiconductor fine particle layer have been coated on the support is preferably 10 times or more, more preferably 100 times or more of the projected area. The highest limit, even though it is not limited in particular, is generally a level of 1000 times.

(3) Dye

The dye used for the photosensitive layer in the present invention is preferably a metal complex dye, a phthalocyanine dye and/or a methine dye, more preferably a metal complex dye and/or a methine dye. Two or more kinds of dyes may be used as a mixture to obtain a large photoelectric conversion wavelength region and a high photoelectric conversion efficiency. In the case of using a plurality of the dyes as a mixture, the dye and its mixing ratio may be selected in accordance with the wavelength region and the strength distribution of the light source.

It is preferred that the dye has an appropriate interlocking group for linking to the surface of the semiconductor fine particles. Preferred interlocking groups include —COOH, —SO₃H, a cyano group, —P(O)(OH)₂, —OP(O)(OH)₂, and chelating groups having α-conductivity such as oxime, dioxime, hydroxyquinoline, salicylate and α-ketoenolate groups. Among them, particularly preferred are —COOH, —P(O)(OH)₂ and —OP(O)(OH)₂. The interlocking group may form a salt with an alkali metal, etc. or an intramolecular salt. If the methine chain of the methine dye has an acidic group as in the case where the methine chain forms a squarylium ring or a croconium ring, this group may act as the interlocking group.

The preferred dyes used for the photosensitive layer will be specifically described below.

(a) Metal Complex Dye

The metal complex dye used in the present invention is preferably a ruthenium complex. The ruthenium complex dye described in U.S. Pat. Nos. 4,927,721, 4,684,537, 5,084,365, 5,350,644, 5,463,057, 5,525,440, Japanese Patent Laid-Open No. 7-249790, etc. may be used in the present invention.

The ruthenium complex dye used in the present invention is preferably represented by the following formula (I):

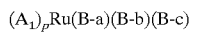

(A$_1$)$_p$Ru(B-a)(B-b)(B-c)    (I)

wherein A$_1$ represents a ligand selected from the group consisting of Cl, SCN, H$_2$O, Br, I, CN, NCO and SeCN; p represents an integer of 0 to 2, preferably 2; and B-a, B-b, and B-c independently represent an organic ligand selected from the compounds represented by the following formulae B-1 to B-8.

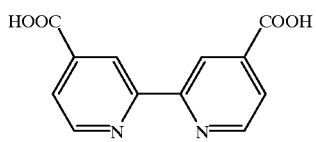

B-1

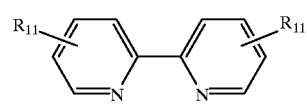

B-2

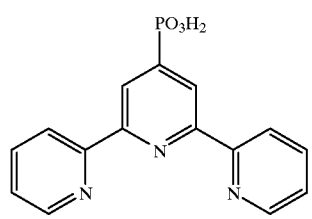

B-3

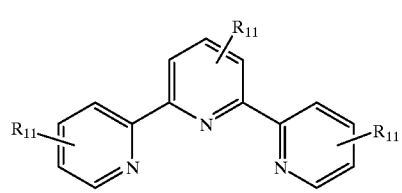

B-4

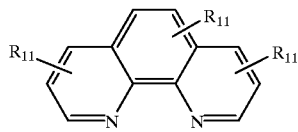

B-5

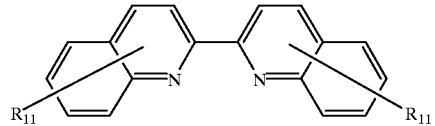

B-6

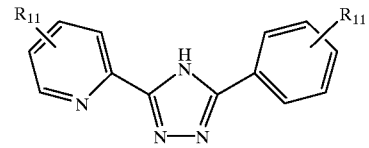

B-7

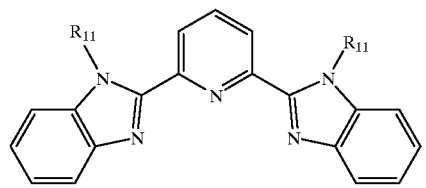

B-8 wherein R$_{11}$ represents a hydrogen atom, a halogen atom, a substituted or unsubstituted alkyl group having 1 to 12 carbon atoms, a substituted or unsubstituted aralkyl group having 7 to 12 carbon atoms or a substituted or unsubstituted aryl group having 6 to 12 carbon atoms. The alkyl group and the alkyl moiety of the aralkyl group may be straight or branched chain, and the aryl group and the aryl moiety of the aralkyl group may have a monocyclic structure or a polycyclic structure such as a condensed ring and a ring assemblage. B-a, B-b and B-c may be the same or different ligands.

The metal complex dyes useful in the present invention will be illustrated below without intention of restricting the scope of the present invention defined by the claims attached hereto.

| (A$_1$)$_p$Ru(B-a)(B-b)(B-c) | | | | | | (I) |
|---|---|---|---|---|---|---|
| | A$_1$ | p | B-a | B-b | B-c | R$_{11}$ |
| R-1 | SCN | 2 | B-1 | B-1 | — | — |
| R-2 | CN | 2 | B-1 | B-1 | — | — |
| R-3 | Cl | 2 | B-1 | B-1 | — | — |
| R-4 | Br | 2 | B-1 | B-1 | — | — |
| R-5 | I | 2 | B-1 | B-1 | — | — |
| R-6 | SCN | 2 | B-1 | B-2 | — | H |
| R-7 | SCN | 1 | B-1 | B-3 | — | — |
| R-8 | Cl | 1 | B-1 | B-4 | — | H |
| R-9 | I | 2 | B-1 | B-5 | — | H |
| R-10 | SCN | 2 | B-1 | B-6 | — | H |
| R-11 | CN | 2 | B-1 | B-7 | — | H |
| R-12 | Cl | 1 | B-1 | B-8 | — | H |
| R-13 | — | 0 | B-1 | B-1 | B-1 | — |

R-14

-continued
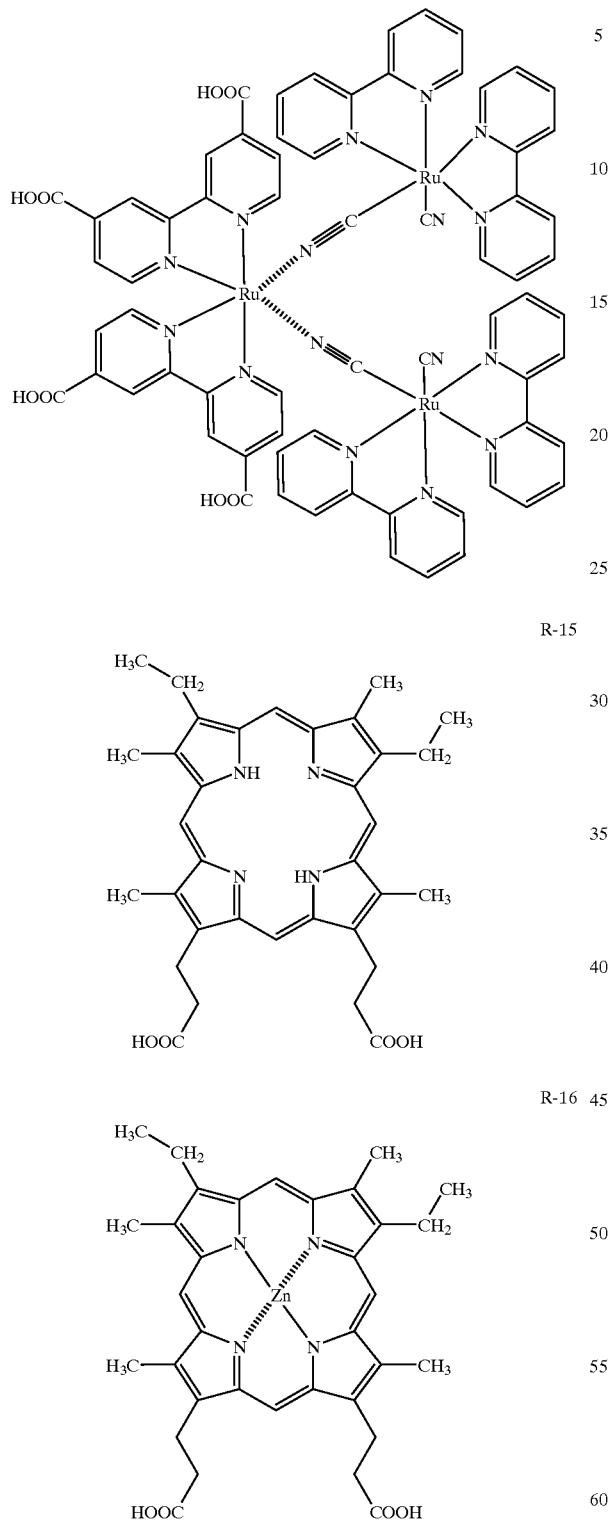
R-15
R-16
R-17
-continued
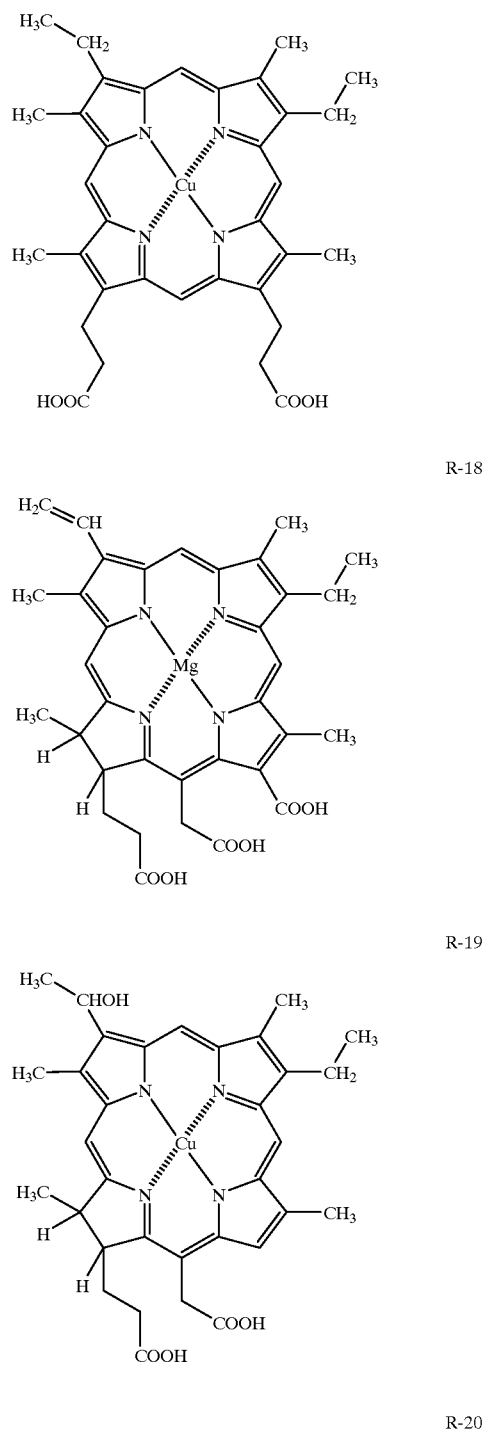
R-18
R-19
R-20

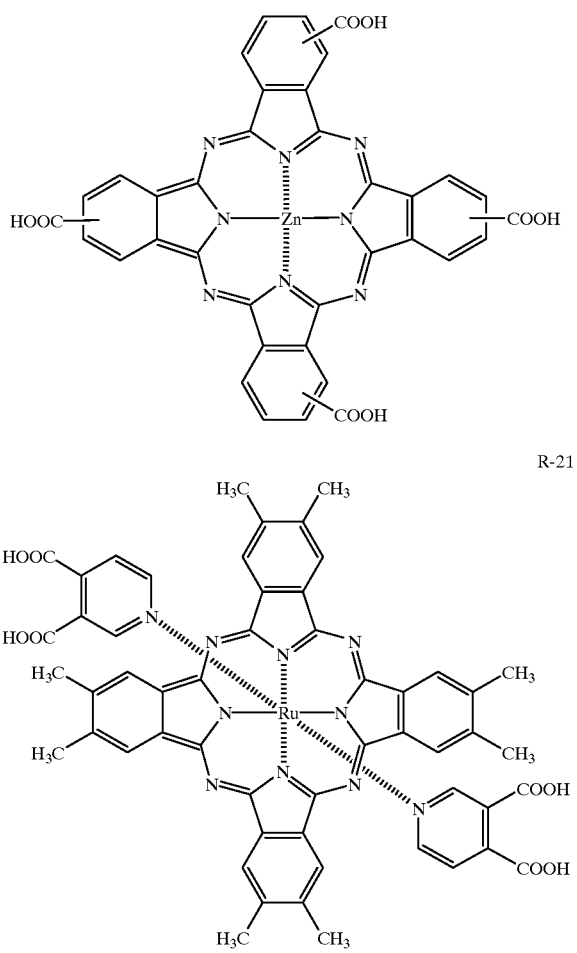

R-21

(b) Methine Dye

The methine dyes preferably used in the present invention include those represented by any of the following general formulae (II), (III), (IV) and (V) shown below.

1. General Formula (II)

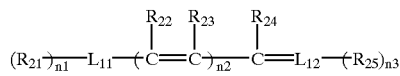

In the general formula (II), $R_{21}$ and $R_{25}$ independently represent a hydrogen atom, an alkyl group, an aryl group or a heterocyclic group; $R_{22}$ to $R_{24}$ independently represent a hydrogen atom or a substituent; $R_{21}$ to $R_{25}$ may be bonded together to form a ring; $L_{11}$ and $L_{12}$ independently represent a nitrogen atom, an oxygen atom, a sulfur atom, a selenium atom or a tellurium atom; n1 and n3 independently represent an integer of 0 to 2; and n12 represents an integer of 1 to 6. This dye may have a counter ion in agreement with the charge quantity of the whole molecule.

The above-mentioned alkyl group, aryl group and heterocyclic group may have a substituent. The alkyl group may be a straight or branched chain, and the aryl group and the heterocyclic group may have a monocyclic structure or a polycyclic structure such as a condensed ring and a ring assemblage. Further, the ring formed by $R_{21}$ to $R_{25}$ may have a substituent, and may be a monocyclic ring or a condensed ring.

2. General Formula (III)

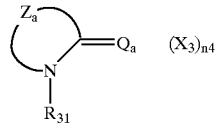

In the general formula (III), $Z_a$ represents a non-metal atomic group forming a nitrogen-containing heterocyclic group, and $R_{31}$ represents an alkyl group or an aryl group. $Q_a$ represents a methine group or a polymethine group necessary to act as a polymethine dye. The dye may form an oligomer or a polymer through $Q_a$. $X_3$ represents a counter ion, and n4 representing a number thereof is an integer of 0 to 10.

The nitrogen-containing heterocyclic ring formed by $Z_a$ may have a substituent, and may be a monocyclic ring or a condensed ring. The alkyl or aryl groups represented by $R_{31}$ may have a substituent, the alkyl group may be a straight or branched chain, and the aryl group may have a monocyclic structure or a polycyclic structure such as a condensed ring and a ring assemblage.

Of the dyes represented by the general formula (III), more preferable are those represented by any one of the following general formulae (III-a) to (III-d):

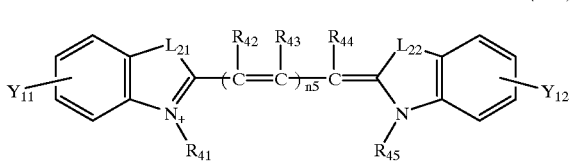

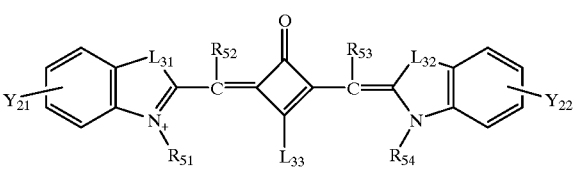

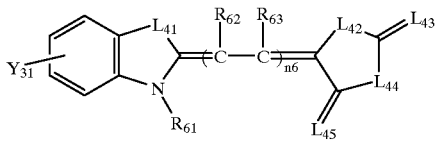

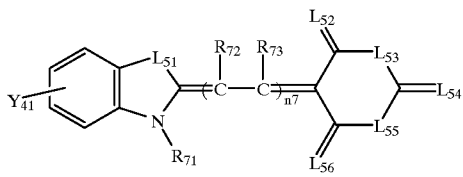

wherein $R_{41}$ to $R_{45}$, $R_{51}$ to $R_{54}$, $R_{61}$ to $R_{63}$ and $R_{71}$ to $R_{73}$ independently represent a hydrogen atom, an alkyl group, an aryl group or a heterocyclic group;

$L_{21}$, $L_{22}$, $L_{31}$, $L_{32}$, $L_{41}$ to $L_{45}$ and $L_{51}$ to $L_{56}$ independently represent an oxygen atom, a sulfur atom, a selenium atom, a tellurium atom, —CR'R''— or —NR'— (in which R' and R" independently represent a hydrogen atom, an alkyl group, an aryl group or a heterocyclic group, and may be the same or different); $L_{33}$ represents $O^-$, $S^-$, $Se^-$, $Te^-$ or $N^-R'$ (in which R' represents a hydrogen atom, an alkyl group, an aryl group or a heterocyclic group); $Y_{11}$, $Y_{12}$, $Y_{21}$, $Y_{22}$, $Y_{31}$ and $Y_{41}$ independently represent a substituent; and n5, n6, and n7 independently represent an integer of 1 to 6.

The dyes represented by any one of the general formulae (III-a) to (III-d) may have a counter ion in agreement with the charge of the molecule. According to the dyes, the alkyl group, the aryl group and the heterocyclic group may have a substituent, the alkyl group may be straight or branched, and the aryl group or the heterocyclic group may have a monocyclic structure or a polycyclic structure such as a condensed ring and a ring assemblage.

Specific examples of the polymethine dyes represented by the general formula (III) are described in detail in M. Okawara, T. Kitao, T. Hirashima and M. Matsuoka, Organic Colorants, Elsevier, etc.

3. General Formula (IV)

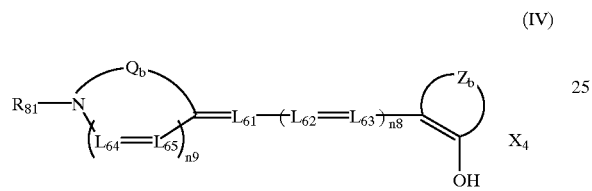

(IV)

In the general formula (IV), $Q_b$ represents an atomic group forming a 5- or 6-membered nitrogen-containing heterocycle; $Z_b$ represents an atomic group forming a 3- to 9-membered ring; and $L_{61}$ to $L_{65}$ independently represent a substituted or unsubstituted methine group. n8 is an integer of 0 to 4, preferably an integer of 0 to 3, and n9 is 0 or 1. $R_{81}$ represents a substituent, and $X_4$ represents a counter ion contained if necessary to neutralize charge of the dye.

The nitrogen-containing heterocycle formed by $Q_b$ may be a condensed ring, and may have a substituent. Preferable examples of the nitrogen-containing heterocycle include a benzothiazole ring, a benzoxazole ring, a benzoselenazole ring, a benzotellurazole ring, a 2-quinoline ring, a 4-quinoline ring, a benzoimidazole ring, a thiazoline ring, an indolenine ring, an oxadiazole ring, a thiazole ring and an imidazole ring. Of these rings, a benzothiazole ring, a benzoxazole ring, a benzoselenazole ring, a 2-quinoline ring, a 4-quinoline ring, a benzoimidazole ring and an indolenine ring are more preferred, a benzoxazole ring, a 2-quinoline ring, a 4-quinoline ring and an indolenine ring are particularly preferred.

Preferable examples of the substituent on $Q_b$ include: a carboxyl group; a phosphonyl group; a sulfonyl group; halogen atoms such as F, Cl, Br and I; a cyano group; an alkoxy group such as a methoxy group, an ethoxy group and a methoxyethoxy group; an aryloxy group such as a phenoxy group; an alkyl group such as a methyl group, an ethyl group, a cyclopropyl group, a cyclohexyl group, a trifluoromethyl group, a methoxyethyl group, an allyl group and a benzyl group; an alkylthio group such as a methylthio group and an ethylthio group; an alkenyl group such as a vinyl group and a 1-propenyl group; an aryl group such as a phenyl group, a chlorophenyl group and tolyl group; a heterocyclic group such as a thienyl group; etc.

$Z_b$ is preferably composed of atoms selected from the group consisting of carbon, oxygen, nitrogen, sulfur and hydrogen atoms.

The ring formed by $Z_b$ is preferably such that it is one having a 4 to 6 carbon skeleton, more preferably represented by any one of the following (a) to (e), the most preferable being represented by (a).

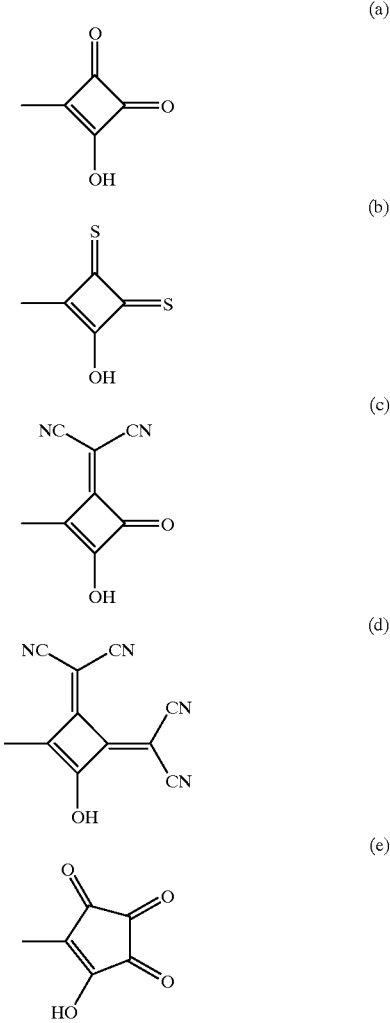

Examples of the substituent on $L_{61}$ to $L_{65}$ include: a substituted or unsubstituted alkyl group preferably having 1 to 12 carbon atoms, more preferably having 1 to 7 carbon atoms, such as a methyl group, an ethyl group, a propyl group, an isopropyl group, a cyclopropyl group, a butyl group, a 2-carboxyethyl group and a benzyl group; a substituted or unsubstituted aryl group preferably having 6, 8 or 10 carbon atoms, more preferably 6 or 8 carbon atoms, such as a phenyl group, a tolyl group and an o-carboxyphenyl group; a heterocyclic group such as a pyridyl group, a thienyl group, a furanyl group and a barbituric acid group; a halogen atom such as a chlorine atom and a bromine atom; an alkoxy group such as a methoxy group and an ethoxy group; an amino group preferably having 1 to 12 carbon atoms, more preferably having 6 to 12 carbon atoms, such as a diphenylamino group, a methylphenylamino group and a 4-acetylpiperazine-1-yl group; an oxo group, etc. The substituents may be bonded together to form a cyclopentene ring, a cyclohexene ring, a squalirium ring, etc. Further, the substituents may combine with an auxochrome to form a ring.

The substituent represented by $R_{81}$ is preferably an aliphatic group that may have a substituent or an aromatic group that may have a substituent. The aliphatic group preferably has 1 to 10 carbon atoms, and more preferably has 1 to 6 carbon atoms. The aromatic group preferably has 1 to 16 carbon atoms, and more preferably has 5 or 6 carbon atoms. Examples of the unsubstituted aliphatic group and aromatic group include a methyl group, an ethyl group, an n-propyl group, an n-butyl group, a phenyl group and a naphthyl group.

Whether the dye is a cation or an anion and whether it has the net ionic charge or not depends on an auxochrome and substituents thereof. The charge of the whole dye molecule is neutralized by a counter ion $X_4$. Typical positive counter ions $X_4$ are inorganic or organic ammonium ions such as a tetraalkyl ammonium ion, a pyridinium ion, etc., and alkali metal ions. On the other hand, negative counter ions may be inorganic or organic, and examples thereof include: a halide ion such as a fluoride ion, a chloride ion, a bromide ion, an iodide ion, etc.; a substituted aryl sulfonate ion such as a p-toluene sulfonate ion, a p-chlorobenzene sulfonate ion, etc.; an aryl disulfonate ion such as a 1,3-benzene disulfonate ion, a 1,5-naphthalene disulfonate ion, a 2,6-naphthalene disulfonate ion, etc.; an alkyl sulfate ion such as a methyl sulfate ion, etc.; a sulfate ion; a nitrate ion; a thiocyanate ion; a perchlorate ion; a tetrafluoroborate ion; a picrate ion; an acetate ion; and a trifluoromethane sulfonate ion.

Further, ionic polymers or other dyes having an opposite charge to the dye may be also used as a charge-balancing counter ion. Alternatively a metal complex such as bisbenzene-1,2-dithiolato nickel (III), etc. can be also used in the present invention.

4. General Formula (V)

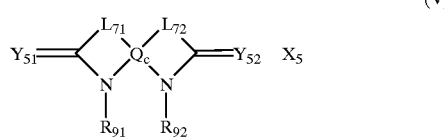

(V)

In the general formula (V), $Q_c$ represents a tetravalent aromatic group; and $L_{71}$ and $L_{72}$, which may be the same or different, independently represent a sulfur atom, a selenium atom or —CR'R"— (R' and R" independently represent a hydrogen atom or an alkyl group, and may be the same or different). $L_{71}$ and $L_{72}$ are preferably a sulfur atom or —CR'R"—, more preferably —CR'R"—. $R_{91}$ and $R_{92}$ independently represent an alkyl group or an aromatic group, and $Y_{51}$ and $Y_{52}$ independently represent a non-metal atomic group necessary to act as a methine dye. $X_5$ represents a counter ion.

Examples of $Q_c$ include tetravalent aromatic groups derived from: aromatic hydrocarbons such as benzene, naphthalene, anthracene and phenanthrene; or aromatic heterocyclic rings such as anthraquinone, carbazole, pyridine, quinoline, thiophene, furan, xanthene and thianthrene. These groups may have a substituent. $Q_c$ is preferably a group derived from an aromatic hydrocarbon, more preferably that derived from benzene or naphthalene.

Various kinds of methine dyes can be formed by $Y_{51}$ and $Y_{52}$, and it is preferable that $Y_{51}$ and $Y_{52}$ form a cyanine dye, a merocyanine dye, a rhodacyanine dye, a trinuclear merocyanine dye, an allopolar dye, a hemicyanine dye or a styryl dye. Herein, the cyanine dyes include those where substituents on the methine chain form a squalium ring or a croconium ring. Details of the dyes are described in: F. M. Harmer, "Heterocyclic Compounds—Cyanine Dyes and Related Compounds", John Wiley & Sons, New York, London, 1964; D. M. Sturmer, "Heterocyclic Compounds—Special Topics in Heterocyclic Chemistry", chapter 18, section 14, pp. 482 to 515, John Wiley & Sons, New York, London, 1977; etc. Preferred examples of the cyanine dyes, the merocyanine dyes and the rhodacyanine dyes used in the present invention include those described in U.S. Pat. No. 5,340,694, chapter (XI), (XII) and (XIII), pp. 21 to 22. The dye represented by the general formula (V) preferably has a squalilium ring on at least one of the methine chains thereof, and more preferably has it on both methine chains.

$R_{91}$ and $R_{92}$ are independently an alkyl group or an aromatic group, and may have a substituent. The aliphatic group preferably has 1 to 10 carbon atoms, and more preferably has 1 to 6 carbon atoms. The aromatic group preferably has 5 to 16 carbon atoms, and more preferably has 5 or 6 carbon atoms. Examples of the unsubstituted aliphatic group and aromatic group include a methyl group, an ethyl group, an n-propyl group, an n-butyl group, a phenyl group and a naphthyl group.

It is preferable that at least one of $R_{91}$, $R_{92}$, $Y_{51}$ and $Y_{52}$ has an acidic group. The acidic group is a group with a dissociative proton such as a carboxylic acid group, a phosphonic acid group, a sulfonic acid group, a boric acid group, etc. Among them, preferred is a carboxylic acid group. The proton on the acidic group may be dissociated.

The specific examples (1) to (43) and S-1 to S-42 of the methine dyes represented by the general formula (II) to (V) will be illustrated below without intention of restricting the scope of the present invention defined by the claims attached hereto.

(1)

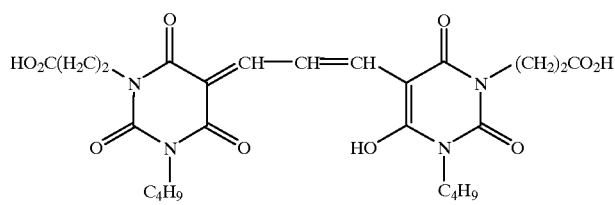

-continued
(2) 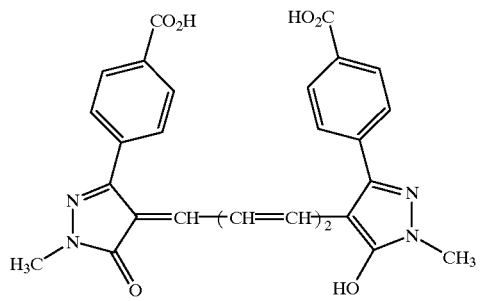
(3) 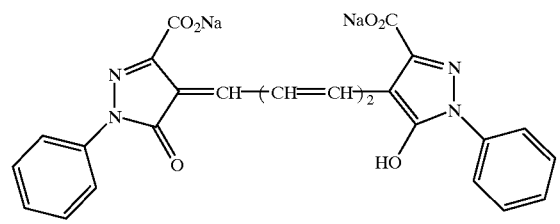
(4) 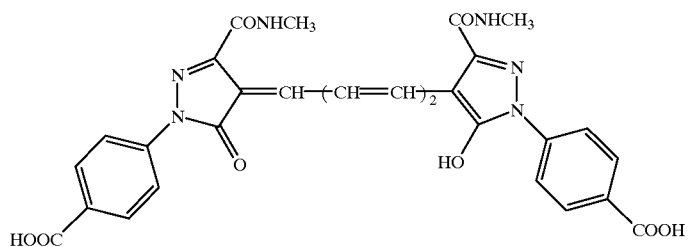
(5) 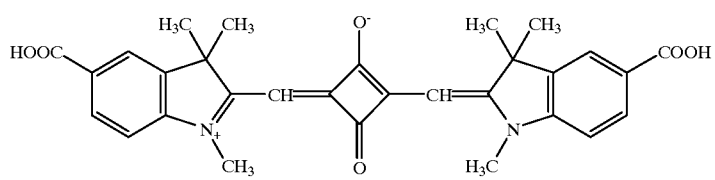
(6) 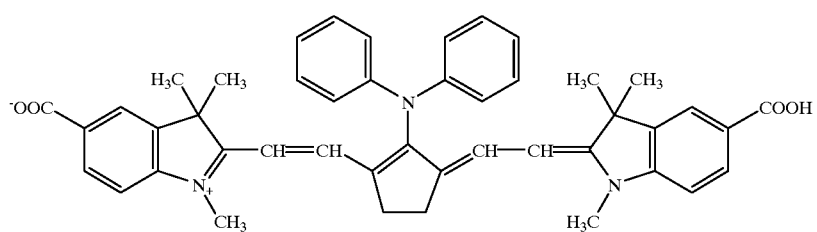
(7) 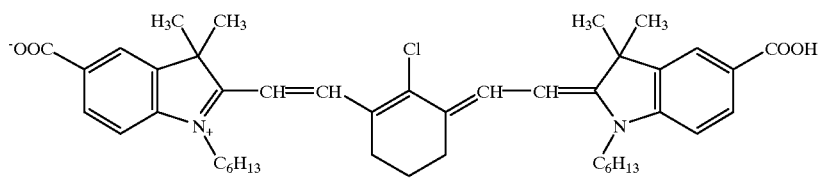
(8) 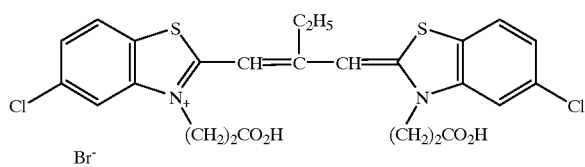

(9) 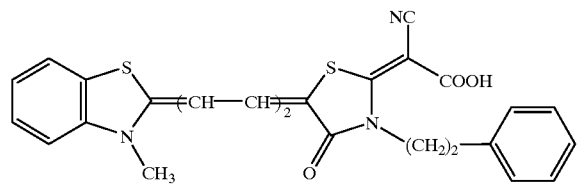
(10) 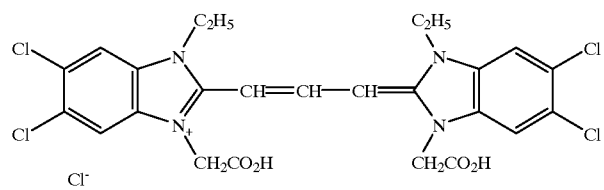
(11) 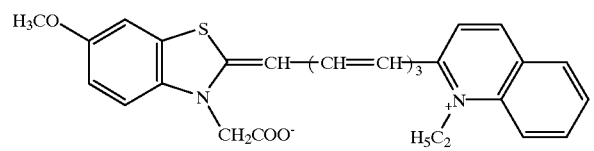
(12) 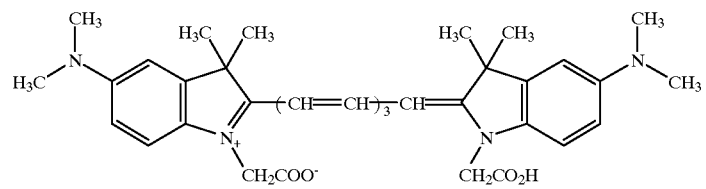
(13) 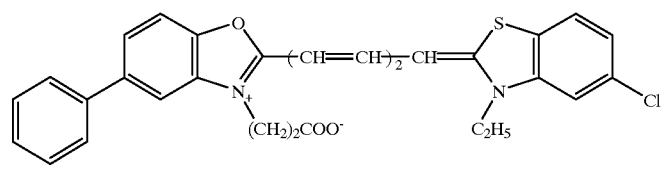
(14) 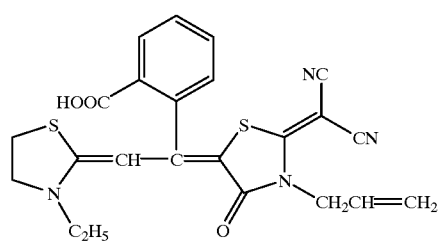
(15) 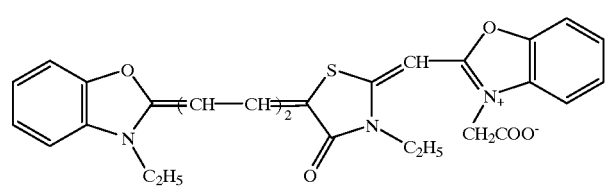

(16) 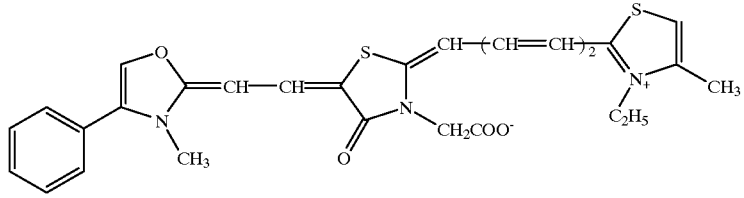
(17) 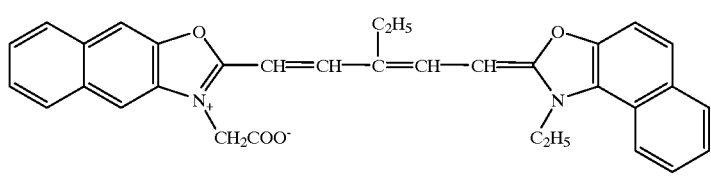
(18) 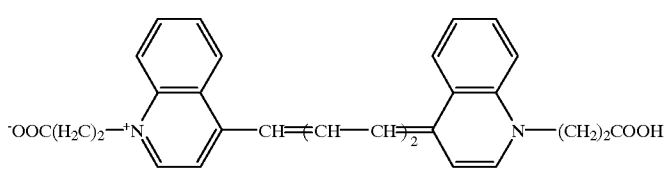
(19) 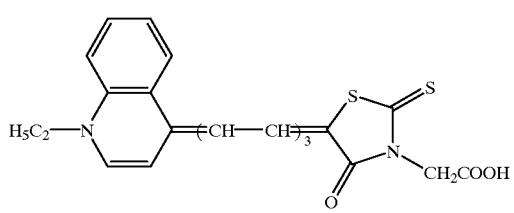
(20) 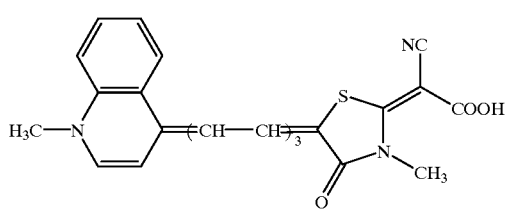
(21) 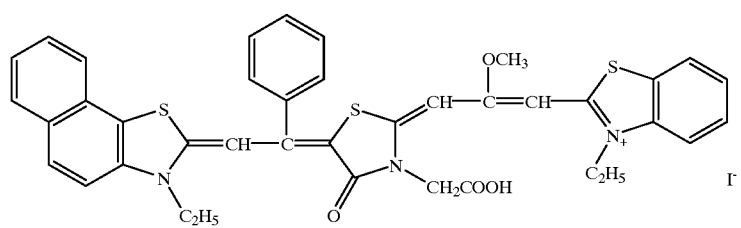
(22) 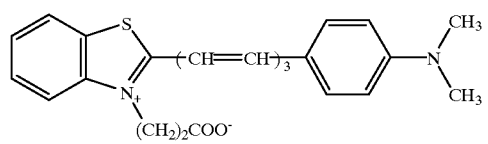

-continued
(23) 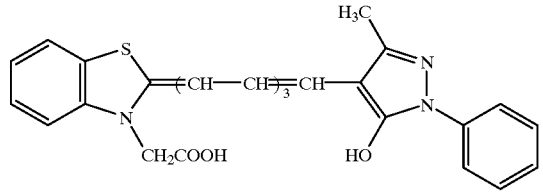
(24) 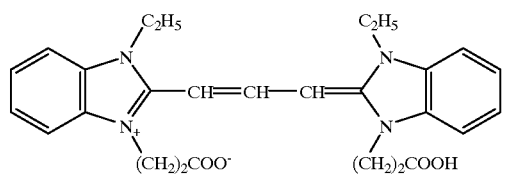
(25) 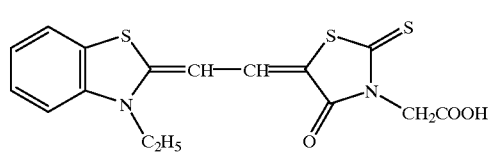
(26) 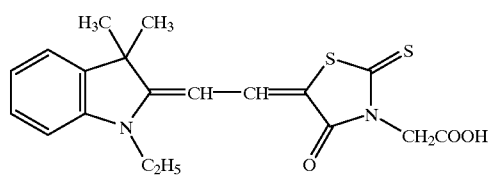
(27) 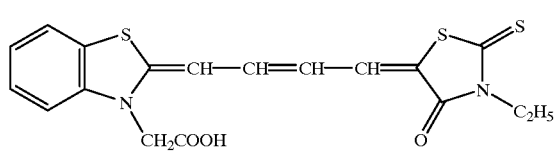
(28) 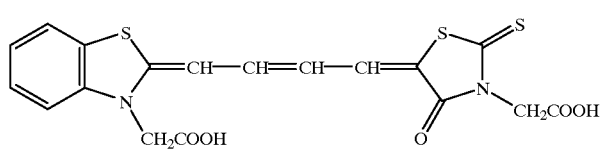
(29) 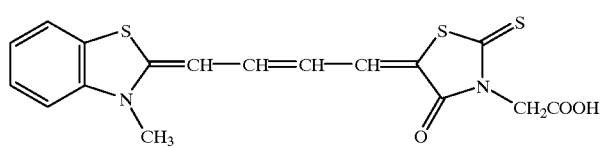
(30) 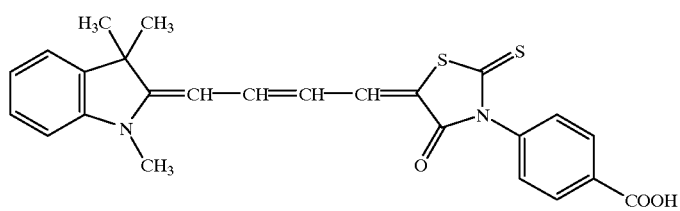
(31) 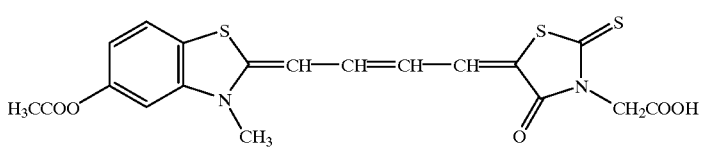

(32) 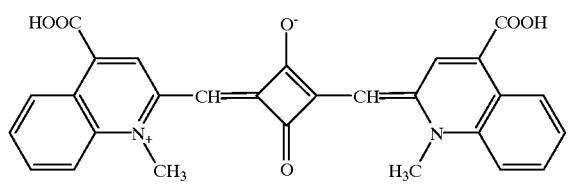
(33) 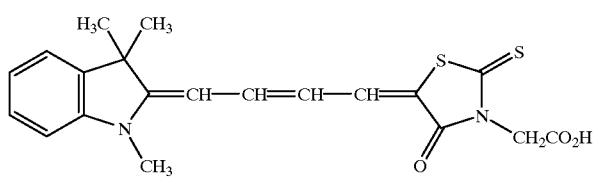
(34) 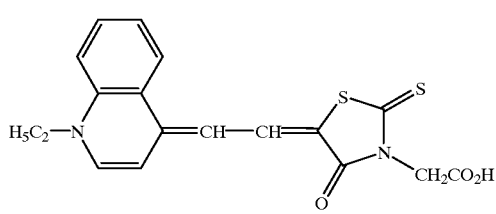
(35) 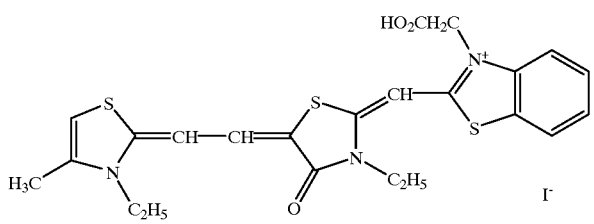
(36) 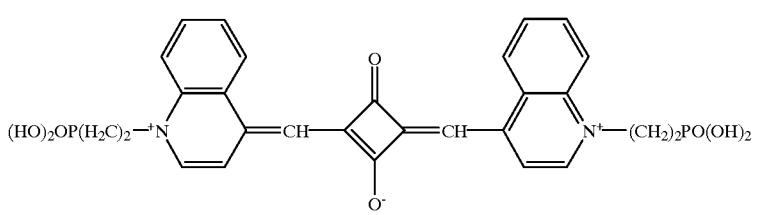
(37) 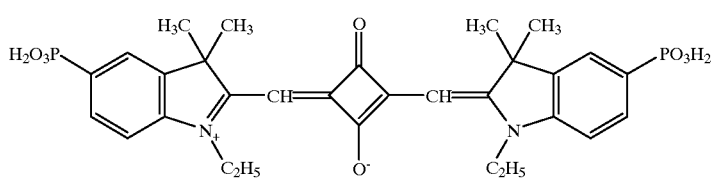
(38) 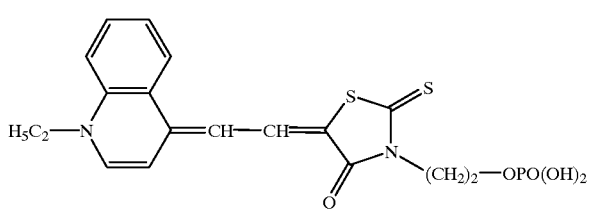

(39) 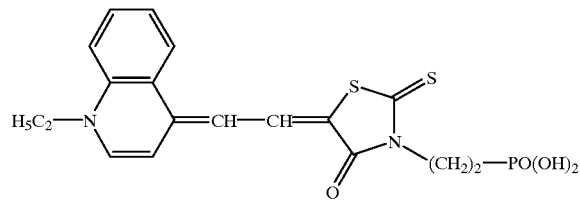
(40) 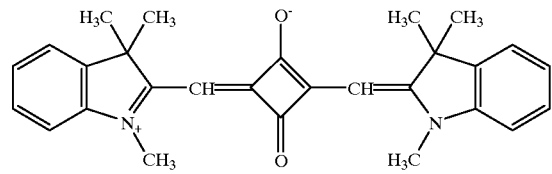
(41) 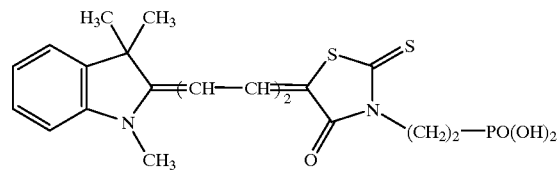
(42) 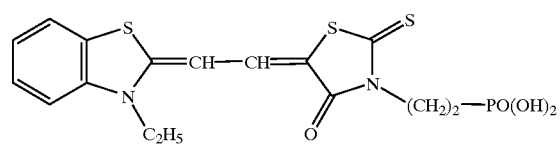
(43) 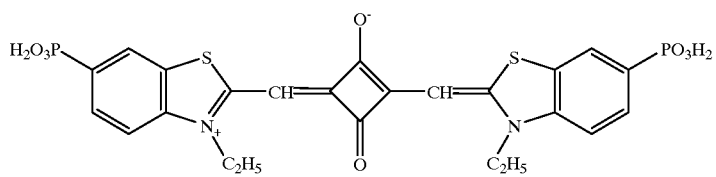
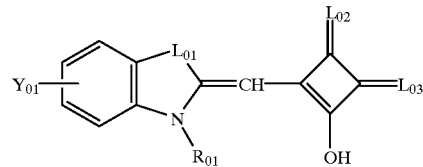
| Dye  | $Y_{01}$  | $R_{01}$       | $L_{01}$   | $L_{02}$   | $L_{03}$   |
|------|-----------|----------------|------------|------------|------------|
| S-1  | 4,5-Benzo | $C_3H_7$       | $C(CH_3)_2$ | O          | O          |
| S-2  | H         | $(CH_2)_3COOH$ | $C(CH_3)_2$ | O          | O          |
| S-3  | 4,5-Benzo | $C_2H_5$       | $C(CH_3)_2$ | S          | S          |
| S-4  | 4,5-Benzo | $C_2H_5$       | $C(CH_3)_2$ | $C(CN)_2$  | O          |
| S-5  | 4,5-Benzo | $C_2H_5$       | $C(CH_3)_2$ | $C(CN)_2$  | $C(CN)_2$  |
| S-6  | H         | $C_2H_5$       | S          | O          | O          |
| S-7  | 4,5-Benzo | $CH_3$         | S          | O          | O          |
| S-8  | H         | $CH_3$         | O          | O          | O          |
| S-9  | H         | $CH_3$         | Se         | O          | O          |
| S-10 | H         | $CH_3$         | $N(C_2H_5)$ | O          | O          |
| S-11 | H         | $C_2H_5$       | —CH=CH—    | O          | O          |

-continued

S-12

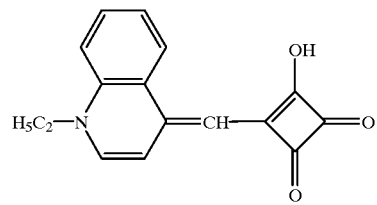

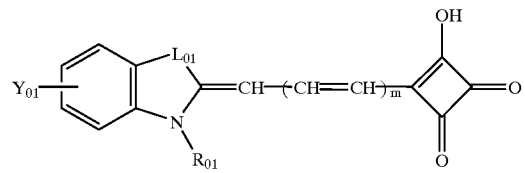

| Dye | $Y_{01}$ | $R_{01}$ | $L_{01}$ | m |
|---|---|---|---|---|
| S-13 | H | $CH_3$ | $C(CH_3)_2$ | 1 |
| S-14 | 4,5-Benzo | $C_2H_5$ | $C(CH_3)_2$ | 1 |
| S-15 | H | $CH_3$ | S | 2 |
| S-16 | 4,5-Benzo | $C_2H_5$ | S | 3 |
| S-17 | 4,5-Benzo | $C_2H_5$ | S | 4 |
| S-18 | H | $CH_3$ | O | 1 |

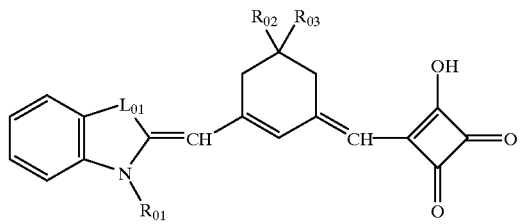

| Dye | $R_{01}$ | $R_{02}$ | $R_{03}$ | $L_{01}$ |
|---|---|---|---|---|
| S-19 | $C_2H_5$ | $CH_3$ | $CH_3$ | $C(CH_3)_2$ |
| S-20 | $C_2H_5$ | $CH_3$ | $CH_3$ | S |
| S-21 | $(CH_2)_3COOH$ | $CH_3$ | $CH_3$ | O |
| S-22 | $C_2H_5$ | Ph | H | O |

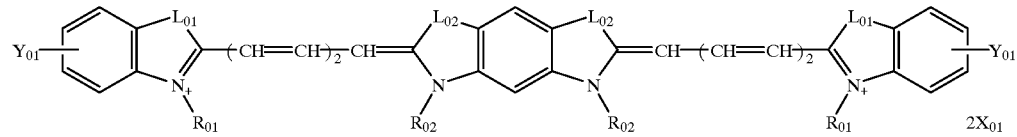

| Dye | $Y_{01}$ | $R_{01}$ | $R_{02}$ | $L_{01}$ | $L_{02}$ | $X_{01}$ |
|---|---|---|---|---|---|---|
| S-23 | H | $CH_3$ | $CH_3$ | S | S | $I^-$ |
| S-24 | 5-COOH | $C_2H_5$ | $CH_3$ | S | S | $I^-$ |
| S-25 | 5-COOH | $CH_3$ | $CH_3$ | $C(CH_3)_2$ | $C(CH_3)_2$ | $I^-$ |
| S-26 | H | $(CH_2)_2COOH$ | $C_2H_5$ | $C(CH_3)_2$ | $C(CH_3)_2$ | $Cl^-$ |
| S-27 | H | $CH_3$ | $C_2H_5$ | $C(CH_3)_2$ | O | $I^-$ |

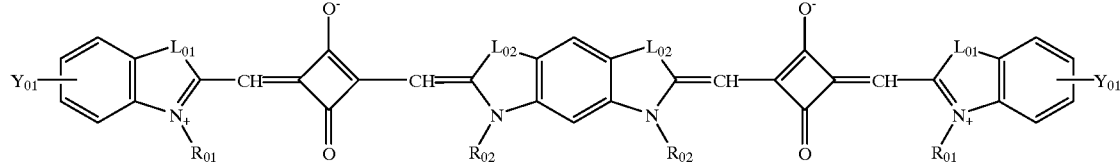

| Dye | $Y_{01}$ | $R_{01}$ | $R_{02}$ | $L_{01}$ | $L_{02}$ |
|---|---|---|---|---|---|
| S-28 | H | $CH_3$ | $CH_3$ | $C(CH_3)_2$ | S |
| S-29 | 4,5-Benzo | $C_3H_7$ | $CH_3$ | $C(CH_3)_2$ | S |
| S-30 | 5-COOH | $CH_3$ | $CH_3$ | S | $C(CH_3)_2$ |
| S-31 | 5-COOH | $CH_3$ | $CH_3$ | $C(CH_3)_2$ | $C(CH_3)_2$ |

-continued
| | S-32 | 5-CH$_3$ | CH$_3$ | C$_2$H$_5$ | N(CH$_3$) | C(CH$_3$)$_2$ |
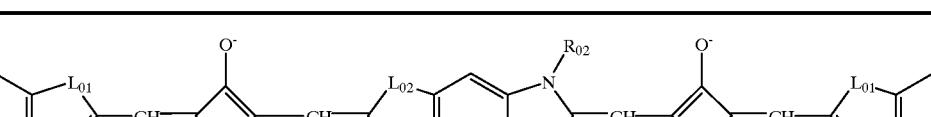
| Dye | Y$_{01}$ | R$_{01}$ | R$_{02}$ | L$_{01}$ | L$_{02}$ |
|---|---|---|---|---|---|
| S-33 | H | CH$_3$ | CH$_3$ | C(CH$_3$)$_2$ | S |
| S-34 | 5-SO$_3$H | C$_2$H$_5$ | CH$_3$ | C(CH$_3$)$_2$ | S |
| S-35 | 5-COOH | CH$_3$ | C$_2$H$_5$ | C(CH$_3$)$_2$ | C(CH$_3$)$_2$ |
| S-36 | 4,5-Benzo | (CH$_2$)$_2$COOH | CH$_3$ | C(CH$_3$)$_2$ | C(CH$_3$)$_2$ |
| S-37 | 5-CH$_3$ | CH$_3$ | C$_2$H$_5$ | NCH$_3$ | C(CH$_3$)$_2$ |
S-38
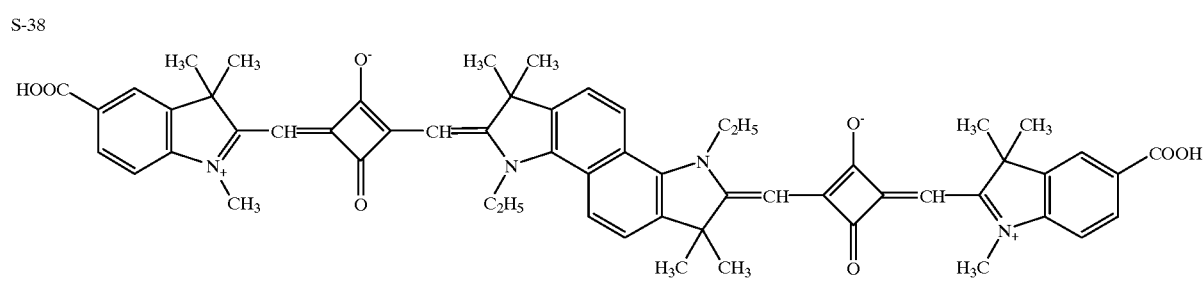
S-39
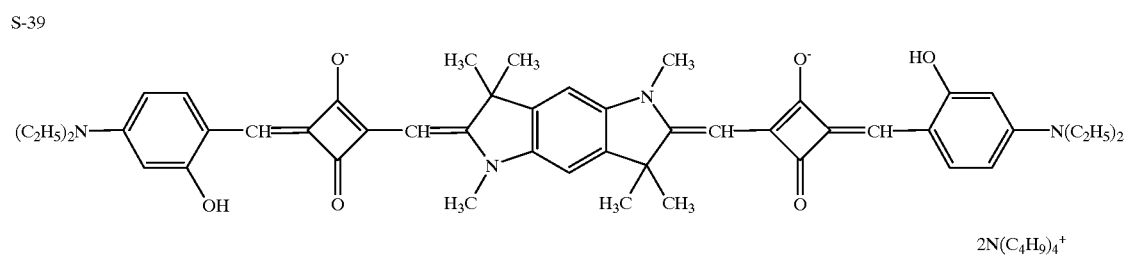
S-40
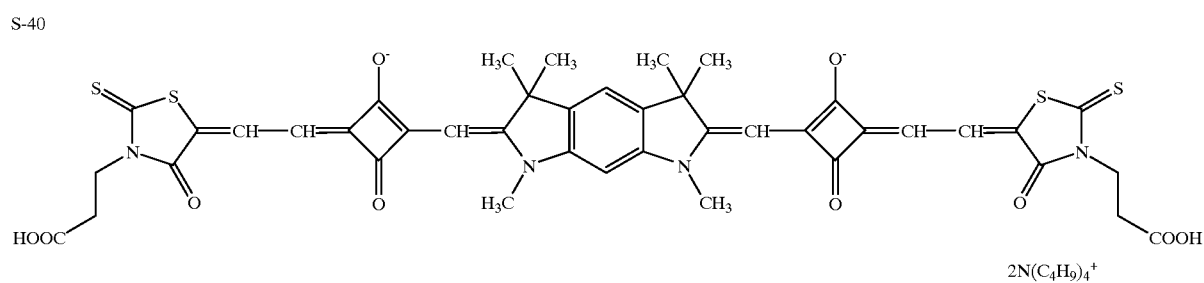
S-41
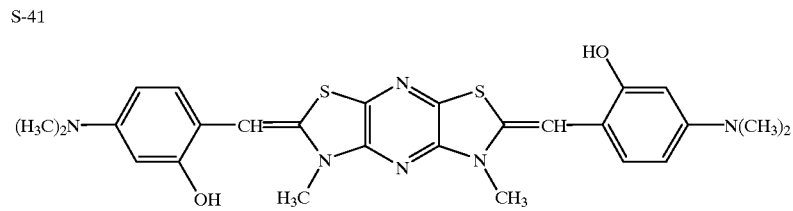
S-42

-continued

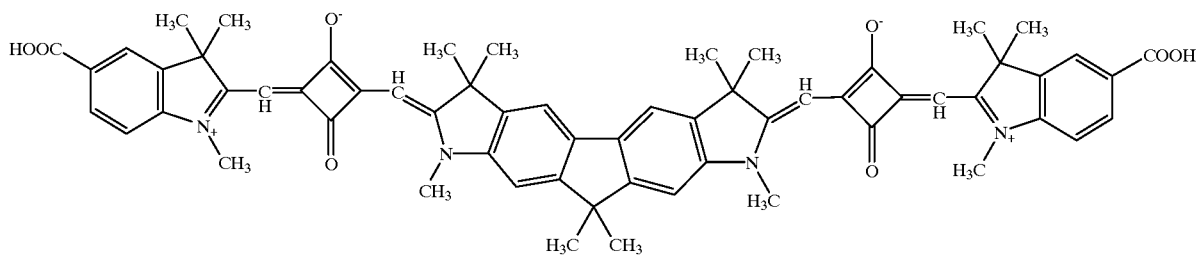

The compounds represented by the formula (II) or (III) may be synthesized by the methods described in: F. M. Harmer, "Heterocyclic Compounds—Cyanine Dyes and Related Compounds", John Wiley & Sons, New York, London, 1964; D. M. Sturmer, "Heterocyclic Compounds—Special Topics in Heterocyclic Chemistry", chapter 18, section 14, pp. 482 to 515, John Wiley & Sons, New York, London, 1977; "Rodd's Chemistry of Carbon Compounds", 2nd. Ed., vol. IV, part B, chapter 15, pp. 369 to 422, Elsevier Science Publishing Company Inc., New York, 1977; British Patent No. 1,077,611; etc.

The dyes represented by the formula (IV) may be synthesized based on the methods described in Dyes and Pigments, vol. 21, pp. 227 to 234, etc. The dyes represented by the formula (V) may be synthesized based on: Ukrainskii Khimicheskii Zhurnal, vol. 40, No. 3, pp. 253 to 258; Dyes and Pigments, vol. 21, pp. 227 to 234; and references therein.

(4) Adsorption of Dye onto Semiconductor Fine Particles

The dye may be adsorbed onto the semiconductor fine particles by soaking the conductive support having thereon the well-dried semiconductor fine particle layer in a solution of the dye, or by coating a solution of the dye onto the semiconductor fine particle layer. In the former case, a soaking method, a dipping method, a roller method, an air-knife method, etc., may be used. In the soaking method, the dye may be adsorbed at a room temperature or while refluxing as described in Japanese Patent Laid-Open No. 7-249790. As a coating method of the latter, a wire-bar method, a slide-hopper method, an extrusion method, a curtain method, a spin method, a spray method, etc., may be used. Further, as a printing method, a relief printing, an offset printing, a gravure printing, a screen-printing, etc., may be used.

A solvent therefor may be properly selected in accordance with the solubility of the dye. Examples of the solvent include: alcohols such as methanol, ethanol, t-butanol, benzyl alcohol, etc.; nitrites such as acetonitrile, propionitrile, 3-methoxypropionitrile, etc.; nitromethane; halogenated hydrocarbons such as dichloromethane, dichloroethane, chloroform, chlorobenzene, etc.; ethers such as diethylether, tetrahydrofuran, etc.; dimethylsulfoxide; amides such as N,N-dimethylformamide, N,N-dimethylacetamide, etc.; N-methylpyrrolidone; 1,3-dimethylimidazolidinone; 3-methyloxazolidinone; esters such as ethyl acetate, butyl acetate, etc.; carbonates such as diethyl carbonate, ethylene carbonate, propylene carbonate, etc.; ketones such as acetone, 2-butanone, cyclohexanone, etc.; hydrocarbons such as hexane, petroleum ether, benzene, toluene, etc.; water; and mixture thereof.

Similar to the case of forming the semiconductor fine particle layer, for a high viscosity solution (e.g., 0.01 to 500 Poise), an extrusion method, and various kinds of printing methods are suitable, and for a low viscosity solution (e.g., 0.1 Poise or less), a slide-hopper method, a wire bar method and a spin method are suitable. A uniform film can be made by any of them.

Thus, an adsorption method of the dye may be properly selected in accordance with the viscosity of the coating solution of the dye, the coating amount, the conductive support, the coating speed, etc. It is preferable that the time required to adsorb the dye after coating is as short as possible from a viewpoint of mass production.

Because the unadsorbed dye causes disturbance of efficiency of the device, it is preferable that it be removed by washing immediately after adsorption. The washing is preferably carried out using a wet-type washing bath with a polar solvent such as acetonitrile, or an organic solvent such as an alcohol-based solvent. To enhance the adsorption amount of the dye, it is preferable to carry out a heat treatment before adsorption. After the heat treatment, it is preferable that the dye is quickly adsorbed at 40 to 80° C. without cooling to a room temperature in order to prevent adsorption of water onto the surface of the semiconductor fine particles.

The total amount of the dye is preferably 0.01 to 100 mmol per the unit surface area (1 m$^2$) of the conductive support. Further, the amount of the dye to be adsorbed onto the semiconductor fine particles is preferably 0.01 to 1 mmol per g of the semiconductor fine particles. Such an adsorption amount of the dye effects a sufficient sensitization to the semiconductors. In contrast, if the amount of the dye is too small, the sensitization effect is not enough. On the other hand, if excessive, the dye unadsorbed onto the semiconductor fine particles floats, thereby reducing sensitization effect.

With regard to the photoelectric conversion device of the present invention, two or more kinds of dyes may be mixed and used therein to extend the wave range of the photoelectric conversion and to increase a conversion efficiency. In this case, the dyes and their proportion are preferably selected in accordance with the wavelength region and the intensity distribution of a light source.

A colorless compound may be co-adsorbed on the semiconductor fine particles together with the dye to weaken an interaction between the dyes, such as association. Examples of the hydrophobic compounds for the co-adsorption include steroid compounds having a carboxyl group such as chenodeoxycholic acid, etc. Further, an TV-absorbing agent may be used together therewith.

The surface of the semiconductor fine particles may be treated with amines after adsorbing the dye to accelerate to remove an excessive dye. Preferable examples of the amines include pyridine, 4-t-butylpyridine, polyvinylpyridine, etc. The amine may be used as it is, or as a solution with an organic solvent when it is liquid.

(C) Charge-Transporting Layer

The charge-transporting layer replenishes electrons to the oxidized dye. The charge-transporting layer comprises the electrolyte composition of the present invention mentioned above. Further, a solid electrolyte and a hole-transporting material may be also used therefor.

The charge-transporting layer is preferably formed by: coating the solution of the electrolyte composition on a photosensitive layer by a casting method, a coating method, a soaking method, a loading method, etc.; and cross-linking the electrolyte composition by heating, if necessary.

In the case of the coating method, the charge-transporting layer may be formed by: adding additives such as a coating quality-improving agent (a leveling agent, etc.) to the solution of the electrolyte composition comprising the molten salt, etc.; coating the solution by a spin coating method, a dip coating method, an air-knife coating method, a curtain coating method, a roller coating method, a wire-bar coating method, a gravure coating method, an extrusion coating method using a hopper described in U.S. Pat. No. 2,681,294, a simultaneous multi-layer coating method described in U.S. Pat. Nos. 2,761,418, 3,508,947 and 2,761,791; and heating if necessary.

The heating temperature is properly selected in accordance with a heat-resistance of the dye, etc. The temperature is preferably 10 to 150° C., more preferably 10 to 100° C., in general. The heating time, which depends on the heating temperature, etc., may be approximately 5 minutes to 72 hours. According to the preferable embodiment of the present invention, the solution of the electrolyte composition is coated in an excess of the amount with which voids in the photosensitive layer are completely filled. Therefore, the resulting electrolyte layer substantially exists from the surface of the electrically conductive layer 10 on the conductive support to the surface of the counter electrically conductive layer 40, as shown in FIG. 1. Herein, if this electrolyte layer is defined as the charge-transporting layer 30, the thickness of the charge-transporting layer 30 is preferably 0.001 to 200 $\mu$m, more preferably 0.1 to 100 $\mu$m, particularly preferably 0.1 to 50 $\mu$m. When the charge-transporting layer 30 has a thickness of less than 0.001 $\mu$m, there is a fear that the semiconductor fine particles 21 in the photosensitive layer come in contact with the counter electrically conductive layer 40. On the other hand, when the thickness is more than 200 $\mu$m, the charge transfer distance becomes too large, thereby increasing the resistance of the device. Incidentally, the total thickness of the photosensitive layer 20 and the charge-transporting layer 30, which is substantially equal to the thickness of the electrolyte composition layer, is preferably 0.1 to 300 $\mu$m, more preferably 1 to 130 $\mu$m, particularly preferably 2 to 75 $\mu$m.

Iodine, etc. added into the electrolyte composition to form an oxidation-reduction pair may be introduced thereinto by: adding it to the above-mentioned solution of the electrolyte composition; or placing the support with the charge-transporting layer disposed thereon in a sealed vessel with iodine, etc., thereby diffusing them into the electrolyte; etc. Further, iodine may be introduced into the charge-transporting layer by coating or vapor-depositing it on the counter electrode before constituting the photoelectric conversion device.

The water-content of the charge-transporting layer is preferably 10,000 ppm or less, more preferably 2,000 ppm or less, and particularly preferably 100 ppm or less.

(D) Counter Electrode

When the photoelectric conversion device of the present invention is applied to a photoelectric cell, the counter electrode acts as an anode of the cell. The counter electrode may be a single layer structure of a counter conductive layer comprising an electrically conductive material, or composed of the counter electrically conductive layer and a support, similarly to the above-described conductive support. Examples of the material for the counter electrically conductive layer include: metals such as platinum, gold, silver, copper, aluminum, rhodium and indium; carbon; electrically conductive metal oxides such as indium-tin composite oxides and fluorine-doped tin oxides; etc. The substrate for the counter electrode is preferably made of glass or plastic, and the electrically conductive layer is coated or vapor-deposited thereon. The thickness of the counter electrically conductive layer is not limited in particular, and is preferably 3 nm to 10 $\mu$m. In the case of the metal counter electrically conductive layer, the thickness thereof is preferably 5 $\mu$m or less, more preferably 5 nm to 3 $\mu$m.

Because any one or both of the conductive support and the counter electrode may be irradiated, at least one of them may be substantially transparent to have light reach the photosensitive layer. From a viewpoint of improving an electric generation efficiency, the conductive support is preferably transparent, and light is irradiated from the side thereof. In this case, the counter electrode preferably has a light-reflective property. Such a counter electrode may be made of glass or plastic having vapor-deposited metal or electrically conductive oxides thereon, or a metal thin film.

The counter electrode may be (i) applied on the charge-transporting layer formed beforehand, or (ii) placed on the semiconductor fine particle layer through a spacer before forming the charge-transporting layer. In the case (i), the electrically conductive material for the conductive layer may be coated, metal-plated, or vapor-deposited (PVD, CVD, etc.) directly on the charge-transporting layer, or the electrically conductive layer composing the counter electrode may be laminated on the charge-transporting layer. In the case (ii), the counter electrode may be settled on the semiconductor fine particle layer through the spacer, and the open ends therebetween are soaked in the solution of the electrolyte composition. The solution penetrates into the voids between the counter electrode and the semiconductor fine particle layer, utilizing capillarity or reduced pressure. Similar to the case of the conductive support, it is preferable to use the metal lead for reducing resistance of the electrode particularly in the case where the counter electrode is transparent. Preferable materials of the metal lead, preferable methods for setting the metal lead, preferable reduced-degree of the incident light amount caused by the metal lead, etc. are the same as the case of the conductive support, mentioned above.

(E) Other Layers

Functional layers such as a protective layer and a reflection-preventing layer may be disposed on one of or both of the conductive support and the counter electrode each acting as the electrode. In the case where such functional layers are formed in a fashion of multi-layers, they may be formed by a simultaneous multi-layer coating method or a successive coating method. The simultaneous multi-layer coating method is preferred from a viewpoint of productivity. A slide-hopper method and an extrusion method are suitable from the viewpoint of both productivity and homogeneity of a coated film for the simultaneous multi-layer coating method. The functional layers may be formed by a vapor-deposition method and a sticking method, and these methods may be selected in accordance with the materials for the layer.

An undercoating layer may be disposed between the conductive support and the photosensitive layer to prevent short-circuit of the device. The undercoating layer is preferably composed of a semiconductor thin film. Preferable materials thereof include $TiO_2$, $SnO_2$, $Fe_2O_3$, $WO_3$, ZnO and $Nb_2O_5$. Among them, $TiO_2$ is more preferred. The undercoating layer may be disposed by a spray-pyrolysis method described in Electrochim. Acta, 40, 643 to 652 (1995). The thickness of the undercoating layer is preferably 5 to 1000 nm, more preferably 10 to 500 nm.

(F) Interior Structure of Photoelectric Conversion Device

As described above, the photoelectric conversion device may have various interior structures in accordance with its end use. These structures are classified into two major forms composed of a structure allowing incidence of light from both faces, and a structure allowing it from only one face. FIGS. 2 to 8 illustrate examples of the interior structure of the photoelectric conversion device that can be preferably used in the present invention.

Figure 2:
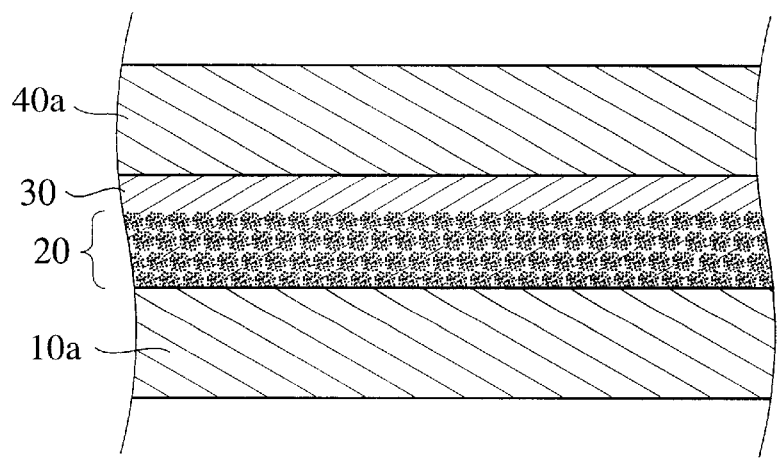
FIG. 2 is a partial cross sectional view showing a preferable structure of a photoelectric conversion device of the present invention.

FIG. 2 illustrates a preferable structure of a photoelectric conversion device of the present invention, where a photosensitive layer 20 and a charge-transporting layer 30 are disposed between a transparent electrically conductive layer 10a and a transparent counter electrically conductive layer 40a. This structure allows incidence of a light from both faces of the photoelectric conversion device.

Figure 3:
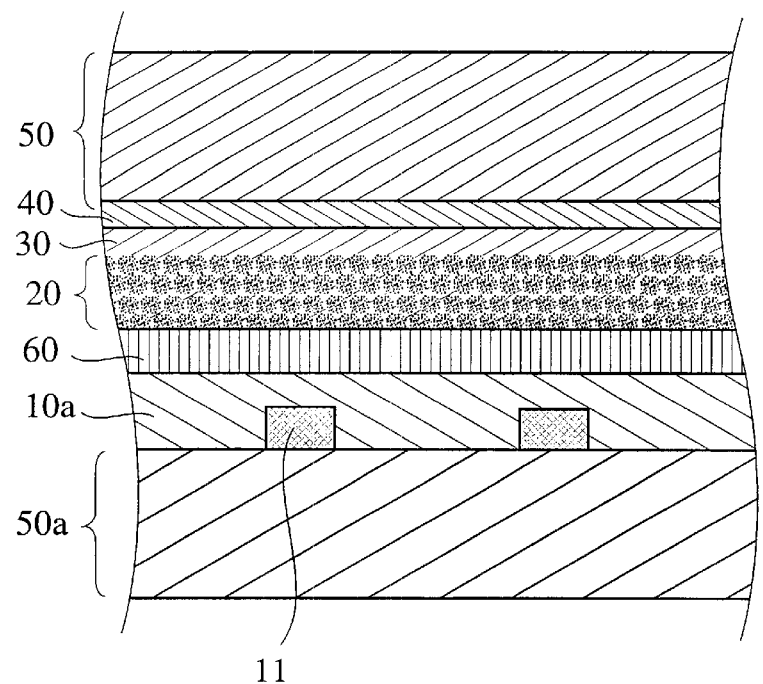
FIG. 3 is a partial cross sectional view showing a preferable structure of a photoelectric conversion device of the present invention.

FIG. 3 illustrates a preferable structure of a photoelectric conversion device of the present invention, where on a transparent substrate 50a partially having a metal lead 11 is disposed a transparent electrically conductive layer 10a, and an undercoating layer 60, a photosensitive layer 20, a charge-transporting layer 30 and a counter electrically conductive layer 40 are laminated thereon in this order, and a substrate 50 is further placed thereon. This structure allows incidence of light from the electrically conductive layer side.

Figure 4:
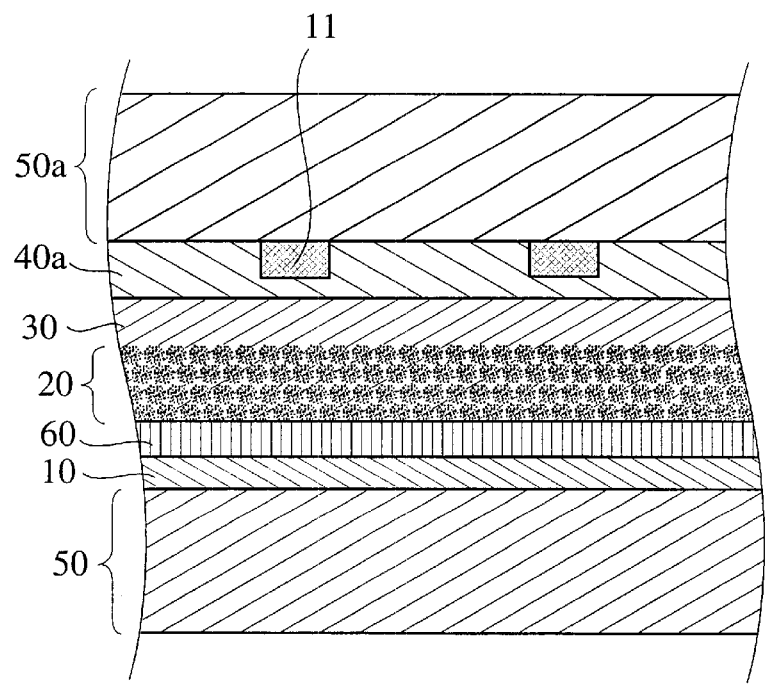
FIG. 4 is a partial cross sectional view showing a preferable structure of a photoelectric conversion device of the present invention.

FIG. 4 illustrates a preferable structure of a photoelectric conversion device of the present invention, where a photosensitive layer 20 is applied on a substrate 50 having an electrically conductive layer 10 thereon through an undercoating layer 60, and a charge-transporting layer 30 and a transparent counter electrically conductive layer 40a are disposed thereon, and further a transparent substrate 50a locally having a metal lead 11 thereon is placed so that the metal lead 11 side orients inward. This structure allows incidence of light from the counter electrode side.

Figure 5:
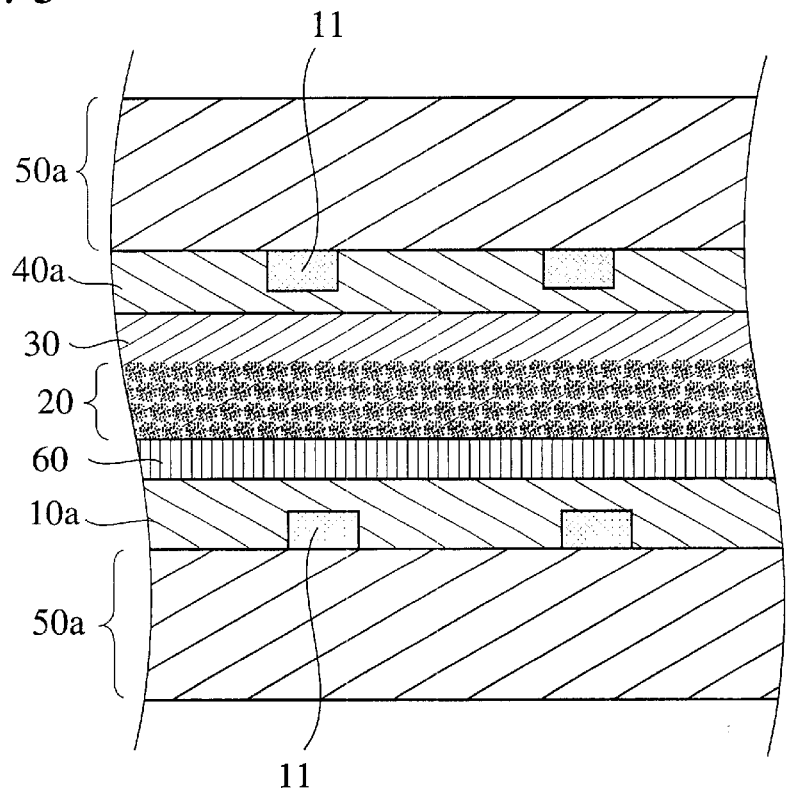
FIG. 5 is a partial cross sectional view showing a preferable structure of a photoelectric conversion device of the present invention.

FIG. 5 illustrates a preferable structure of a photoelectric conversion device of the present invention, where on two transparent substrates 50a each having a metal lead 11 partially are formed a transparent electrically conductive layer 10a or a transparent counter electrically conductive layer 40a, respectively, and an undercoating layer 60, a photosensitive layer 20 and a charge-transporting layer 30 are placed between the conductive layers. This structure allows incidence of light from both faces of the photoelectric conversion device.

Figure 6:
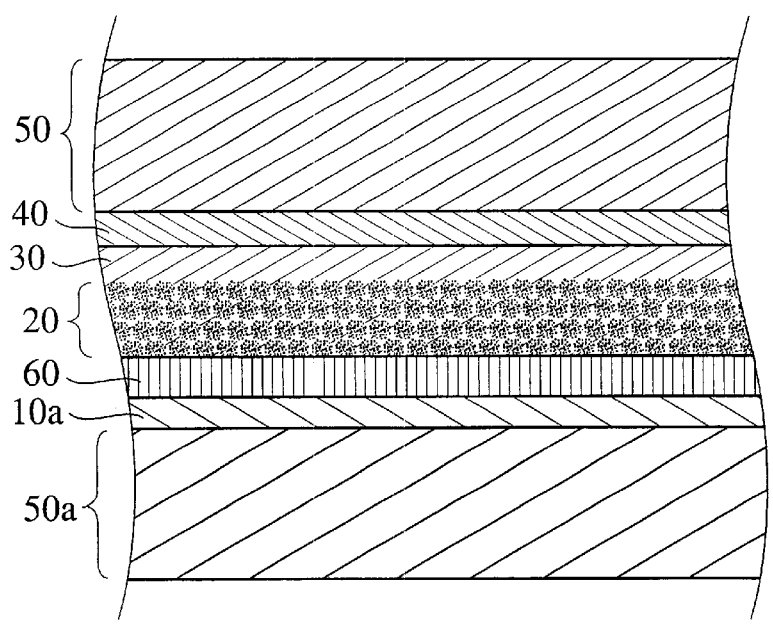
FIG. 6 is a partial cross sectional view showing a preferable structure of a photoelectric conversion device of the present invention.

FIG. 6 illustrates a preferable structure of a photoelectric conversion device of the present invention, where on a transparent substrate 50a having a transparent electrically conductive layer 10a thereon is formed a photosensitive layer 20 through an undercoating layer 60, and a charge-transporting layer 30 and a counter electrically conductive layer 40 are applied thereon, and further a substrate 50 is placed thereon. This structure allows incidence of light from the electrically conductive layer side.

Figure 7:
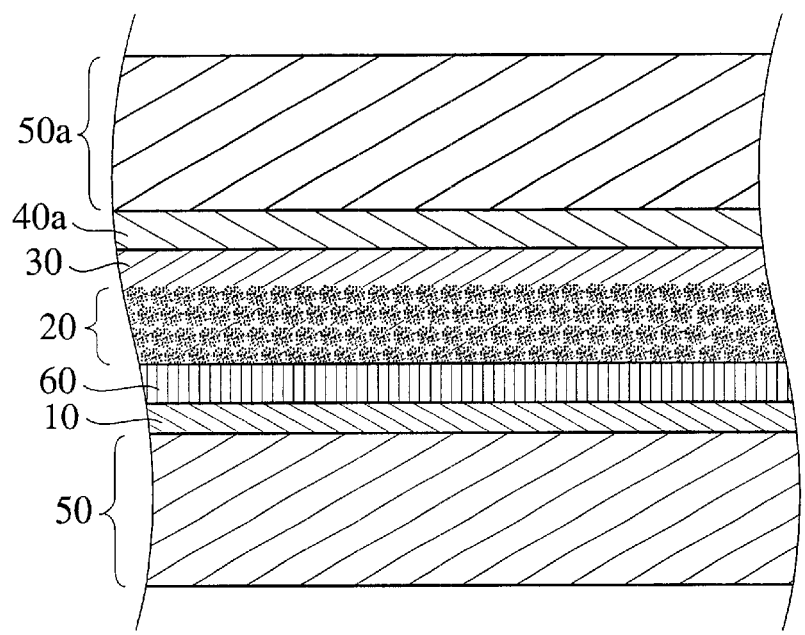
FIG. 7 is a partial cross sectional view showing a preferable structure of a photoelectric conversion device of the present invention.

FIG. 7 illustrates a preferable structure of a photoelectric conversion device of the present invention, where on a substrate 50 having an electrically conductive layer 10 thereon is applied a photosensitive layer 20 through an undercoating layer 60, and a charge-transporting layer 30 and a transparent counter electrically conductive layer 40a are applied thereon, and further a transparent substrate 50a is placed thereon. This structure allows incidence of light from the counter electrode side.

Figure 8:
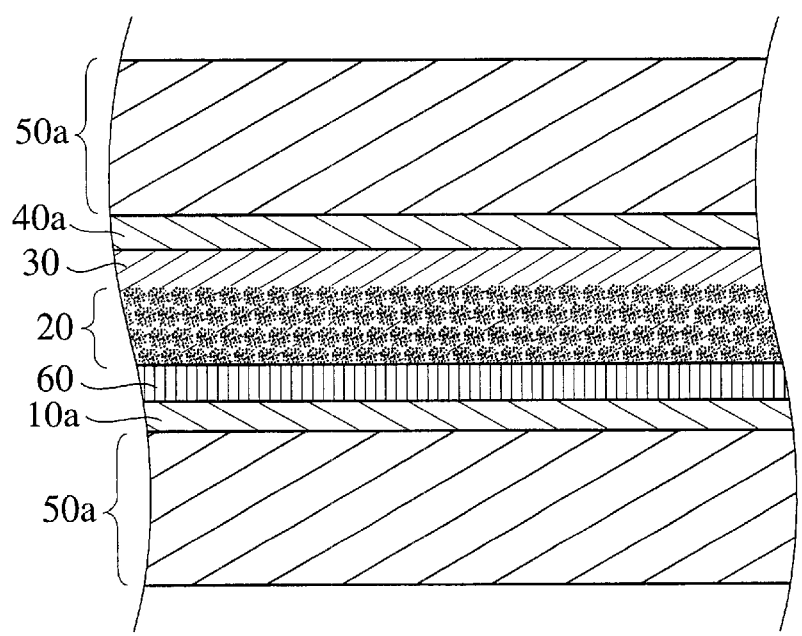
FIG. 8 is a partial cross sectional view showing a preferable structure of a photoelectric conversion device of the present invention.

FIG. 8 illustrates a preferable structure of a photoelectric conversion device of the present invention, where on a transparent substrate 50a having a transparent electrically conductive layer 10a thereon is applied a photosensitive layer 20 through an undercoating layer 60, and a charge-transporting layer 30 and a transparent counter electrically conductive layer 40a are disposed thereon, and further a transparent substrate 50a is placed thereon. This structure allows incidence of light from both faces of the photoelectric conversion device.

[3] Photo-Electrochemical Cell

The photo-electrochemical cell of the present invention comprises the above-described photoelectric conversion device designed to work in the outer circuit. The side face of the photo-electrochemical cell is preferably sealed with a polymer or an adhesive agent, etc. to prevent deterioration of the compositions thereof and volatility of the content in the cell. The outer circuit is connected to the conductive support and the counter electrode via a lead. Various known circuits may be used in the present invention.

[4] Dye-Sensitized Solar Cell

In the case where the photoelectric conversion device of the present invention is applied to a so-called solar cell, the interior structure of the cell thereof may be essentially the same as the photoelectric conversion device mentioned above. Module structures of the solar cell comprising the photoelectric conversion device of the present invention will be explained below.

The dye-sensitized solar cell of the present invention may have essentially the same module structure as that of prior art solar cells. The solar cell module generally has a structure where a cell or cells is/are formed on a substrate made of metal, ceramic, etc., and it or they are covered with a packing resin, a protective glass, etc., and light is introduced from an opposite side of the substrate. In addition, the solar cell module may have a structure where cell(s) is formed on a substrate made of a transparent material such as a tempered glass, and light is introduced from the transparent substrate side. Specifically known as a module structure are structures that are called "super straight type", "substrate type" or "potting type", substrate-integrated type structure used for an amorphous silicon solar cell, etc. The dye-sensitized solar cell of the present invention may have a module structure properly selected from the above structures in accordance with ends, places and environments of use.

The super straight type modules and the substrate type modules generally have a structure where cells are set at a regular intervals between substrates, adjoining cells are connected by a metal lead, a flexible wirering, etc., and collector electrodes are set at the outer marginal portion so that a generated electric power can be delivered to the outside. One or both sides of the substrates is transparent and subjected to a reflection-preventing treatment. Various kinds of plastic material such as ethylene vinyl acetate (EVA) may be contained between the substrate and the cell to protect the cell or to improve a collector efficiency. Such a plastic material may be used in a form of a film or a packing resin. In the case of the solar cell used at a place where the surface of the cell is not necessarily covered with a hard material, such as a place without a shock from the outside, the substrate of one side can be omitted by forming a surface protective layer composed of a transparent plastic film, or by hardening the above-described packing resin to give a protection function. To seal the interior of the cell and to secure rigidity of a module, the periphery of the substrates may be sandwiched and fixed by metallic frames, and the substrates and the frames may be sealed with a sealant. Further, flexible materials may be used for the cell proper, the substrate, the packing agent and the sealant to construct the solar cell on a curved surface.

The super straight type solar cell module may be manufactured by the following steps of: placing cells on a front substrate sent out from a substrate-supplying device together with lead lines for connecting a sealant to the cells and a sealant for a back surface while carrying the front substrate by a belt conveyer, etc.; placing a back substrate or a back cover thereon; and setting frames at the outer edge portion.

The substrate type solar cell may be manufactured by the following steps of: placing cells on a substrate sent out from a substrate-supplying device together with lead lines for connecting the cells and a sealant, etc., while carrying the substrate by a belt conveyer, etc.; placing a front cover thereon; and setting frames at the outer edge portion.

Figure 9:
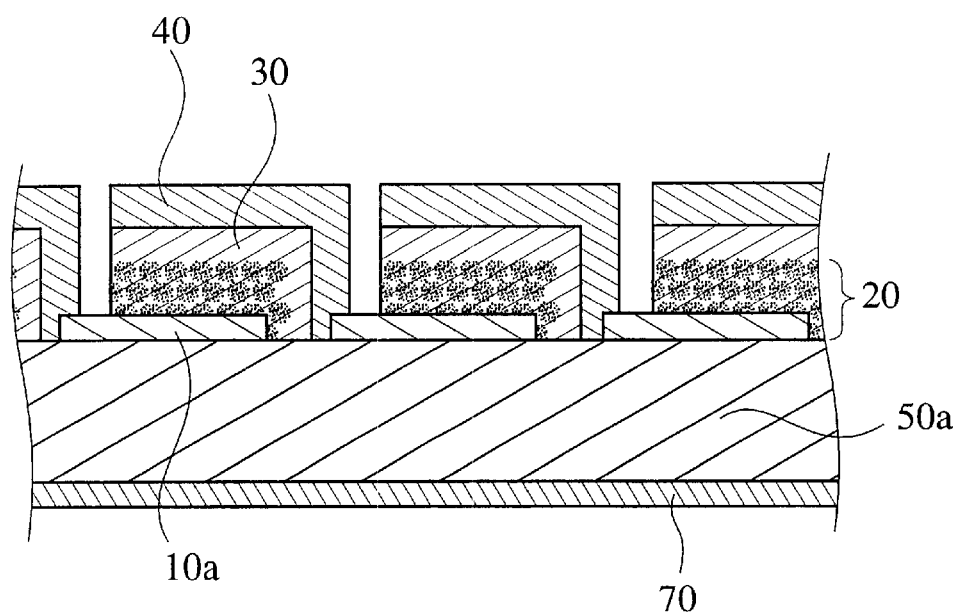
FIG. 9 is a partial cross sectional view showing an example of a structure of a substrate-integrated type solar cell module comprising a photoelectric conversion device of the present invention.

FIG. 9 shows the structure of an embodiment of the substrate-integrated type solar cell produced by modularizing a photoelectric conversion device of the present invention. The solar cell shown in FIG. 9 has a structure where cells having a transparent electrically conductive layer 10a, a photosensitive layer 20 containing dye-adsorbed $TiO_2$, a charge-transporting layer 30 and a metal counter electrically conductive layer 40 are modularized on one surface of a transparent substrate 50a, and a reflection-preventing layer 70 is applied on the other surface of the substrate. In such a structure, it is preferable to increase an area ratio of the photosensitive layer 20 observed from the substrate 50a side for enhancing an efficiency of utilizing incident light.

As for the solar cell shown in FIG. 9, a desired module structure can be obtained by patterning according to a semiconductor process technique such as selective metal plating, selective etching, CVD, PVD, etc., or a mechanical method such as laser scribing, plasma CVM, polishing, etc., so that the transparent electrically conductive layers, the photosensitive layers, the charge transfer layers and the counter electrode etc. are three-dimensionally arranged at a regular interval on the substrate. The plasma CVM is described in Solar Energy Materials and Solar Cells, 48, p 373 to 381, etc.

Other materials and processes used in the cell of the present invention will be described in detail below.

As a material for the sealant, various materials such as a liquid EVA (ethylene vinyl acetate), an EVA film, a mixture of fluorinated vinylidene copolymer and an acrylic resin, etc. may be used in accordance with objects such as obtaining weather-resistance or electric insulation, improvement in light-condensing efficiency, protection of a cell (improvement in impact resistance), etc. The outer edge of the module and the frame surrounding the fringe are preferably sealed with the sealant having high weather-resistance and moisture permeability. The strength and light transmittance of the sealed cell can be enhanced by adding a transparent filler into the sealant.

When the sealant is fixed on the cell, a method suited to a property of the sealant is preferably used. Various methods therefor may be used such as roll pressurization followed by thermal adherence, vacuum pressurization followed by thermal adherence, etc. for the film sealant, and roll coat, bar coat, spray coat, screen printing, etc. for the liquid or paste sealant.

It is preferable that a flexible material such as PET and PEN is used for a substrate, because after constructing the cells on a roll-like support, the sealing layer can be successively laminated according to the above-described methods to obtain a high productivity.

To increase a production efficiency of electric power, the light-taking surface of the substrate, generally a tempered glass substrate, of the module may be subjected to a reflection-preventing treatment. The reflection-preventing treatment may comprise laminating a reflection-preventing film, coating a reflection-preventing layer, etc.

The surface of the solar cell may be grooved or textured, thereby enhancing efficiency of utilizing incident light.

To increase a production efficiency of electric power, it is most important to taking light in the module without a loss, and it is also important to reflect light which reaches to the inside of the solar cell through a photoelectric conversion layer, and return it effectively to the layer. The light reflectance may be increased by vapor-depositing or metal-plating the substrate with Ag, Al, etc. after a mirror plane-polishing, applying a layer comprising an Al—Mg alloy, an Al—Ti alloy, etc. as reflective layer at the lowest layer in the solar cell, making the lowest layer to a texture structure by annealing.

To increase the production efficiency of electric power, it is important to minimize a resistance of connection between cells, thereby preventing reduction in an inner voltage. The cells are generally connected to each other by a wire bonding method or using an electrically conductive flexible sheet. In addition, the cells may be connected by methods such as electrically connecting while fixing the cells by electrically conductive adhesives, adhesive tapes, etc., and pattern-coating an electrically conductive hot melt at an intended position.

A solar cell comprising a flexible support made of a polymer film, etc., may be manufactured by a method comprising the steps: forming cells in the same manner as described above while sending out a roll-like support; cutting it to an intended size; and sealing the marginal portion thereof with a flexible, moisture permeable material. The solar cell may have a module structure called "SCAF" described in Solar Energy Materials and Solar Cells, 48, p 383 to 391. Further, the solar cell comprising the flexible support may be used while adhered and fixed to a curved glass, etc.

As described above in detail, the solar cells comprising the photoelectric conversion device of the present invention may have various kinds of forms and functions in accordance with the end use and environment of use thereof.

EXAMPLES

The present invention will be explained in more detail with reference to examples below. The present invention is not restricted by these examples.

1. Synthesis of Compound Represented by General Formula (1)

The compounds represented by the general formula (1) were synthesized using the following compounds a to h. The structure of the synthesized compound was identified by $^1$H-NMR. The water-content of the compound was measured by the Karl Fisher method, and the viscosity thereof was measured by a B-type viscometer manufactured by TOKIMEC INC.

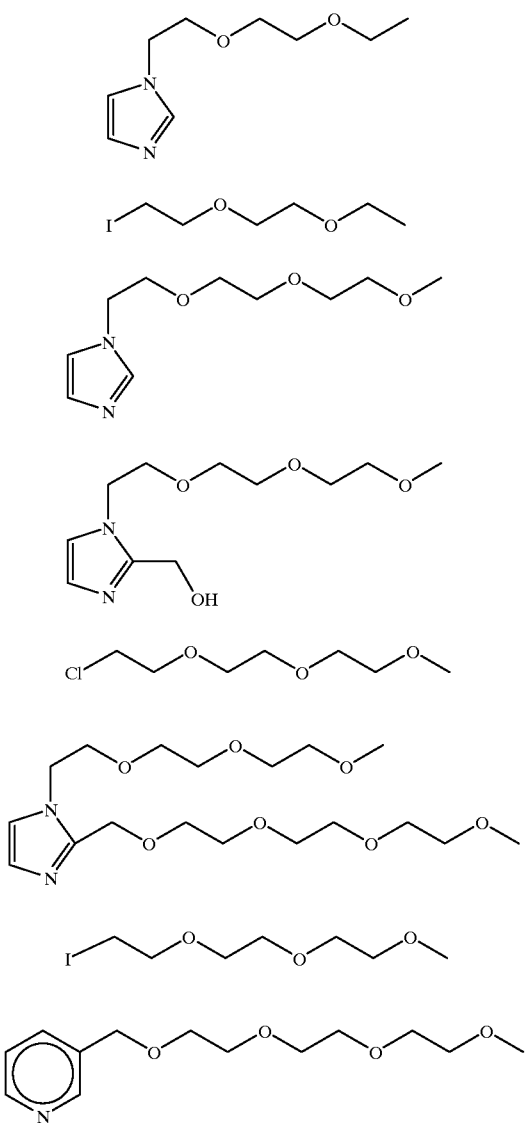

a b c d e f g h (A) Synthesis of 2-a 5.3 g (0.028 mol) of the compound a and 7.32 g (0.03 mol) of the compound b were dissolved in 12 ml of ethyl acetate, and refluxed for 24 hours while heating. Then, ethyl acetate and an excess of the compound b were distilled off from the solution by heating under a reduced pressure to obtain 12 g of 2-a. The water-content of the obtained 2-a was 0.1%, and the viscosity ($\eta$) at 25° C. thereof was 832 cp.

(B) Synthesis of 2-b 10.0 g (0.023 mol) of 2-a and 6.60 g (0.023 mol) of N-lithiotrifluoromethane sulfonimide were added to 50 ml of water, and stirred for 30 minutes at room temperature. Then, the reaction mixture was extracted with methylene chloride, and concentrated followed by drying for 5 hours under the condition of 80° C. and 1 mmHg to obtain 8 g of 2-b as oil. The water-content of the obtained 2-b was 0.1%, and the viscosity ($\eta$) at 25° C. thereof was 219 cp.

(C) Synthesis of 2-c 4.28 g (0.01 mol) of 2-a and 1.95 g (0.01 mol) of silver tetrafluoroborate were mixed in 25 ml of water. Then, the resultant solution was filtered through a celite to eliminate precipitates generated therein, and concentrated followed by drying for 5 hours under the condition of 80° C. and 1 mmHg to obtain 2.8 g of 2-c as oil. The water-content of the obtained 2-c was 0.1%, and the viscosity ($\eta$) at 25° C. thereof was 507 cp.

(D) Synthesis of 16-a 7.9 g (0.1 mol) of pyridine and 24.4 g (0.1 mol) of the compound b were dissolved in 50 ml of ethyl acetate, and refluxed for 12 hours while heating. Then, volatile components were distilled off from the solution by heating under a reduced pressure to obtain 30 g of 16-a. The water-content of the obtained 16-a was 0.8%, and the viscosity ($\eta$) at 25° C. thereof was 1070 cp.

(E) Synthesis of 16-b 3.23 g (0.01 mol) of 16-a and 2.87 g (0.01 mol) of N-lithiotrifluoromethane sulfonimide were added to 20 ml of water, and stirred for 30 minutes at room temperature. Then, the reaction mixture was extracted with methylene chloride, and concentrated followed by drying to obtain 3.4 g of 16-b as oil. The water-content of the obtained 16-b was 0.8%, and the viscosity ($\eta$) at 25° C. thereof was 366 cp.

(F) Synthesis of 16-c 3.23 g (0.01 mol) of 16-a and 1.95 g (0.01 mol) of silver tetrafluoroborate were mixed in 25 ml of water. Then, the resultant solution was filtered through a filter paper to eliminate precipitates generated therein, and concentrated followed by drying for 5 hours under the condition of 80° C. and 1 mmHg to obtain 2.5 g of 16-c. The water-content of the obtained 16-c was 1.5%, and the viscosity ($\eta$) at 25° C. thereof was 852 cp.

(G) Synthesis of 35-a 7.8 g of the compound c and 3.0 g of paraformaldehyde were mixed and heated for 2 hours at 160° C. This solution was purified by silica gel column chromatography (eluate: methylene chloride/methanol=9/1) to obtain 5.3 g of the compound d.

5.3 g of the compound d was dissolved in 20 ml of THF, and the resultant solution was added dropwise at 0° C. to a suspension composed of 0.96 g of sodium hydride 65% in oil and 10 ml of toluene. After adding, the reaction mixture was warmed to room temperature. To this was added the solution prepared by dissolving 4.75 g of the compound e in 20 ml of THF, and refluxed while heating. After 3 hours of reflux, solvents were distilled off under a reduced pressure, and the residue was purified by silica gel column chromatography (eluate: methylene chloride/methanol=9/1) to obtain 3.25 g of the compound f.

Then, 3.25 g of the compound f was dissolved in 10 ml of ethyl acetate together with 2.44 g of the compound b, and refluxed for 8 hours while heating. After removing ethyl acetate by distillation under reduced pressure, the residue was purified by silica gel column chromatography (eluate: methylene chloride/methanol=9/1), and dried for 5 hours under the condition of 100° C. and 1 mmhg to obtain 5.0 g of 35-a. The water-content of the obtained 35-a was 0.5%, and the viscosity ($\eta$) at 25° C. thereof was 446 cp.

(H) Synthesis of 35-b 1.46 g of 35-a and 0.66 g of N-lithiotrifluoromethane sulfonimide were added to 50 ml of water, and stirred for 30 minutes at room temperature. Then, the reaction mixture was extracted with methylene chloride, and concentrated. The residue was purified by silica gel column chromatography (eluate: methylene chloride/methanol=9/1), and dried for 6 hours under the condition of 80° C. and 1 mmHg to obtain 1 g of 35-b as oil. The water-content of the obtained 35-b was 0.4%, and the viscosity ($\eta$) at 25° C. thereof was 240 cp.

(I) Synthesis of 35-c 3.17 g of 35-a and 0.98 g of silver tetrafluoroborate were mixed in 25 ml of water. Then, the resultant solution was filtered through a celite to eliminate precipitates generated therein, and concentrated to remove water. The residue was purified by silica gel column chromatography (eluate: methylene chloride/methanol=9/1), and dried for 6 hours under the condition of 80° C. and 1 mmHg to obtain 1.5 g of 35-c as oil. The water-content of the obtained 35-c was 1.2%, and the viscosity ($\eta$) at 25° C. thereof was 365 cp.

(J) Synthesis of 34-a 20 g of 3-pyridine methanol was dissolved in 20 ml of DMF, and the resultant solution was added dropwise at 0° C. to a suspension composed of 7 g of sodium hydride 65% in oil and 10 ml of DMF. After adding, the reaction mixture was warmed to room temperature. To this was added the solution prepared by dissolving 36 g of the compound e in 20 ml of THF, and refluxed while heating. After 3 hours of reflux, solvents were distilled off under a reduced pressure, and the residue was purified by silica gel column chromatography (eluate: methylene chloride/methanol=9/1) to obtain 16.8 g of the compound h.

Then, 3.25 g of the compound h was dissolved in 10 ml of ethyl acetate together with 2.44 g of the compound g, and refluxed for 8 hours while heating. After removing ethyl acetate by distillation under reduced pressure, the residue was purified by silica gel column chromatography (eluate: methylene chloride/methanol=9/1), and dried for 5 hours under the condition of 100° C. and 1 mmHg to obtain 5.0 g of 34-a. The water-content of the obtained 34-a was 1.3%, and the viscosity ($\eta$) at 25 OC thereof was 1400 cp.

(K) Synthesis of 34-b 1.22 g of 34-a and 0.66 g of N-lithiotrifluoromethane sulfonimide were added to 50 ml of water, and stirred for 30 minutes at room temperature. Then, the reaction mixture was extracted with methylene chloride, and concentrated. The residue was purified by silica gel column chromatography (eluate: methylene chloride/methanol=9/1), and dried for 6 hours under the condition of 80° C. and 1 mmHg to obtain 1 g of 34-b as oil. The water-content of the obtained 34-b was 0.5%, and the viscosity ($\eta$) at 25° C. thereof was 222 cp.

(L) Synthesis of 34-c 2.66 g of 34-a and 0.98 g of silver tetrafluoroborate were mixed in 25 ml of water. Then, the resultant solution was filtered through a celite to eliminate precipitates generated therein, and concentrated to remove water. The residue was purified by silica gel column chromatography (eluate: methylene chloride/methanol=9/1), and dried for 6 hours under the condition of 80 OC and 1 mmHg to obtain 2.2 g of 34-c as oil. The water-content of the obtained 34-c was 0.8%, and the viscosity ($\eta$) at 25° C. thereof was 735 cp.

(M) Syntheses of Other Compound

The compounds represented by the general formula (1) other than the above-described compounds can be also easily synthesized in a similar method to the above.

2. Production of Photo-Electrochemical Cell (A) Preparation of Titanium Dioxide Dispersion A 200 ml inner volume stainless steel vessel coated with Teflon inside was charged with 15 g of titanium dioxide fine particles "Degussa P-25" manufactured by Nippon Aerosil K.K., 45 g of water, 1 g of dispersant "Triton X-100" manufactured by Aldrich, and 30 g of zirconia beads having a diameter of 0.5 mm manufactured by Nikkato K.K. These contents were subjected to a dispersion treatment for 2 hours at 1500 rpm by means of a sand-grinder mill manufactured by Imex K.K. The zirconia beads were removed by filtration to obtain the titanium dioxide dispersion. The average particle diameter of the titanium dioxide particles in the dispersion was 2.5 $\mu$m. Herein, the particle diameter was measured by a Master Sizer manufactured by MALVERN.

(B) Preparation of Dye-Adsorbed $TiO_2$ Electrode

The above-described dispersion was coated on an electrically conductive surface of a conductive glass having a fluorine-doped tin oxide layer thereon by a glass bar. Used as the conductive glass was 20 mm×20 mm of TCO Glass-U manufactured by Asahi Glass K.K. with a surface resistance of approximately 30 $\Omega$/square. A coating amount of the semiconductor fine particles was 20 g/m$^2$. Herein, on the eight glasses were coated the dispersion at once after adhesive tape was attached to a part of the conductive surface (3 mm from the edge) of each conductive glass as a spacer, and the glasses were arranged so that the adhesive tapes came to both edges thereof. The coated glasses were air-dried for one day at a room temperature after peeling the adhesive tapes. Then, the glasses were placed in an electric furnace "muffle furnace FP-32" manufactured by Yamato Science K.K., followed by calcinating at 450° C. for 30 minutes to obtain $TiO_2$ electrodes.

After the electrodes were taken out of the furnace and cooled, they were immersed in an ethanol solution comprising the dye shown in Tables 1 and 2 for 3 hours to adsorb the dye, respectively. The concentration of the dye in the ethanol solution was 3×10$^{-4}$ mol/l. The dye-adsorbed $TiO_2$ electrodes were further immersed in 4-t-butylpyridine for 15 minutes, then washed with ethanol and air-dried. The thickness of thus-obtained photosensitive layer was shown in Table 1 and 2, and an adsorbing amount of the dye was 0.1 to 10 mmol/m$^2$.

(C) Production of Photo-Electrochemical Cell

The 20 mm×20 mm in size of dye-sensitized $TiO_2$ electrode glass substrate prepared as described above was put on a platinum-vapor deposited glass having the same size thereas through a spacer. Next, an electrolyte composition was permeated into a space between the glasses through capillarity to be introduced into the $TiO_2$ electrode, thereby obtaining a photo-electrochemical cell. According to this example, the photo-electrochemical cell similar to that shown in FIG. 1 was prepared, where the conductive support of the electrically conductive glass comprising the transparent substrate 50*a* of glass and the electrically conductive layer 10*a* disposed thereon; the photosensitive layer 20 of the dye-sensitized $TiO_2$; the charge-transporting layer 30; the counter electrically conductive layer 40 of platinum; and the transparent substrate 50*a* of glass were laminated in this order, and sealed with an epoxy-based sealant. Incidentally, in the case where the electrolyte composition has a high viscosity, and thereby it is difficult to permeate it through capillarity, the photo-electrochemical cell was produced by the method comprising the steps of: warming the electrolyte composition to 50° C.; applying it on the $TiO_2$ electrode; sufficiently permeating the electrolyte composition into the electrode and removing air in the electrode; and putting a platinum-deposited counter electrode glass thereon under reduced pressure.

The above processes were repeatedly carried out while changing the electrolyte composition and the dye as shown in Tables 1 and 2 to produce the photo-electrochemical cell of EXAMPLES 1 to 49 and COMPARATIVE EXAMPLES 1 to 11. The constitution of the electrolyte composition and the thickness of the photosensitive layer of each photoelectrochemical cell are shown in Tables 1 and 2. The dye(s) used in each cell is also shown therein. In the Tables 1 and 2, "BCE" represents bis(cyanoethyl) ether. Further, the structure of compounds Y-1 to Y-6 used in the EXAMPLES and COMPARATIVE EXAMPLES will be illustrated below.

TABLE 1

| Photo-Electro-chemical Cell | Electrolyte Composition Comprising 2 weight % of Iodine | | Thickness of Photo-sensitive Layer $\mu$m | Dye (Mole Absorption Coefficient in DMF) |
|---|---|---|---|---|
| | Electrolyte Salt (weight %) | Solvent (weight %) | | |
| Comp. Ex. 1 | Y-1(10) | BCE(88) | 6.5 | R-1(14,000) |
| Ex. 1 | 2-a(10) | BCE(88) | 6.5 | R-1(14,000) |
| Comp. Ex. 2 | Y-2(10)/Y-3(38) | BCE(50) | 6.5 | R-1(14,000) |
| Comp. Ex. 3 | Y-2(10)/Y-3(58) | BCE(30) | 6.5 | R-1(14,000) |
| Comp. Ex. 4 | Y-2(10)/Y-3(78) | BCE(10) | 6.5 | R-1(14,000) |
| Ex. 2 | 2-a(10)/Y-3(58) | BCE(30) | 6.5 | R-1(14,000) |
| Ex. 3 | 2-a(10)/Y-3(78) | BCE(10) | 6.5 | R-1(14,000) |
| Ex. 4 | 2-a(10)/Y-3(88) | . | 6.5 | R-1(14,000) |
| Ex. 5 | 5-a(15)/Y-3(83) | . | 6.5 | R-1(14,000) |
| Ex. 6 | 5-a(50)/5-b(48) | . | 6.5 | R-1(14,000) |
| Ex. 7 | 7-a(70)/7-b(28) | . | 6.5 | R-1(14,000) |
| Comp. Ex. 5 | Y-2(70)/Y-3(28) | . | 6.5 | R-1(14,000) |
| Ex. 8 | Y-2(70)/1-b(28) | . | 6.5 | R-1(14,000) |
| Ex. 9 | Y-2(70)/2-b(28) | . | 6.5 | R-1(14,000) |
| Ex. 10 | Y-2(70)/2-c(28) | . | 6.5 | R-1(14,000) |
| Ex. 11 | Y-2(70)/5-b(28) | . | 6.5 | R-1(14,000) |
| Ex. 12 | Y-2(70)/7-b(28) | . | 6.5 | R-1(14,000) |
| Ex. 13 | Y-2(70)/16-b(28) | . | 6.5 | R-1(14,000) |
| Ex. 14 | Y-2(70)/20-c(28) | . | 6.5 | R-1(14,000) |
| Ex. 15 | Y-2(70)/12-c(28) | . | 6.5 | R-1(14,000) |
| Ex. 16 | Y-2(70)/34-c(28) | . | 6.5 | R-1(14,000) |
| Ex. 17 | Y-2(70)/35-c(28) | . | 6.5 | R-1(14,000) |
| Ex. 18 | Y-3(70)/34-a(28) | . | 6.5 | R-1(14,000) |
| Ex. 19 | 7-a(70)/Y-4(28) | . | 6.5 | R-1(14,000) |
| Ex. 20 | Y-2(70)/2-b(28) | . | 4.8 | R-1(14,000) |
| Ex. 21 | Y-2(70)/2-b(28) | . | 3.3 | R-1(14,000) |
| Ex. 22 | Y-2(70)/7-b(28) | . | 3.3 | (5)(300,000) and (26)(70,000) |
| Ex. 23 | Y-2(70)/16-b(28) | . | 3.3 | (9)(150,000) and S-1(70,000) |

TABLE 2

| Photo-Electro-chemical Cell | Electrolyte Composition Comprising 2 weight % of Iodine | | Thickness of Photo-sensitive Layer $\mu$m | Dye (Mole Absorption Coefficient in DMF) |
|---|---|---|---|---|
| | Electrolyte Salt (weight %) | Solvent (weight %) | | |
| Ex. 24 | 2-a(18)/Z1-a(10) | BCE(70) | 6.5 | R-1(14,000) |
| Ex. 25 | 2-a(18)/Z1-b(10) | BCE(70) | 6.5 | R-1(14,000) |
| Ex. 26 | 2-a(18)/Z1-c(10) | BCF(70) | 6.5 | R-1(14,000) |
| Ex. 27 | 2-a(J8)/Z1-f(10) | BCE(70) | 6.5 | R-1(14,000) |
| Ex. 28 | 2-a(18)/Z1-a(50) | BCE(30) | 6.5 | R-1(14,000) |
| Ex. 29 | 2-a(18)/Z1-a(70) | BCE(10) | 6.5 | R-1(14,000) |
| Comp. Ex. 6 | Y-5(18)/Y-6(10) | BCE(70) | 6.5 | R-1(14,000) |
| Comp. Ex. 7 | Y-5(18)/Z1-a(10) | BCE(70) | 6.5 | R-1(14,000) |
| Comp. Ex. 8 | Y-5(18)/Y-6(50) | BCE(30) | 6.5 | R-1(14,000) |
| Comp. Ex. 9 | Y-5(18)/Y-6(70) | BCE(10) | 6.5 | R-1(14,000) |
| Ex. 30 | 2-a(70)/Z1-a(28) | . | 6.5 | R-1(14,000) |
| Ex. 31 | 2-a(70)/Z1-b(28) | . | 6.5 | R-1(14,000) |
| Ex. 32 | 2-a(70)/Z1-c(28) | . | 6.5 | R-1(14,000) |
| Ex. 33 | 2-a(70)/Z1-f(28) | . | 6.5 | R-1(14,000) |
| Ex. 34 | 2-a(70)/Z2-a(28) | . | 6.5 | R-1(14,000) |
| Ex. 35 | 2-a(70)/Z2-c(28) | . | 6.5 | R-1(14,000) |
| Ex. 36 | 2-a(70)/Z2-f(28) | . | 6.5 | R-1(14,000) |
| Ex. 37 | 5-a(70)/Z1-a(28) | . | 6.5 | R-1(14,000) |
| Ex. 38 | 5-a(70)/Z1-b(28) | . | 6.5 | R-1(14,000) |

TABLE 2-continued

| Photo-Electro-chemical Cell | Electrolyte Composition Comprising 2 weight % of Iodine | | Thickness of Photo-sensitive Layer $\mu$m | Dye (Mole Absorption Coefficient in DMF) |
|---|---|---|---|---|
| | Electrolyte Salt (weight %) | Solvent (weight %) | | |
| Ex. 39 | 5-a(70)/Z1-c(28) | . | 6.5 | R-1(14,000) |
| Ex. 40 | 5-a(70)/Z1-f(28) | . | 6.5 | R-1(14,000) |
| Ex. 41 | 19-a(70)/Z2-a(28) | . | 6.5 | R-1(14,000) |
| Ex. 42 | 19-a(70)/Z2-c(28) | . | 6.5 | R-1(14,000) |
| Ex. 43 | 34-a(70)/Z2-f(28) | . | 6.5 | R-1(14,000) |
| Ex. 44 | 7-a(70)/Z3-a(28) | . | 6.5 | R-1(14,000) |
| Ex. 45 | 19-a(70)/Z3-f(28) | . | 6.5 | R-1(14,000) |
| Ex. 46 | 7-a(70)/Z3-g(28) | . | 6.5 | R-1(14,000) |
| Ex. 47 | 2-a(70)/Z1-a(28) | . | 4.8 | R-1(14,000) |
| Ex. 48 | 2-a(70)/Z1-a(28) | . | 3.3 | R-1(14,000) |
| Ex. 49 | 2-a(70)/Z1-a(28) | . | 3.3 | (5)(3,000,000) and (26)(70,000) |
| Comp. Ex. 10 | Y-5(70)/Y-6(28) | . | 6.5 | R-1(14,000) |
| Comp. Ex. 11 | Y-5(70)/Z1-a(28) | . | 6.5 | R-1(14,000) |

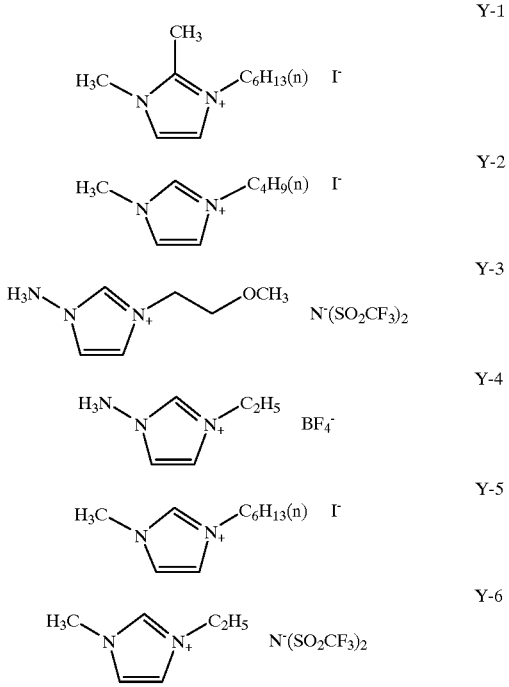

3. Measurement of Photoelectric Conversion Efficiency

Examples 1 to 23 and Comparative Examples 1 to 5

A simulated sunlight was irradiated to the photoelectrochemical cells of EXAMPLES 1 to 23 and COMPARATIVE EXAMPLES 1 to 5 at 50° C., and the generated electricity was measured by the current-voltage tester "Keithley SMU238", to obtain open circuit voltage (Voc), short-circuit current density (Jsc), fill factor (FF), photoelectric conversion efficiency ($\eta$), and decrease (%) of short-circuit current density after storage in the dark for 72 hours with respect to each of the cells. The results are shown in Table 3. Incidentally, the simulated sunlight was obtained by passing the light of a 500 W xenon lamp manufactured by Ushio K.K. through an "AM 1.5 filter" manufactured by Oriel Co. and a sharp cut filter "Kenko L-42". The simulated sunlight was free of ultraviolet radiation and had intensity of 70 mW/cm$^2$.

TABLE 3

| Photo-Electro-chemical Cell | Open Circuit Voltage (Voc) V | Short-Circuit Current Density (Jsc) mA/cm$^2$ | Fill Factor (FF) | Photoelectric Conversion Efficiency (η) % | Decrease of Jsc after Storage for 72 hours % |
|---|---|---|---|---|---|
| Comp. Ex. 1 | 0.60 | 9.7 | 0.66 | 5.5 | 88 |
| Ex. 1 | 0.60 | 9.8 | 0.67 | 5.6 | 80 |
| Comp. Ex. 2 | 0.53 | 6.5 | 0.65 | 3.2 | 54 |
| Comp. Ex. 3 | 0.50 | 6.4 | 0.64 | 2.9 | 38 |
| Comp. Ex. 4 | 0.45 | 6.1 | 0.65 | 2.5 | 11 |
| Ex. 2 | 0.60 | 7.8 | 0.65 | 4.3 | 12 |
| Ex. 3 | 0.61 | 7.6 | 0.63 | 4.2 | 8 |
| Ex. 4 | 0.58 | 7.7 | 0.64 | 4.1 | 3 |
| Ex. 5 | 0.60 | 7.4 | 0.63 | 4.0 | 5 |
| Ex. 6 | 0.57 | 7.4 | 0.65 | 3.9 | 4 |
| Ex. 7 | 0.59 | 8.0 | 0.63 | 4.2 | 6 |
| Comp. Ex. 5 | 0.41 | 6.0 | 0.63 | 2.2 | 5 |
| Ex. 8 | 0.53 | 7.1 | 0.65 | 3.5 | 7 |
| Ex. 9 | 0.58 | 7.5 | 0.65 | 4.0 | 5 |
| Ex. 10 | 0.59 | 7.2 | 0.63 | 3.8 | 5 |
| Ex. 11 | 0.59 | 7.6 | 0.64 | 4.1 | 7 |
| Ex. 12 | 0.58 | 7.9 | 0.64 | 4.2 | 3 |
| Ex. 13 | 0.57 | 7.6 | 0.65 | 4.0 | 4 |
| Ex. 14 | 0.58 | 7.2 | 0.66 | 3.9 | 4 |
| Ex. 15 | 0.58 | 7.7 | 0.65 | 4.1 | 5 |
| Ex. 16 | 0.58 | 7.9 | 0.67 | 4.4 | 5 |
| Ex. 17 | 0.59 | 7.8 | 0.67 | 4.4 | 4 |
| Ex. 18 | 0.57 | 7.9 | 0.65 | 4.2 | 6 |
| Ex. 19 | 0.58 | 7.8 | 0.66 | 4.3 | 5 |
| Ex. 20 | 0.58 | 6.8 | 0.66 | 3.7 | 7 |
| Ex. 21 | 0.56 | 6.5 | 0.65 | 3.4 | 5 |
| Ex. 22 | 0.55 | 8.1 | 0.64 | 4.1 | 4 |
| Ex. 23 | 0.56 | 8.3 | 0.66 | 4.4 | 5 |

As shown in Table 3, in accordance with the photoelectrochemical cells using a large amount of solvent for the electrolyte composition, the short-circuit current density is remarkably worsened after storage. However, the cells according to the present invention of EXAMPLES 1 and 2 exhibit superior photoelectric conversion efficiency and durability to that of the cells of COMPARATIVE EXAMPLES 1 and 3 using only prior art salts. To suppress the decrease of short-circuit current density during the storage to 10% or less, the electrolyte composition preferably comprises 10 weight % or less of solvent, and more preferably comprises no solvent.

The cells of COMPARATIVE EXAMPLES 4 and 5 using only prior art salts exhibit a low open circuit voltage to reduce the photoelectric conversion efficiency. As compared with this, the cells according to the present invention of EXAMPLES 3 to 19 exhibit a high open circuit voltage, thereby having improved conversion efficiency.

As is clear from the results of EXAMPLES 9, 20 and 21, the thinner the photosensitive layer is, the more short-circuit current density is lowered. However, it is clear from the results of EXAMPLES 22 and 23 that the photoelectric conversion efficiency can be improved by using the dyes having a high light-absorbability as a mixture.

Examples 24 to 49 and Comparative Examples 6 to 11

With respect to each of the cells according to EXAMPLES 24 to 49 and COMPARATIVE EXAMPLES 6 to 11, the open circuit voltage (Voc), short-circuit current density (Jsc), fill factor (FF), photoelectric conversion efficiency (η), and decrease (%) of short-circuit current density after storage in the dark for 72 hours were obtained in the same manner as above, except that the simulated sunlight having an intensity of 85 mW/cm$^2$ was irradiated to the cells at 70° C. The results are shown in Table 4.

TABLE 4

| Photo-Electro-chemical Cell | Open Circuit Voltage (Voc) V | Short-Circuit Current Density (Jsc) mA/cm$^2$ | Fill Factor (FF) | Photoelectric Conversion Efficiency (η) % | Decrease of Jsc after Storage for 72 hours % |
|---|---|---|---|---|---|
| Ex. 24 | 0.66 | 10.3 | 0.66 | 5.3 | 83 |
| Ex. 25 | 0.60 | 10.2 | 0.67 | 5.2 | 85 |
| Ex. 26 | 0.67 | 10.1 | 0.68 | 5.4 | 85 |
| Ex. 27 | 0.61 | 11.2 | 0.70 | 5.6 | 84 |
| Ex. 28 | 0.62 | 8.3 | 0.67 | 4.1 | 15 |
| Ex. 29 | 0.59 | 8.0 | 0.68 | 3.8 | 8 |
| Comp. Ex. 6 | 0.58 | 11.0 | 0.65 | 4.9 | 90 |
| Comp. Ex. 7 | 0.60 | 11.0 | 0.66 | 5.1 | 90 |
| Comp. Ex. 8 | 0.55 | 8.5 | 0.66 | 3.6 | 37 |
| Comp. Ex. 9 | 0.52 | 8.3 | 0.67 | 3.4 | 12 |
| Ex. 30 | 0.54 | 7.9 | 0.68 | 3.4 | 6 |
| Ex. 31 | 0.55 | 8.1 | 0.68 | 3.6 | 5 |
| Ex. 32 | 0.55 | 7.9 | 0.67 | 3.4 | 5 |
| Ex. 33 | 0.52 | 8.7 | 0.68 | 3.6 | 6 |
| Ex. 34 | 0.58 | 8.3 | 0.68 | 3.9 | 4 |
| Ex. 35 | 0.58 | 8.6 | 0.67 | 3.9 | 5 |
| Ex. 36 | 0.57 | 8.8 | 0.67 | 4.0 | 4 |
| Ex. 37 | 0.55 | 9.0 | 0.68 | 4.0 | 4 |
| Ex. 38 | 0.56 | 7.9 | 0.68 | 3.5 | 5 |
| Ex. 39 | 0.56 | 7.9 | 0.70 | 3.6 | 5 |
| Ex. 40 | 0.57 | 8.8 | 0.69 | 4.1 | 4 |
| Ex. 41 | 0.59 | 8.5 | 0.69 | 4.1 | 3 |
| Ex. 42 | 0.59 | 8.6 | 0.68 | 4.1 | 5 |
| Ex. 43 | 0.55 | 8.9 | 0.68 | 3.9 | 5 |
| Ex. 44 | 0.56 | 8.5 | 0.68 | 3.8 | 6 |
| Ex. 45 | 0.58 | 8.4 | 0.67 | 3.8 | 5 |
| Ex. 46 | 0.59 | 8.4 | 0.68 | 4.0 | 5 |
| Ex. 47 | 0.55 | 7.6 | 0.68 | 3.3 | 5 |
| Ex. 48 | 0.54 | 7.3 | 0.68 | 3.2 | 5 |
| Ex. 49 | 0.56 | 7.8 | 0.70 | 3.6 | 6 |
| Comp. Ex. 10 | 0.45 | 7.8 | 0.67 | 2.8 | 7 |
| Comp. Ex. 11 | 0.50 | 6.9 | 0.67 | 2.7 | 7 |

As shown in Table 4, in accordance with the photoelectrochemical cells using the solvent for the electrolyte composition, the short-circuit current density is remarkably worsened after storage. However, the cells according to the present invention of EXAMPLES 24 to 29 exhibit superior photoelectric conversion efficiency and durability to that of the cells of COMPARATIVE EXAMPLES 6 to 9 using only prior art imidazolium salts. To suppress the decrease of short-circuit current density during the storage to 10% or less, the electrolyte composition preferably comprises 10 weight % or less of solvent, and more preferably comprises no solvent.

With regard to the cells comprising the electrolyte composition without the solvent, the cells of COMPARATIVE EXAMPLES 10 and 11 using only prior art imidazolium salts exhibit a low open circuit voltage to reduce the photoelectric conversion efficiency. As compared with this, the cells according to the present invention of EXAMPLES 30 to 46 exhibit a high open circuit voltage, thereby having improved conversion efficiency.

As is clear from the results of EXAMPLES 30, 47 and 48, the thinner the photosensitive layer is, the more short-circuit current density is lowered. However, it is clear from the results of EXAMPLE 49 that the photoelectric conversion efficiency can be improved by using the dyes having a high light-absorbability as a mixture.

As explained above in detail, the electrolyte composition of the present invention is excellent in the durability and charge-transporting capability. The photoelectric conversion device comprising the electrolyte composition exhibits the excellent photoelectric conversion properties and less deterioration of the properties during the long-term use or storage. The photo-electrochemical cell composed of the device is remarkably useful as a solar cell.

What is claimed is:

1. An electrolyte composition comprising a compound represented by the following general formula (1):

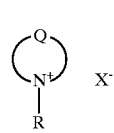

(1)

wherein R represents a substituent containing a —$(CR_1R_2—CR_3R_4—O)_n$— bond, in which $R_1$ to $R_4$ are independently a hydrogen atom or an alkyl group, n being an integer of 2 to 20, and said —$(CR_1R_2—CR_3R_4—O)_n$— bond has a straight chain structure and directly bonds to $N^+$; Q represents an atomic group forming an aromatic cation having a 5- or 6-membered ring structure with a nitrogen atom, and optionally has a substituent; and $X^-$ represents an anion.

2. The electrolyte composition according to claim 1, wherein said Q has a substituent containing a —$(CR_1R_2—CR_3R_4—O)_n$— bond, in which $R_1$ to $R_4$ are independently a hydrogen atom or an alkyl group, n being an integer of 2 to 20.

3. The electrolyte composition according to claim 1, wherein said Q is composed of atoms selected from the group consisting of carbon, hydrogen, nitrogen, oxygen and sulfur atoms.

4. The electrolyte composition according to claim 1, wherein said 5- or 6-membered ring formed by Q is an imidazole ring or a pyridine ring.

5. The electrolyte composition according to claim 1, wherein said compound represented by the general formula (1) is further represented by the following general formula (2) or (3):

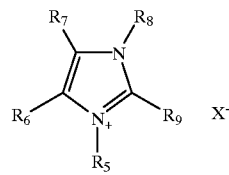

(2)

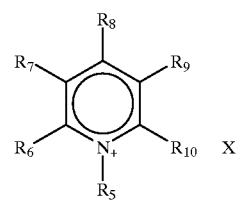

(3)

wherein $R_5$ represents a substituent containing a —$(CR_1R_2—CR_3R_4—O)_n$— bond, in which $R_1$ to $R_4$ are independently a hydrogen atom or an alkyl group, n being an integer of 2 to 20, and said —$(CR_1R_2—CR_3R_4—O)_n$— bond has a straight-chain structure and directly bonds to $N^+$; $R_6$ to $R_{10}$ independently represent a hydrogen atom or a substituent; $X^-$ represents an anion; and two or more of said $R_6$ to $R_{10}$ optionally bond together to form a ring.

6. The electrolyte composition according to claim 1, wherein said n is an integer of 2 to 6.

7. The electrolyte composition according to claim 1, wherein the total number of —$CR_1R_2—CR_3R_4—O$— bonds, in which $R_1$ to $R_4$ are independently a hydrogen atom or an alkyl group, in said compound represented by the general formula (1) is 4 to 6.

8. The electrolyte composition according to claim 1, wherein said $X^-$ is $I^-$, $N^-(CF_3SO_2)_2$, $BF_4^-$, $R_a$—$COO^-$ in which $R_a$ is a hydrogen atom, an alkyl group, a perfluoroalkyl group or an aryl group, $R_b SO_3^-$ in which $R_b$ is an alkyl group, a perfluoroalkyl group or an aryl group, or $SCN^-$.

9. The electrolyte composition according to claim 8, wherein said $X^-$ is $I^-$.

10. The electrolyte composition according to claim 1 further comprising an iodine salt in addition to said compound represented by the general formula (1).

11. The electrolyte composition according to claim 10, wherein a cation of said iodine salt is a nitrogen-containing aromatic cation having a 5- or 6-membered ring structure.

12. The electrolyte composition according to claim 9 further comprising a salt that contains an anion selected from the group consisting of $N^-(CF_3SO_2)_2$, $BF_4^-$, $R_a$—$COO^-$ in which $R_a$ is a hydrogen atom, an alkyl group, a perfluoroalkyl group or an aryl group, $R_b$—$SO_3^-$ in which $R_b$ is an alkyl group, a perfluoroalkyl group or an aryl group, and $SCN^-$.

13. The electrolyte composition according to claim 12, wherein a cation of said salt is a nitrogen-containing aromatic cation having a 5- or 6-membered ring structure.

14. The electrolyte composition according to claim 1 further comprising iodine.

15. The electrolyte composition according to claim 1, wherein a solvent-content is 10 weight % or less based on the total weight of the composition.

16. A photoelectric conversion device having an electrically conductive layer, a photosensitive layer, a charge transfer layer and a counter electrode, wherein said charge transfer layer comprises said electrolyte composition according to claim 1.

17. The photoelectric conversion device according to claim 16, wherein said photosensitive layer comprises semiconductor fine particles sensitized by a dye.

18. The photoelectric conversion device according to claim 17, wherein said semiconductor fine particles are composed of a metal chalcogenide.

19. A photo-electrochemical cell composed of said photoelectric conversion device according to claim 16.

20. An imidazolium compound represented by the following general formula (4):

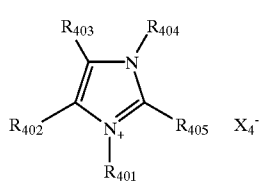

(4)

wherein $R_{401}$ represents a substituent; $R_{402}$ to $R_{405}$ independently represent a hydrogen atom or a substituent; $R_{401}$ and at least one of $R_{402}$ to $R_{405}$ independently contain a —$(CR_1R_2$—$CR_3R_4$—$O)_n$— bond, in which $R_1$ to $R_4$ are independently a hydrogen atom or an alkyl group, n being an integer of 2 to 20, and said —$(CR_1R_2$—$CR_3R_4$—$O)_n$— bond contained in $R_{401}$ has a straight-chain structure and directly bonds to $N^+$; $X_4^-$ represents $I^-$, $Cl^-$, $Br^-$, $N^-(CF_3SO_2)_2$, $N^-(CF_3CF_2SO_2)_2$, $C^-(CF_3SO_2)_3$, $BF_4^-$, $BPh_4^-$, $PF_6^-$, $ClO_4^-$, $R_a$—$COO^-$ in which $R_a$ is a hydrogen atom, an alkyl group, a perfluoroalkyl group or an aryl group, $R_b$—$SO_3^-$ in which $R_b$ is an alkyl group, a perfluoroalkyl group or an aryl group, or $SCN^-$; and two or more of $R_{402}$ to $R_{405}$ are optionally bonded together to form a ring.

21. A pyridinium compound represented by the following general formula (5):

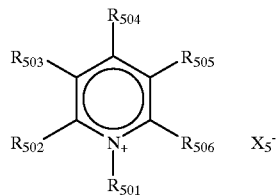

(5)

wherein $R_{501}$ represents a substituent; $R_{502}$ to $R_{506}$ independently represent a hydrogen atom or a substituent; $R_{501}$ and at least one of $R_{502}$ to $R_{506}$ independently contain a —$(CR_1R_2$—$CR_3R_4$—$O)_n$— bond, in which $R_1$ to $R_4$ are independently a hydrogen atom or an alkyl group, n being an integer of 2 to 20, and said —$(CR_1R_2$—$CR_3R_4$—$O)_n$— bond contained in $R_{501}$ has a straight-chain structure and directly bonds to $N^+$; $X_5^-$ represents $I^-$, $Cl^-$, $Br^-$, $N^-(CF_3SO_2)_2$, $N^-(CF_3CF_2SO_2)_2$, $C^-(CF_3SO_2)_3$, $BF_4^-$, $BPh_4^-$, $PF_6^-$, $ClO_4^-$, $R_a$—$COO^-$ in which $R_a$ is a hydrogen atom, an alkyl group, a perfluoroalkyl group or an aryl group, $R_b$—$SO_3^-$ in which $R_b$ is an alkyl group, a perfluoroalkyl group or an aryl group, or $SCN^-$; and two or more of $R_{502}$ to $R_{506}$ are optionally bonded together to form a ring.

* * * * *